(12) United States Patent
Otsu et al.

(10) Patent No.: US 9,692,000 B2
(45) Date of Patent: *Jun. 27, 2017

(54) ORGANIC ELECTROLUMINESCENT ELEMENT, DISPLAY DEVICE AND ILLUMINATING DEVICE

(71) Applicant: Konica Minolta, Inc., Tokyo (JP)

(72) Inventors: Shinya Otsu, Hino (JP); Hiroshi Kita, Hachioji (JP); Eisaku Katoh, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 946 days.

This patent is subject to a terminal disclaimer.

(21) Appl. No.: 13/895,780

(22) Filed: May 16, 2013

(65) Prior Publication Data

US 2013/0252025 A1 Sep. 26, 2013

Related U.S. Application Data

(63) Continuation of application No. 12/293,736, filed as application No. PCT/JP2007/055608 on Mar. 20, 2007, now Pat. No. 8,920,942.

(30) Foreign Application Priority Data

Mar. 23, 2006 (JP) .................................. 2006-079918

(51) Int. Cl.

| H01L 51/54 | (2006.01) |
|---|---|
| H01L 51/50 | (2006.01) |
| H01L 51/00 | (2006.01) |
| C09K 11/06 | (2006.01) |
| H05B 33/14 | (2006.01) |

(52) U.S. Cl.
CPC .......... *H01L 51/5012* (2013.01); *C09K 11/06* (2013.01); *H01L 51/0072* (2013.01); *H01L 51/0073* (2013.01); *H01L 51/0074* (2013.01); *H01L 51/5016* (2013.01); *H01L 51/5036* (2013.01); *H05B 33/14* (2013.01); *C09K 2211/1011* (2013.01); *C09K 2211/1018* (2013.01); *C09K 2211/1029* (2013.01); *C09K 2211/1037* (2013.01); *C09K 2211/1044* (2013.01); *C09K 2211/1092* (2013.01); *C09K 2211/185* (2013.01); *H01L 51/0081* (2013.01); *H01L 51/0084* (2013.01); *H01L 51/0085* (2013.01); *H01L 51/0087* (2013.01); *H01L 51/0088* (2013.01); *H01L 2251/552* (2013.01); *Y10S 428/917* (2013.01)

(58) Field of Classification Search
None
See application file for complete search history.

(56) References Cited

U.S. PATENT DOCUMENTS

| 8,231,983 | B2 | 7/2012 | Sugita et al. | |
|---|---|---|---|---|
| 8,920,942 | B2 * | 12/2014 | Otsu et al. | C09K 11/06 |
| | | | | 252/301.16 |
| 2002/0045061 | A1 | 4/2002 | Hosokawa | |
| 2004/0002576 | A1 * | 1/2004 | Oguma et al. | C09K 11/06 |
| | | | | 528/4 |
| 2004/0076853 | A1 | 4/2004 | Jarikov | |
| 2004/0110031 | A1 | 6/2004 | Fukuda et al. | |
| 2004/0115476 | A1 | 6/2004 | Oshiyama et al. | |
| 2004/0137267 | A1 | 7/2004 | Igarashi et al. | |
| 2005/0064238 | A1 | 3/2005 | Lee et al. | |
| 2005/0158578 | A1 | 7/2005 | Iwakuma et al. | |
| 2005/0260448 | A1 | 11/2005 | Lin et al. | |
| 2006/0008670 | A1 | 1/2006 | Lin et al. | |
| 2006/0024522 | A1 | 2/2006 | Thompson | |
| 2006/0167077 | A1 | 7/2006 | Hercek et al. | |
| 2006/0251923 | A1 | 11/2006 | Lin et al. | |
| 2007/0173657 | A1 | 7/2007 | Chen et al. | |
| 2009/0039765 | A1 | 2/2009 | Uetani et al. | |
| 2010/0231123 | A1 | 9/2010 | Otsu et al. | |

FOREIGN PATENT DOCUMENTS

| EP | 1502936 A1 | 2/2005 |
|---|---|---|
| EP | 1571193 A1 | 9/2005 |
| EP | 1595933 A1 | 11/2005 |
| EP | 1205527 B1 | 4/2008 |
| EP | 1878053 B2 | 8/2009 |
| JP | 2002-203683 A | 7/2002 |
| JP | 2003-109758 A | 4/2003 |
| JP | 2003-133075 A | 5/2003 |
| JP | 2004-133075 A | 4/2004 |
| JP | 2004-171808 A | 6/2004 |

(Continued)

OTHER PUBLICATIONS

Arnold B. Tamayo et al., "Synthesis and Characterization of Facial and Meridional Tris-cyclometalated Iridium(III) Complexes," J. Am. Chem. Soc.; 2003, pp. 7377-7387, vol. 125, No. 24.
Japanese Notification of Reasons for Refusal for Japanese Patent Application No. 2012-228722; Date of Drafting: Aug. 28, 2013; with English Translation.

(Continued)

*Primary Examiner* — Marie R. Yamnitzky
(74) *Attorney, Agent, or Firm* — Cantor Colburn LLP

(57) ABSTRACT

Disclosed is an organic electroluminescent element having high luminous efficiency and long life. Also disclosed are a display device and an illuminating device respectively using such an organic electroluminescent element. Specifically disclosed is an organic electroluminescent element comprising an electrode and at least one or more organic layers on a substrate. This organic electroluminescent element is characterized in that at least one of the organic layers is a light-emitting layer containing a phosphorescent compound and a host compound, the phosphorescent compound has a HOMO of −5.15 to −3.50 eV and a LUMO of from −1.25 to +1.00 eV, and the host compound has a 0-0 band of the phosphorescence spectrum at not more than 460 nm and a glass transition temperature of not less than 60° C.

12 Claims, 3 Drawing Sheets

(56) References Cited

FOREIGN PATENT DOCUMENTS

| | | | |
|---|---|---|---|
| JP | 2004-217557 A | 8/2004 |
| JP | 2004-311404 A | 11/2004 |
| JP | 2004-339134 A | 12/2004 |
| JP | 2004-342391 A | 12/2004 |
| JP | 2005-44791 A | 2/2005 |
| JP | 2005-68110 A | 3/2005 |
| JP | 2005068110 A | 3/2005 |
| JP | 2005-112765 A | 4/2005 |
| JP | 2006097008 | 4/2006 |
| JP | 2006-352069 A | 12/2006 |
| JP | 2007-5211 A | 1/2007 |
| JP | 2007-42726 A | 2/2007 |
| JP | 2007-42728 A | 2/2007 |
| JP | 2008-542203 A | 11/2008 |
| JP | 2008-545729 A | 12/2008 |
| WO | 01/72927 A1 | 10/2001 |
| WO | 03/080761 A1 | 10/2003 |
| WO | 2005/007767 A2 | 1/2005 |
| WO | 2005/113531 A1 | 12/2005 |
| WO | 2005/123873 A1 | 12/2005 |
| WO | 2006/009024 A1 | 1/2006 |
| WO | 2006/025290 A1 | 3/2006 |
| WO | 2006/114966 A1 | 11/2006 |
| WO | 2006/121811 A1 | 11/2006 |
| WO | 2006/128800 A1 | 12/2006 |
| WO | 2007/020718 A1 | 2/2007 |
| WO | 2007/029461 A1 | 3/2007 |
| WO | 2007/108459 A1 | 9/2007 |

OTHER PUBLICATIONS

Koichi Nozaki, "Theoretical Studies on Photophysical Properties and Mechanism of Phosphorescence in [fac-Ir(2-phenylpyridine)3]," Journal of the Chinese Chemical Society; 2006, pp. 101-112, vol. 53, No. 1.
Shih-Chun Lo et al., "Blue Phosphorescence from Iridium(III) Complexes at Room Temperature," Chem. Mater.; 2006, pp. 5119-5129, vol. 18, No. 21.
Submission Document of Publications for Japanese Patent Application No. 2012-283778, filing date of Jul. 30, 2014, with English translation.
Submission Document of Publications for Japanese Patent Application No. 2008-506301, filing date of Aug. 13, 2014, with English translation.
Submission Document of Publications by the Japanese Patent Office for Japanese Patent Application No. 2008-506301, dated Sep. 26, 2012, with English translation.
Submission document of publications for Japanese Patent Application No. 2008-506301; Date of Filing: Jul. 19, 2013; with English Translation.
Submission Document of Publications regarding Japanese Patent Application No. 2008-506301; Date of Filing: Sep. 11, 2014, with English translation.
Sung Ouk Jung et al., "Structure and DFT Calculation of fac-Tris(3-methyl-2-phenylpyridine)Ir(III) Complex," Bull. Korean Chem. Soc.; 2003, pp. 1521-1524, vol. 24, No. 10.
Adamovich, Vadim et al; "High Efficiency Single Dopant White Electrophosphorescent Light Emitting Diodes." New J. chem, vol. 26: 1171-1178, 2002 (8 pages).
Adamovich, Vadim et al; "High Efficiency Single Dopant White Electrophosphorescent Light Emitting Diodes." Supplementary Material for New Journal of Chemistry. (5 pages), 2002.
Decision of Refusal; Japanese Patent Application No. 2008-506301; Drafting date: Mar. 15, 2013, with English Translation.
Decision of Rejection of Amendment; Japanese Patent Application No. 2008-506301; Drafting date: Mar. 15, 2013, with English Translation.
Decision of Refusal; Japanese Patent Application No. 2012-126682; Drafting date: Mar. 15, 2013, with English Translation.
Extended European Search Report for Application No./Patent No. 07739051.6-2111/1998388, dated Jan. 6, 2012.
Murov et al. "Handbook of Photochemistry, 2nd Edition", Marcel Dekker, Inc.: New York, 1993, pp. 84-85.
Holmes et al., "Blue organic electrophosphorescence using exothermic host-guest energy transfer", Appl. Phys. Lett, vol. 82, No. 15, Apr. 14, 2003, p. 2422-2424.
International Search Report for International Application No. PCT/JP2007/055608, mailed Jun. 5, 2007, with English translation.
Kawamura et al; "100% Phosphorescence Quantum Efficiency of Ir(III) Complexes in Organic Semiconductor Films." Applied Physics Letters. vol. 86: 071104; 2005 (3 pages).
Kanno H. et al.: "White Stacked Electrophosphorescent organic light emitting devices employing Mo03 as a charge-generation layer", Advanced Materials, Wiley VCH Verlag, DE, vol. 18, Jan. 1, 2006, pp. 339-342.
Notice of Reasons for Refusal for Japanese Patent Application No. 2008-506301, drafted Mar. 23, 2012, with English translation.
Yeh, Shi Jay et al;"New Dopant and Host Materials for Blue-Light-emitting Phosphorescent Organic Electroluminescent Devices." Adv. Mater. vol. 17. No. 3: 2005, pp. 285-289.
Suzuri, Yoshiyuki et al. "The Development of Emission Layer Host Materials for Blue Phosphorescence Electroluminescence Device", Konica Minolta Technology Center, Inc., 11 pages.
English translation of Japanese Patent Application No. 2006-079918, filed Mar. 23, 2006 (no publication date).
Brunner, K. et al; "Carbazole Compounds as Host Materials for Triplet Emitters in Organic Light-Emitting Diodes: Tuning the HOMO Level without Influencing the Triplet Energy in Small Molecules", J. Am. Chem. Soc., vol. 126, No. 19, (2004), pp. 6035-6042.
European Extended Search Report for Application No. 12185784.1-1354; Date of Mailing: Jun. 13, 2013; 7 pgs.
Office Action for the Japanese Patent Application No. 2012-126680, drafted Mar. 5, 2014. English translation attached.
Submission Document of Publications for Japanese Patent Application No. 2012-126680, dated Feb. 14, 2014. English translation attached.
US Non-Final Office Action corresponding to U.S. Appl. No. 13/895,801; Dated Apr. 7, 2016.
US Non-Final Office Action corresponding to U.S. Appl. No. 13/895,824; Dated Apr. 12, 2016.
US Non-Final Office Action corresponding to U.S. Appl. No. 13/895,840; Dated Apr. 14, 2016.
Extended European Search Report corresponding to Application No. 16172085.9-1375; Date of Mailing: Sep. 19, 2016.

* cited by examiner

ORGANIC ELECTROLUMINESCENT ELEMENT, DISPLAY DEVICE AND ILLUMINATING DEVICE

CROSS REFERENCE TO RELATED APPLICATIONS

The present application is a continuation application of U.S. patent application Ser. No. 12/293,736, filed on Sep. 19, 2008, now U.S. Pat. No. 8,920,942, the entire contents of which are incorporated herein by reference and priority to which is hereby claimed. Application Ser. No. 12/293,736 is the U.S. National stage of application No. PCT/JP2007/055608, filed Mar. 20, 2007, the entire contents of which are incorporated herein by reference. Priority under 35 U.S.C. §119(a) and 35 U.S.C. §365(b) is hereby claimed from Japanese Application No. 2006-079918, filed Mar. 23, 2006, the entire contents of which are incorporated herein by reference.

TECHNICAL FIELD

The present invention relates to an organic electroluminescent element, a display device and a lighting device.

BACKGROUND OF ART

Conventionally, an emission type electronic display device includes an electroluminescence display (hereinafter, referred to as an ELD). A constituent element of ELD includes such as an inorganic electroluminescent element and an organic electroluminescent element (hereinafter, referred to as an organic EL element). An inorganic electroluminescent element has been utilized as a flat light source, however, requires a high voltage of alternating current to operate an emission element.

On the other hand, an organic electroluminescent element is an element provided with a constitution comprising an emission layer containing a emitting substance being sandwiched with a cathode and an anode, and an exciton is generated by an electron and a positive hole being injected into the emission layer to be recombined, resulting emission utilizing light release (fluorescence phosphorescence) at the time of deactivation of said exciton; the emission is possible at a voltage of approximately a few to a few tens volts, and an organic electroluminescent element is attracting attention with respect to such as superior viewing angle and high visual recognition due to a self-emission type as well as space saving and portability due to a completely solid element of a thin layer type.

In an organic electroluminescence in view of the future practical application, desired has been development of an organic EL element which efficiently emits at a high luminance with a low electric consumption. Examples of such technologies are a slight amount of a fluorescent substance doped in a stilbene derivative, distyrylarylene derivative or a tristyrylarylene derivative, to achieve improved emission luminance and a prolonged lifetime of an element (for example, refer to Patent Document No. 1). Further, there are known such as an element having an organic emission layer comprising a 8-hydroxyquinoline aluminum complex as a host compound which is doped with a slight amount of a fluorescent substance (for example, refer to Patent Document No. 2) and an element having an organic emission layer comprising a 8-hydroxyquinoline aluminum complex as a host compound which is doped with quinacridone type dye (for example, refer to Patent Document No. 3).

Regarding to the technologies disclosed in the above-described Patent Documents, when emission from an excited singlet is utilized, since a generation ratio of a singlet exciton to a triplet exciton is ⅓, that is, a generation probability of an emitting exciton species is 25% and a light taking out efficiency is approximately 20%, the limit of a quantum efficiency (next) of taking out is said to be 5%.

However, since an organic EL element which utilizes phosphorescence from an excited triplet has been reported from Princeton University (for example, refer to Non Patent Document 1), researches on materials exhibiting phosphorescence at room temperature have come to be active (for example, refer to Non Patent Document 2). Since the upper limit of internal quantum efficiency becomes 100% by utilization of an excited triplet, which is principally 4 times of the case of an excited singlet, it may be possible to achieve almost the same ability as a cooled cathode ray tube to attract attention also for an illumination application. As a dopant used for an organic electroluminescent element employing phosphorescence, many compounds mainly belonging to iridium complexes have been investigated (for example, refer to Non Patent Document No. 3).

An example is tris(2-phenylpyridine)iridium (refer to Non Patent Document No. 2). In addition to that, there have been studied to use $L_2Ir(acac)$ such as $(ppy)_2Ir(acac)$ as a dopant (for example, refer to Non Patent Document No. 4). Also there have been studied to use compounds such as tris(2-(p-tolyl)pyridine)iridium $(Ir(ptpy)_3)$ and tris(benzo[h]quinoline)iridium $(Ir(bzq)_3)$, $Ir(bzq)_2ClP(Bu)_3$ (for example, refer to Non Patent Document No. 5). Also known are investigations on iridium complexes having phenyl pyrazole as a ligand (refer to Non Patent Documents No. 4).

A FIrpic, which is a typical phosphorescent blue dopant, has achieved a shortening of emission wavelength with a fluorine-substituted phenylpyridine and a picolinic acid being employed as a major ligand and an auxiliary ligand respectively. As an auxiliary ligand, other than the picolinic acid, a pirazabole type ligand has been known to shorten an emission wavelength by being introduced into the dopant. (for example, refer to Patent Document 1 and Non-Patent Documents 1 and 2). The aforesaid dopants, in combination with carbazol derivatives or triarylsilanes as a host compound, have realized high efficient elements, but on the other hand, have significantly degraded emission life of the elements. Then, improvement to overcome the trade-off relationship has been demanded.

Any of the above-described blue dopants are such types of compounds that the dopant materials have a low level of the highest occupied molecular orbital (hereinafter abbreviated as "HOMO") and the lowest unoccupied molecular orbital (hereinafter abbreviated as "LUMO"). HOMO and LUMO levels of the above dopants are lower by about 1 eV compared to those of a $Ir(ppy)_3$, which is a typical phosphorescent green dopant. As a blue dopant, compounds having low HOMO and LUMO levels have been known, but only a few compounds having high HOMO and LUMO levels have been reported. Recently, blue dopants having high HOMO-LUMO levels were reported (refer to Patent Documents 5 and 6), but these dopants are insufficient with regard to efficiency and life, therefore the achievements of higher efficiency and longer life are the issues.

Patent Document 1: Japanese Patent Registration No. 3093796
Patent Document 2: Unexamined Japanese Patent Application Publication (hereinafter referred to as JP-A) No. 63-264692
Patent Document 3: JP-A No. 3-255190

Patent Document 4: WO 04/085450
Patent Document 5: U.S. Patent Registration No. 2004/0048101
Patent Document 6: WO 04/085450
Non-Patent Document 1: M. A. Baldo et al., Nature, Vol. 395, pages 151-154 (1998)
Non-Patent Document 2: M. A. Baldo et al., Nature, Vol. 403, No. 17, pages 750-753 (2000)
Non-Patent Document 3: S. Lamansky et al., J. Am. Chem. Soc., Vol. 123, page 4304 (2001)
Non-Patent Document 4: M. E. Tompson et al., The 10th International Workshop on Inorganic and Organic Electroluminescence (EL' 00, Hamamatsu)
Non-Patent Document 5: Moon-Jae Youn. Og, Tetsuo Tsutsui et al., The 10th International Workshop on Inorganic and Organic Electroluminescence (EL' 00, Hamamatsu)

DISCLOSURE OF THE INVENTION

Issues to be Solved by the Invention

The object of the present invention is to provide an organic electroluminescent element exhibiting high light emission efficiency and long life, and a lighting device and a display device both of which employ the aforesaid element.

Measures to Solve the Issue

The above issues have been achieved by the following constitutions.

1. An organic electroluminescent element having electrodes and at least one organic layer on a substrate, wherein at least one of the aforesaid organic layers is a light-emitting layer incorporating a phosphorescent compound and a host compound; the aforesaid phosphorescent compound has a HOMO of −5.15 to −3.50 eV and a LUMO of −1.25 to 1.00 eV; and the aforesaid host compound has the phosphorescence 0-0 band of not more than 460 nm, and the glass transition point of not less than 60° C.

2. The organic electroluminescent element of the Item 1, wherein the above-described phosphorescent compound has a HOMO of −4.80 to −3.50 eV, and a LUMO of −0.80 to 1.00 eV.

3. An organic electroluminescent element of Items 1 or 2, wherein the above-described phosphorescent compound is represented by Formula (A) below.

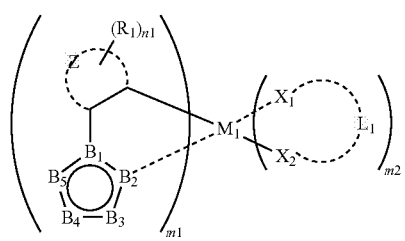

Formula (A)

(wherein $R_1$ represents a substituent; Z represents a non-metal atom group necessary to form a 5 to 7-membered ring; n1 represents an integer of 0 to 5; each $B_1$ to $B_5$ independently represents a carbon atom, a nitrogen atom, an oxygen atom or a sulfur atom, provided that one of which represents a nitrogen atom; $M_1$ represents a metal of Group 8 to 10 of the Periodic Table of the Elements; each $X_1$ and $X_2$ independently represent a carbon atom, a nitrogen atom, or an oxygen atom; $L_1$, together with $X_1$ and $X_2$, represents a group of atoms to form a bidentate ligand; and m1 is an integer of 1 to 3, and m2 is an integer of 0 to 2, provided that a sum of m1 and m2 is 2 or 3.)

4. The organic electroluminescent element of any one of the Items 1 to 3, wherein m2 is 0 in the phosphorescent compound represented by the above-described Formula (A).

5. The organic electroluminescent element of any one of the Items 1 to 4, wherein a nitrogen-containing heterocycle formed by $B_1$ to $B_5$ is an imidazole ring in the phosphorescent compound represented by the above-described Formula (A).

6. The organic electroluminescent element of any one of the Items of 1 to 5, wherein the above-described Formula (A) is represented by Formula (B) below.

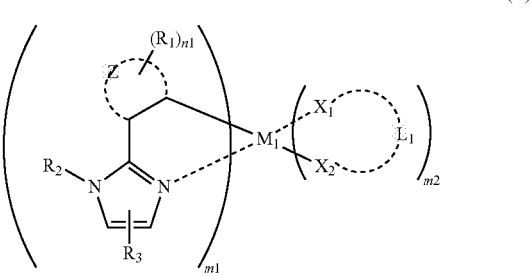

Formula (B)

(wherein $R_1$, $R_2$, and $R_3$ represents a substituent; Z represents a non-metal atom group necessary to form a 5 to 7-membered ring; n1 represents an integer of 0 to 5; $M_1$ represents a metal of Group 8 to 10 of the Periodic Table of the Elements; each $X_1$ and $X_2$ independently represents a carbon atom, a nitrogen atom, or an oxygen atom; $L_1$, together with $X_1$ and $X_2$, represents a group of atoms to form a bidentate ligand; and m1 is an integer of 1 to 3, and m2 is an integer of 0 to 2, provided that a sum of m1 and m2 is 2 or 3.)

7. The organic electroluminescent element of the Item 6, wherein, in the above-described Formula (B), a substituent represented by $R_2$ is represented by Formula (C) below.

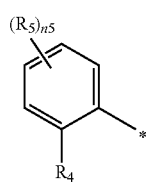

Formula (C)

(wherein $R_4$ represents a substituent having a steric parameter value (an Es value) of not more than −0.5, $R_5$ represents a substituent, and n5 represents an integer of 0 to 4. The asterisk "*" in the Formula indicates a bonding position.)

8. The organic electroluminescent element of any one of the Items of 1 to 7, wherein the above-described host compound is represented by Formula (1) below.

Formula (1)

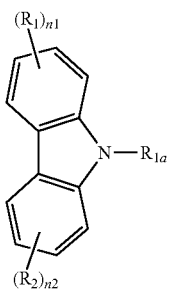

(wherein $R_{1a}$ represents a hydrogen atom, an aliphatic group, an aromatic group, or a heterocyclic group; each $R_1$ and $R_2$ independently represent a hydrogen atom or a substituent; and each n1 and n2 represents an integer of 0 to 4.)

9. The organic electroluminescent element of any one of the Items of 1 to 7, wherein the above-described host compound is represented by Formula (2) below.

Formula (2)

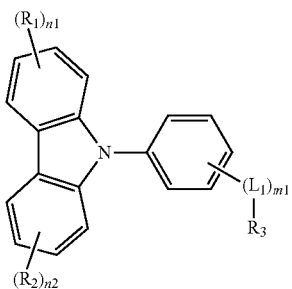

(wherein each $R_1$ and $R_2$ independently represents a hydrogen atom or a substituent; $R_3$ represents a substituent; $L_1$ represents a bivalent linking group; n1 and n2 represents an integer of 0 to 4; and m1 represents an integer of 0 to 5.)

10. The organic electroluminescent element of any one of the Items of 1 to 7, wherein the above-described host compound is represented by Formula (3) below.

Formula (3)

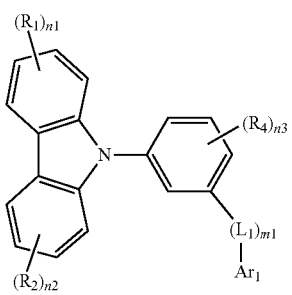

(wherein each $R_1$, $R_2$, and $R_4$ independently represents a hydrogen atom or a substituent; $L_3$ represents a bivalent linking group; $Ar_1$ represents an aromatic group or a heterocyclic group; each n1 to n3 represents an integer of 0 to 4; and m3 represents an integer of 0 or 1.)

11. The organic electroluminescent element of any one of the Items of 1 to 7, wherein the above-described host compound is represented by Formula (4) below.

Formula (4)

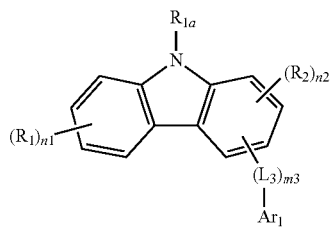

(wherein $R_{1a}$ represents a hydrogen atom, an aliphatic group, an aromatic group, or a heterocyclic group; each $R_1$ and $R_2$ represents a substituent; $L_3$ represents a bivalent linking group; $Ar_1$ represents an aromatic group or a heterocyclic group; each n1 and n2 represents an integer of 0 to 4; and m3 represents an integer of 0 or 1.)

12. The organic electroluminescent element of any one of the Items of 1 to 7, wherein the above-described host compound is represented by Formula (5) below.

Formula (5)

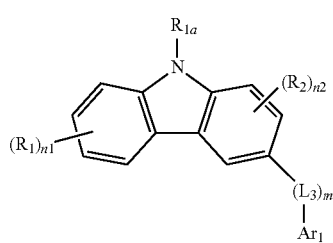

(wherein $R_{1a}$ represents a hydrogen atom, an aliphatic group, an aromatic group, or a heterocyclic group; each $R_1$ and $R_2$ independently represents a hydrogen atom or a substituent; $L_3$ represents a bivalent linking group; $Ar_1$ represents an aromatic group or a heterocyclic group; n1 represents an integer of 0 to 4; n2 represents an integer of 0 to 3; and m3 represents an integer of 0 or 1.)

13. The organic electroluminescent element of any one of the Items of 1 to 7, wherein the above-described host compound is represented by Formula (6) below.

Formula (6)

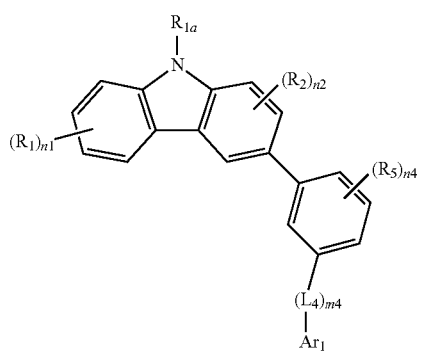

(wherein $R_{1a}$ represents a hydrogen atom, an aliphatic group, an aromatic group, or a heterocyclic group; each $R_1$, $R_2$ and $R_5$ independently represents a hydrogen atom or a substituent; $L_4$ represents a bivalent linking group; $Ar_1$ represents an aromatic group or a heterocyclic group; each n1 and n4 represents an integer of 0 to 4; n2 represents an integer of 0 to 3; and m4 represents an integer of 0 or 1.)

14. The organic electroluminescent element of any one of the Items of 1 to 7, wherein the above-described host compound is represented by Formula (7) below.

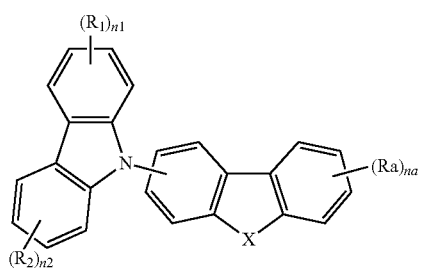

Formula (7)

(wherein each $R_1$, $R_2$, and Ra independently represent a hydrogen atom or a substituent; each n1, n2 and na represents an integer of 0 to 4; and X represents NRb, S, or O.)

15. The organic electroluminescent element of any one of the Items of 8 to 13, wherein $Ar_1$ in Formulae (3) to (6) is a carbazolyl group.

16. The organic electroluminescent element of any one of the Items of 1 to 15, wherein the above-described host compound exhibits the glass transition point of not less than 90° C.

17. The organic electroluminescent element of any one of the Items of 1 to 15, wherein the above-described host compound exhibits the glass transition point of not less than 130° C.

18. The organic electroluminescent element of any one of the Items of 1 to 15, wherein the above-described host compound exhibits the glass transition point of not less than 160° C.

19. The organic electroluminescent element of any one of the Items of 1 to 18, wherein the aforesaid organic electroluminescent element has an electron blocking layer.

20. The organic electroluminescent element of any one of the Items of 1 to 19, wherein the aforesaid organic electroluminescent element emits white light.

21. The display device, wherein the aforesaid device is provided with the organic electroluminescent element of any one of the Items of 1 to 20.

22. The lighting device, wherein the aforesaid device is provided with the organic electroluminescent element of any one of the Items of 1 to 20.

23. The display device, wherein the aforesaid device is provided with the lighting device described in Item 22 and a liquid crystal element as a display means.

Effects of the Invention

According to the present invention, an organic electroluminescent element having high light emission efficiency and a long life, and a lighting device and a display device both of which employ the aforesaid element, can be provided.

Figure 1:
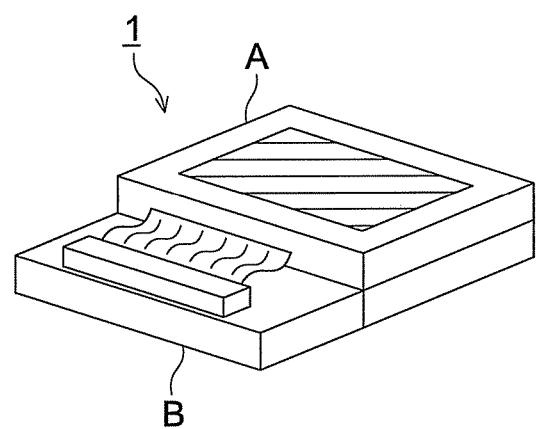
FIG. 1 is a schematic drawing to show an example of a display device constituted of an organic EL element.

DESCRIPTION OF SYMBOLS 1 display
3 pixel
5 scanning line
6 data line
7 electrical power line
10 organic EL element
11 switching transistor
12 operating transistor
13 capacitor
A display section
B control section
107 glass substrate having a transparent electrode
106 organic EL layer
105 cathode
102 glass cover
108 nitrogen gas
109 desiccant

MOST PREFERRED EMBODIMENTS TO CARRY OUT THE INVENTION

As a result of close examination, in view of the foregoing, by the inventors of the present invention, an organic electroluminescent element having high light emission efficiency and long emission life was provided by employing any one of constituents of Items 1 to 23 in the organic electroluminescent element of the present invention. Further, a display device and a lighting device both of which have high brightness and long life were provided by employing the organic electroluminescent element which exhibits the above-described properties.

The present invention will be described in details as below.

<Phosphorescent Compound>

Phosphorescent compounds in the emitting layer of the present invention each has a HOMO level of −5.15 to −3.50 eV and a LUMO level of −1.25 to +1.00 eV. More preferably, it has a HOMO level of −4.80 to −3.50 eV and a LUMO level of −0.80 to +1.00 eV.

In the present invention, the values of HOMO and LUMO levels denote the values obtained by calculations using Gaussian 98 (Gaussian 98, Revision A. 11. 4, M. J. Frisch, et al, Gaussian, Inc., Pittsburgh, Pa., 2002), which is software for a molecular orbital calculation, and produced by Gaussian Inc. The values of HOMO and LUMO levels of the host compound of the present invention are defined as values (a converted value in eV unit) calculated via structure optimization employing B3LYP/6-31G* as a key word. And the values of HOMO and LUMO levels of the phosphorescent compound of the present invention are defined as values (a converted value in eV unit) calculated via structure optimization employing B3LYP/LanL2DZ as a key word. The reason for the calculated value being considered to be valid is that the calculated value obtained by the above method is in good agreement with the experimental one.

<Phosphorescent Compound represented by Formula (A)>

In the present invention, phosphorescent compounds represented by Formula (A) are preferable as the aforesaid phosphorescent compounds.

In Formula (A) for a phosphorescent compound in the present invention, a substituent represented by $R_1$ are as follows. Examples of such a substituent include an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group), a cycloalkyl group (for example, a cyclopentyl group and a cyclohexyl group), an alkenyl group (for example, a vinyl group and an allyl group), an alkynyl group (for example, an ethynyl group and a propargyl group), an aromatic hydrocarbon ring group (also called an aromatic carbon ring group or an aryl group such as a phenyl group, a p-chlorophenyl group, a mesityl group, a tolyl group, a xylyl group, a naphthyl group, an anthryl group, an azulenyl group, an acenaphthenyl group, fluorenyl group, a phenanthryl group, an indenyl group, a pyrenyl group, or a biphenyl group), an aromatic heterocyclic group (for example, a pyridyl group, a pyrimidinyl group, a furyl group, a pyrrolyl group, an imidazolyl group, a benzimidazolyl group, a pyrazolyl group, a piradinyl group, a triazolyl group (for example, a 1,2,4-triazole-1-yl group and a 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolynyl group, a diazacarbazoyl group (which shows that one of the carbon atoms which constitute a carboline ring of the above carbolinyl group is replaced with a nitrogen atom), a quinoxythalinyl group, a pyridazinyl group, a triazinyl group, a quinazolinyl group, a phthalazinyl group), a heterocyclic group (for example, a pyrrolidinyl group, an imidazolidyl group, a morpholyl group, and an oxazolidyl group), an alkoxy group (for example, a methoxy group, an ethoxy group, a propyloxy group, a pentyloxy group, a hexyloxy group, an octyloxy group, and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group, and a dodecylthio group), a cycloalkylthio group (for example, a cyclopentylthio group and a cyclohexylthio group), an arylthio group (for example, a phenylthio group and a naphthylthio group), an alkoxycarbonyl group (for example, a methyloxycarbonyl group, an ethyloxycarbonyl group, a butyloxycarbonyl group, an octyloxycarbonyl group, and a dodecyloxycarbonyl group), an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, a pyridylcarbonyl group), an acyloxy group (for example, an acetyloxy group, an ethylcarbonyloxy group, a butylcarbonyloxy group, an octylcarbonyloxy group, a dodecylcarbonyloxy group, and a phenylcarbonyloxy group), an amido group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), an ureido group (for example, a methylureido group, an ethylureido group, a pentylureido group, a cyclohexylureido group, an octylureido group, a dodecylureido group, phenylureido group, a naphthylureido group, and a 2-pyridylaminoureido group), a sulfinyl group (for example, a methylsulfinyl group, an ethylsulfinyl group, a butylsulfinyl group, a cyclohexylsulfinyl group, a 2-ethylhexylsulfinyl group, a docecylsulfinyl group, a phenylsulfinyl group, a naphthylsulfinyl group, and a 2-pyridylsulfinyl group), an alkylsulfonyl group (for example, a methylsulfonyl group, an ethylsulfonyl group, a butylsulfinyl group, a cyclohexylsulfonyl group, a 2-ethylhexylsulfonyl group, and a dodecylsulfonyl group), an arylsulfonyl group or a heteroarylsulfonyl group (for example, a phenylsulfonyl group, a naphthylsulfonyl group, and a 2-pyridylsulfonyl group), an amino group (for example, an amino group, an ethylamino group, a dimethylamino group, a butylamino group, a cyclopentylamino group, a 2-ethylhexylamino group, a dodecylamino group, an anilino group, a cyclopentylamino group, a 2-ethylhexylamino group, a dodecylamino group, an anilino group, a naphthylamino group, and a 2-pyridylamino group), a halogen atom (for example, a fluorine atom, a chlorine atom, and a bromine atom), a fluorinated hydrocarbon group (for example, a fluoromethyl group, a trifluoromethyl group, a pentafluoroethyl group, and a pentafluorophenyl group), a cyano group, a nitro group, a hydroxyl group, a mercapto group, and a silyl group (for example, a trimethylsilyl group, a triisopropylsilyl group, a triphenylsilyl group, and a phenyldiethylsilyl group).

Of these substituents, an alkyl group and an aryl group are preferred.

Z represents a non-metal atom group necessary to form a 5 to 7-membered ring. Examples of a 5 to 7-membered ring formed by Z include a benzene ring, a naphthalene ring, a pyridine ring, a pyrimidine ring, a pyrrole ring, a thiophene ring, a pyrazole ring, an imidazole ring, an oxazole ring, and thiazole ring, of which a benzene ring is preferred.

Each of $B_1$ to $B_5$ independently represents a carbon atom, a nitrogen atom, an oxygen atom, or a sulfur atom, provided that at least one of $B_1$ to $B_5$ represent nitrogen. As an aromatic nitrogen-containing heterocycle formed of these five atoms, a monocycle is preferred. Examples thereof include a pyrrole ring, a pyrazole ring, an imidazole ring, a triazole ring, a tetrazole ring, an oxazole ring, an isooxazole ring, a thiazole ring, an isothiazole ring, an oxadiazole ring, and a thiadiazole ring. Of these, a pyrazole ring and an imidazole ring are preferred, and an imidazole ring is more preferred. The above rings may be further substituted with the above-described substituent. The preferable substituents are an alkyl group and an aryl group, and more preferable are a substituted aryl group and a non-substituted aryl group.

$L_1$, together with $X_1$ and $X_2$, represents an atom group necessary to form a bidentate ligand. Specific examples of the bidentate ligand, represented by $X_1$-$L_1$-$X_2$, include substituted or non-substituted phenylpyridine, phenylpyrazole, phenylimidazole, phenyltriazole, phenyltetrazole, pyrazabole, picolinic acid, and acetylacetone.

The above groups may be further substituted with the above-described substituent.

m1 represents an integer of 1 to 3, and m2 represents an integer of 0 to 2, provided that a sum of m1 and m2 is 2 or 3, of which m2 is preferably 0.

As a metal represented by $M_1$, a transition metal element (also simply referred to as a transition metal) of Group 8 to 10 of the Periodic Table of the Elements is employed. Of these, iridium and platinum are preferred, and iridium is more preferred.

The phosphorescent compound, represented by Formula (1) of the present invention, may or may not have a polymerizable group or a reactive group.

Further, the nitrogen-containing heterocycle in the above-described Formula (1) formed by $B_1$ to $B_5$ is preferably an imidazole ring.

In case that the nitrogen-containing heterocycle formed by B1 to $B_5$ is the imidazole ring, the above-described Formula (A) is more preferably represented by the above-described Formula (B).

In Formula (B), $R_1$, $R_2$, and $R_3$ represent a substituent; Z represents a non-metal atom group necessary to form a 5 to 7-membered ring; n1 represents a integer of 0 to 5; $M_1$ represents a metal of Group 8 to 10 of the Periodic Table of the Elements; each of $X_1$ and $X_2$ represents a carbon atom, a nitrogen atom, or an oxygen atom; $L_1$, together with $X_1$ and $X_2$, represents an atom group necessary to form a bidentate ligand; m1 represents an integer of 1 to 3; and m2 represents an integer of 0 to 2, provided that a sum of m1 and m2 is 2 or 3.

In Formula (B), substituents represented by $R_1$, $R_2$, and $R_3$ are the same as those represented by $R_1$ in the above-described Formula (A). Further, Z, $M_1$, $X_1$, $X_2$, $L_1$, and the like are also the same as those used in Formula (A), and m1 and m2 are also the same as those used in Formula (A).

A group represented by $R_2$ of Formula (B) is preferably an aromatic hydrocarbocyclic group (an aromatic carbocyclic group), of which a substituted aryl group is preferred. As the substituted aryl group, a group represented by Formula (C) below is preferred.

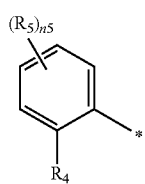

Formula (C)

In Formula (C), $R_4$ represents a substituent having a steric parameter value (an Es value) of not more than −0.5, $R_5$ is the same as $R_1$, and n5 represents an integer of 0 to 4. The asterisk "*" in the Formula indicates a bonding position.

The "Es value" of a substituent denotes a "steric parameter" derived from a chemical reactivity of the substituent. Then, it can be said that the smaller the value is, the larger the steric size of the substituent is.

The Es value is explained as follows: It is known that, in general, in a hydrolysis reaction of an ester under an acidic condition, the influence that a substituent exerts on the progress of the reaction can be considered to be only a steric hindrance. Utilizing the above phenomenon, the steric hindrance of a substituent is numerically converted into the Es value.

Es value of substituent X may be obtainable as follows. Reaction rate constant kX of the following chemical reaction in which α-position mono-substituted acetate, which is derived from α-position mono-substituted acetic acid prepared by substituting one hydrogen atom of the methyl group of acetic acid with substituent X, undergoes hydrolysis under acidic conditions, is obtained.

$$X-CH_2COOR_X+H_2O \rightarrow X-CH_2COOH+R_XOH$$

Reaction rate constant kH of the following reaction ($R_X$ is the same as $R_Y$) in which acetate corresponding to the above α-position mono-substituted acetate undergoes hydrolysis under acetic conditions, is also obtained.

$$CH_3COOR_Y+H_2O \rightarrow CH_3COOH+R_YOH$$

Subsequently, Es is obtained via the following formula.

$$Es=\log(kX/kH)$$

The reaction rate decreases due to steric hindrance of substituent X. As a result, since kX<kH is held, Es value commonly becomes negative. In practice, when Es value is obtained, two reaction rate constants, namely kX and kH, are determined and it is calculated based on the above formula.

Specific examples of Es value are detailed in Unger, S. H., Hansch, C., Prog. Phys. Org. Chem. 12, 91 (1976). Further, specific numerical values are also described in "Yakubutsu no Kozo Kassei Sokan (Structural Activity Correlation)" (Kagaku no Ryoiki Zokan No. 122, Nanko Do), and "American Chemical Society Professional Reference Book, 'Exploring QSAR' p. 81, Table 3-3". Table 1 below shows some of them.

TABLE 1

| Substituent | Es value |
|---|---|
| H | 0 |
| F | −0.46 |
| Cl | −0.97 |
| Br | −1.16 |
| I | −1.4 |
| $CH_3$ | −1.24 |
| $C_2H_5$ | −1.31 |
| n-$C_3H_7$ | −1.6 |
| n-$C_4H_9$ | −1.63 |
| i-$C_4H_9$ | −2.17 |
| s-$C_4H_9$ | −2.37 |
| t-$C_4H_9$ | −2.78 |
| cyclo-$C_4H_7$ | −1.3 |
| n-$C_5H_{11}$ | −1.64 |
| i-$C_5H_{11}$ | −1.59 |
| $CH(C_2H_5)$ | −3.22 |
| cyclo-$C_6H_{11}$ | −2.03 |
| $CH_2F$ | −1.48 |
| $CH_2Cl$ | −1.48 |
| $CH_2Br$ | −1.51 |
| $CH_2I$ | −1.61 |
| $CH_2OH$ | −1.21 |
| $CH_2OCH_3$ | −1.43 |
| $CH_2NO_2$ | −2.71 |
| $CH_2COCH_3$ | −1.99 |
| $CHF_2$ | −1.91 |
| $CHCl_2$ | −2.78 |
| $CHBr_2$ | −3.1 |
| $CHOHCH_3$ | −1.15 |
| $CF_3$ | −2.4 |
| $CCl_3$ | −3.3 |
| $CBr_3$ | −3.67 |
| $C(C_6H_5)_3$ | −5.92 |
| $CHCH_3$ | −2.84 |
| CH | −0.51 |

TABLE 1-continued

| Substituent | Es value |
|---|---|
| OH | −0.55 |
| OCH₃ | −0.55 |
| SH | −1.07 |
| SCH₃ | −1.07 |
| SF₅ | −2.91 |
| NH₂ | −0.61 |

Further, it should be noted that the Es value, which is defined in the present invention, is not determined while a methyl group is 0, but is determined while a hydrogen atom to be 0, whereby the Es value of the present invention is a value which is obtained by subtracting 1.24 from the Es value determined while a methyl group is 0.

In the present invention, $R_4$ is a substituent having an Es value of −0.5 or less, preferably it is between −7.0 and −0.6, and it is more preferably between −7.0 and −1.0.

Further, in the present invention, in the case in which keto-enol tautomers are present in $R_4$, the Es value of the keto portion is determined via conversion as an enol isomer. In cases in which other tautomers are present, Es values are determined based on the same conversion method.

Examples of phosphorescent compounds of the present invention represented by Formulas (A) or (B) are shown below. However, the present invention is not limited by them.

1-1

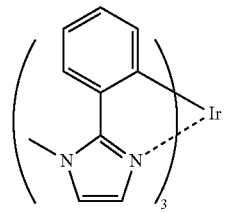

1-2

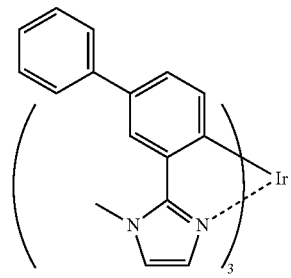

1-3

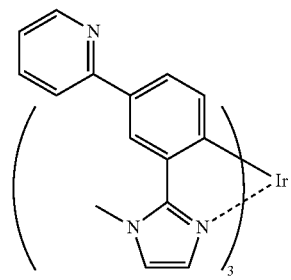

1-4

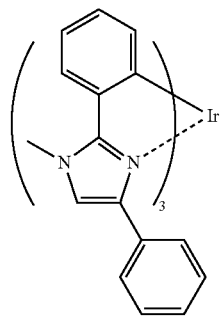

1-5

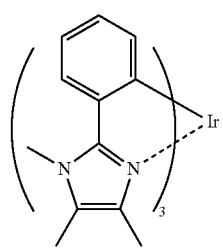

1-6

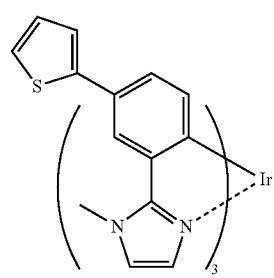

1-7

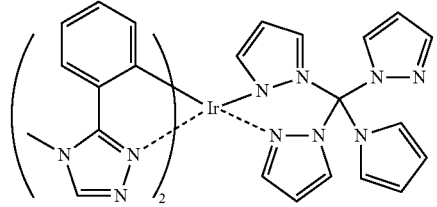

1-8

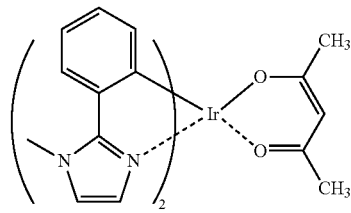

1-9

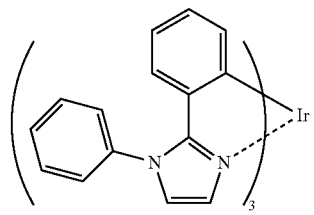

1-10
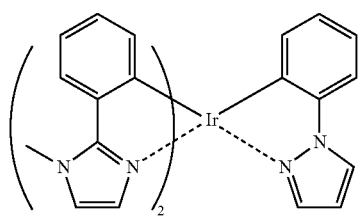
1-11
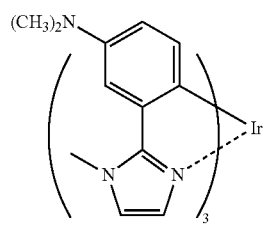
1-12
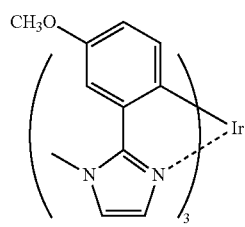
1-13
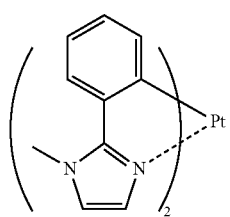
1-14
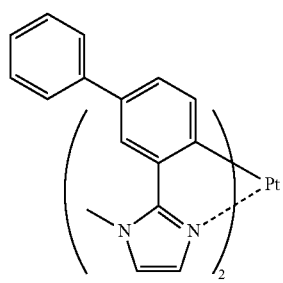
1-15
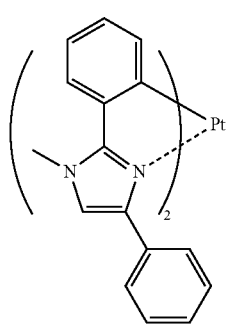
1-16
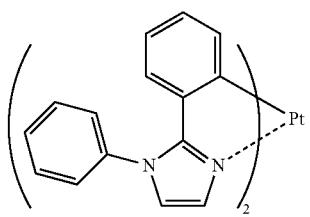
1-17
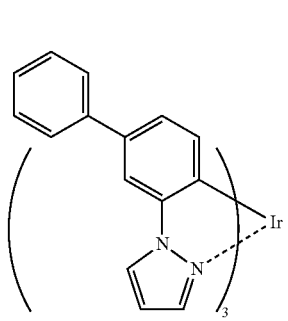
1-18
1-19
1-20
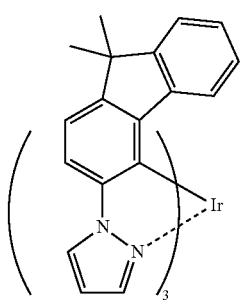

1-21
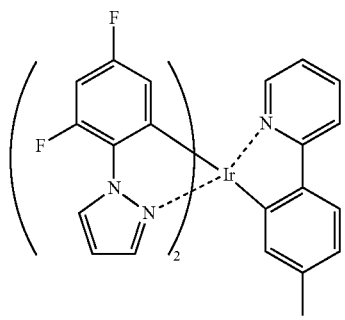
1-22
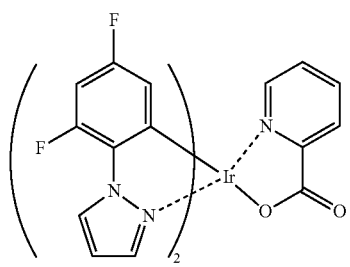
1-23
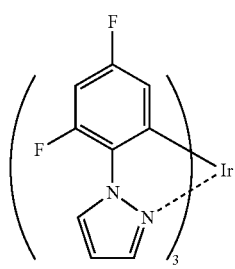
1-24
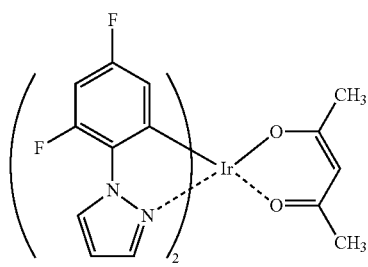
1-25
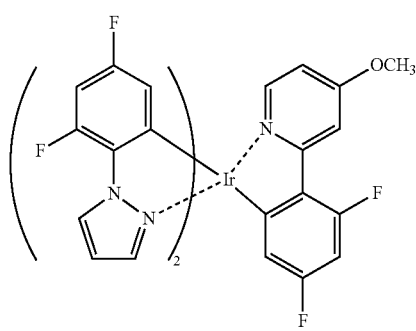
1-26
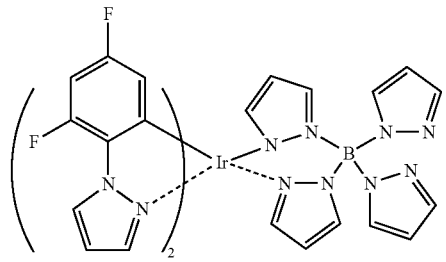
1-27
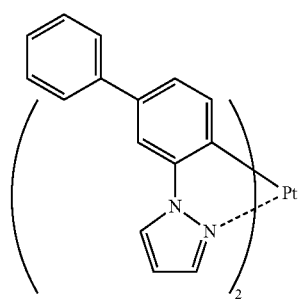
1-28
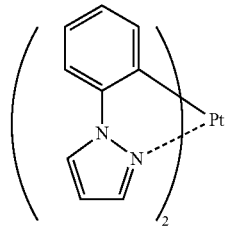
1-29
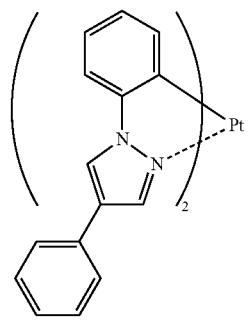
1-30
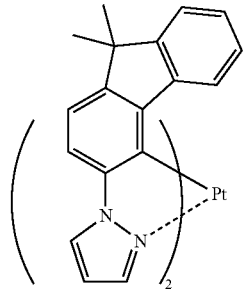

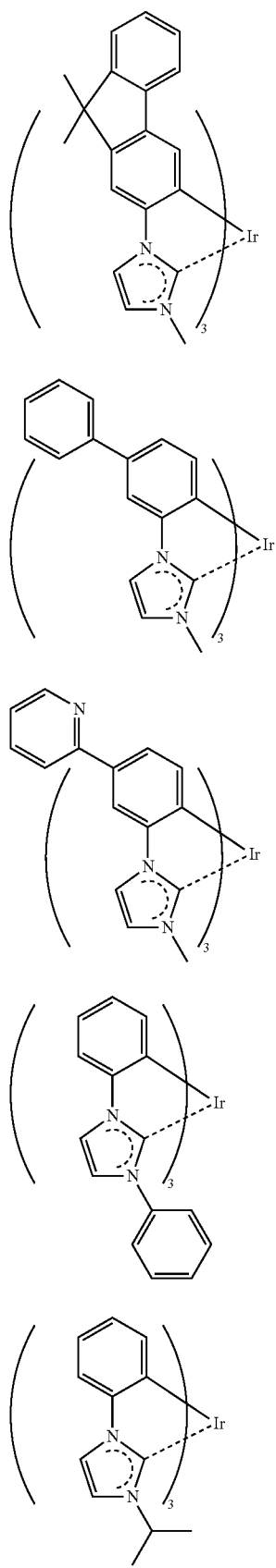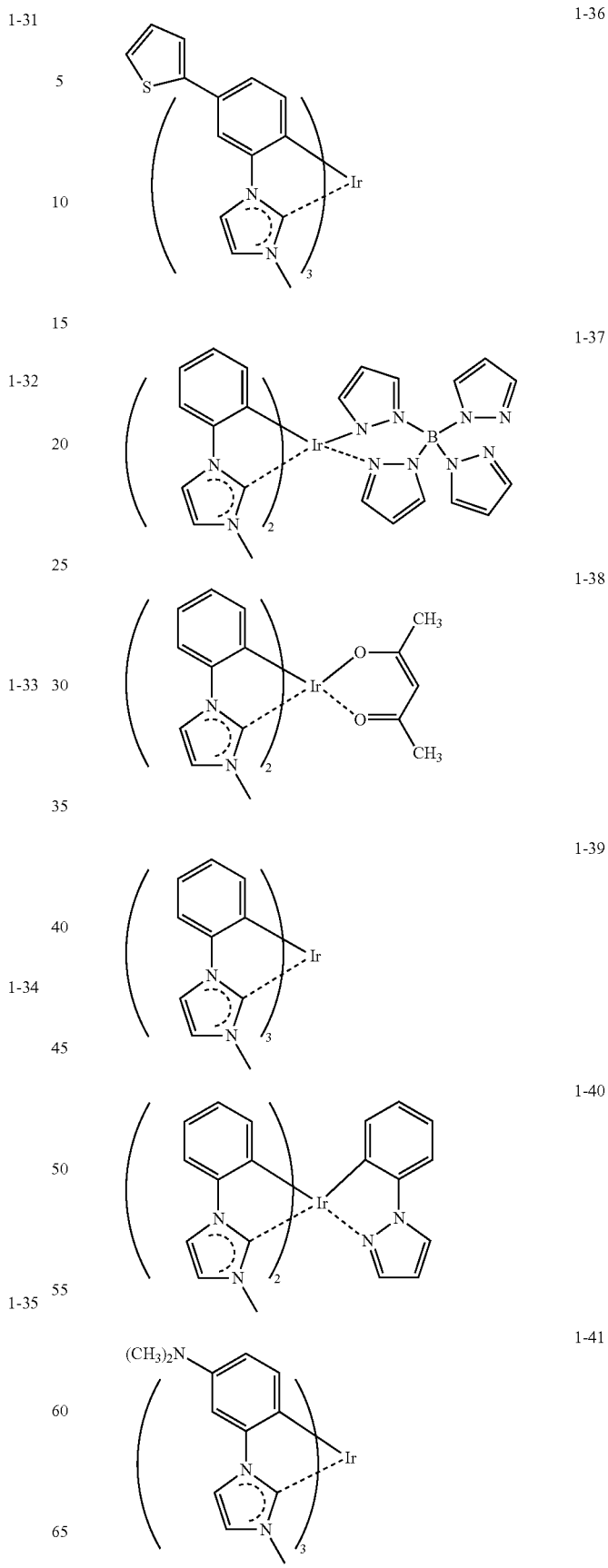

1-42
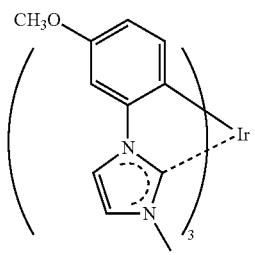
1-43
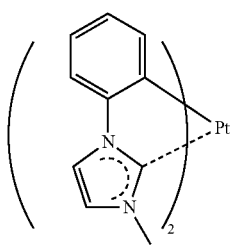
1-44
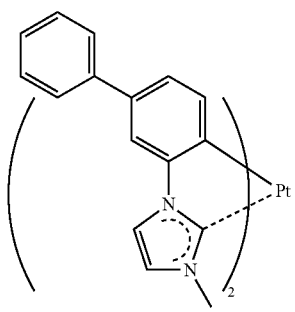
1-45
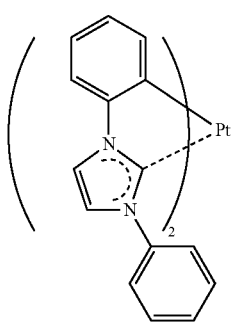
1-46
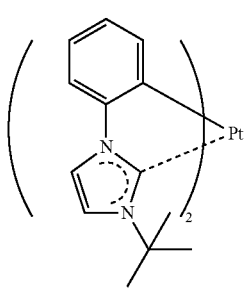
1-47
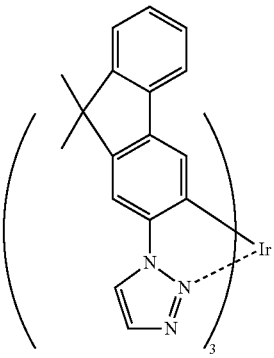
1-48
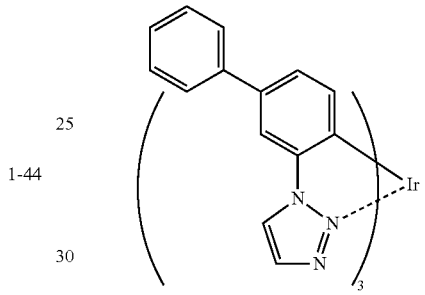
1-49
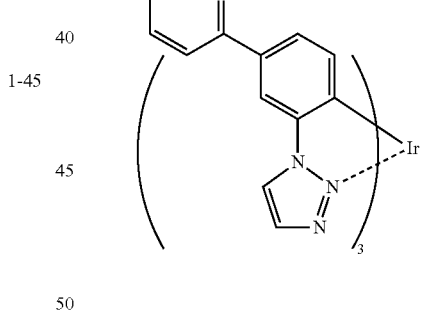
1-50
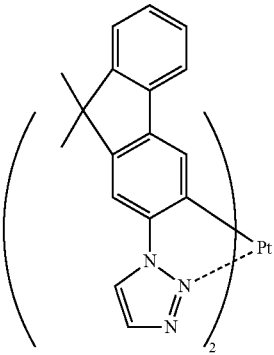

1-51 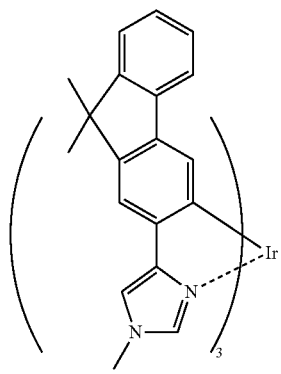
1-52 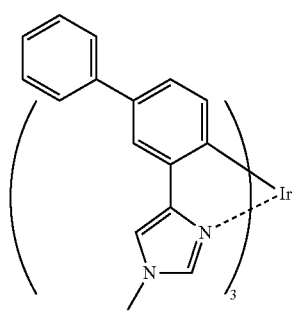
1-53 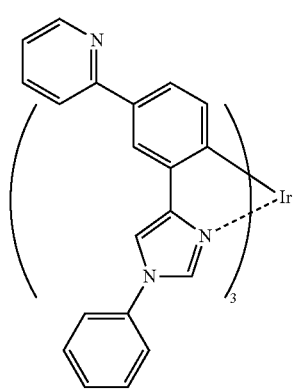
1-54 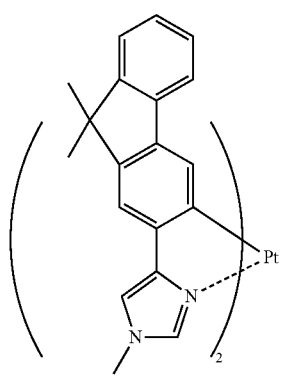
1-55 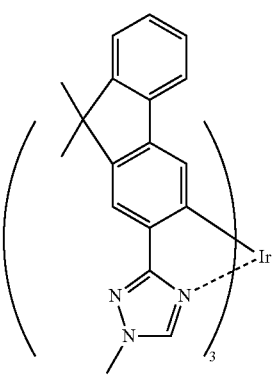
1-56 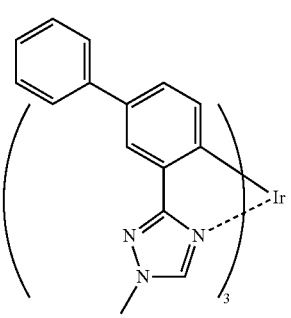
1-57 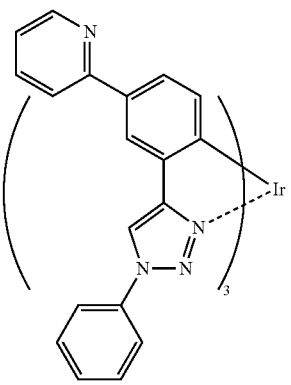
1-58 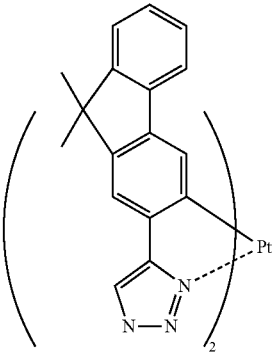

-continued
1-59
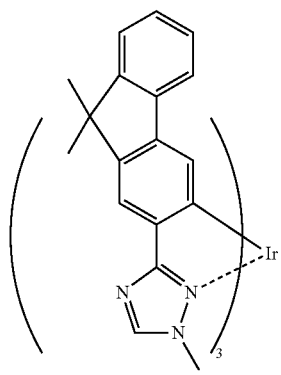
1-60
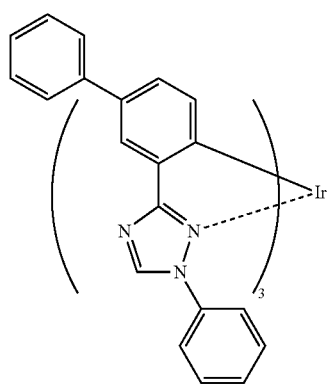
1-61
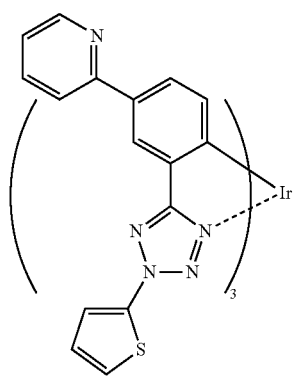
1-62
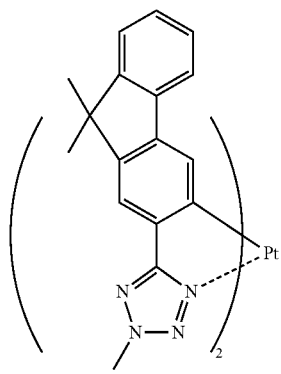
-continued
1-63
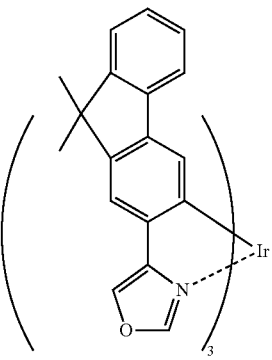
1-64
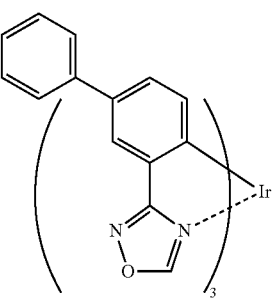
1-65
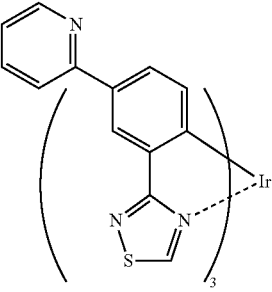
1-66
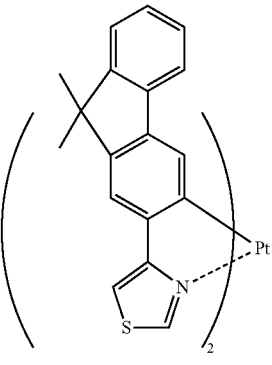

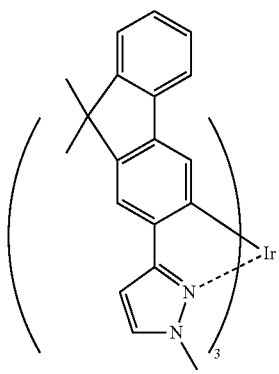
1-67
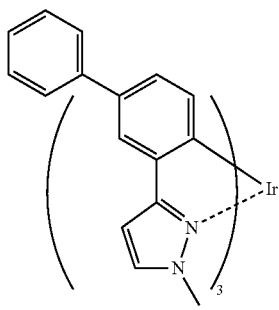
1-68
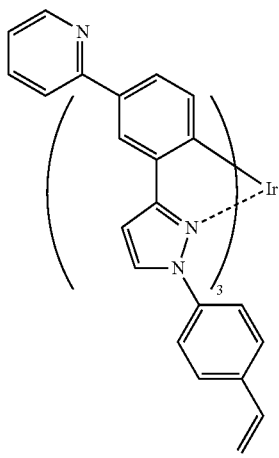
1-69
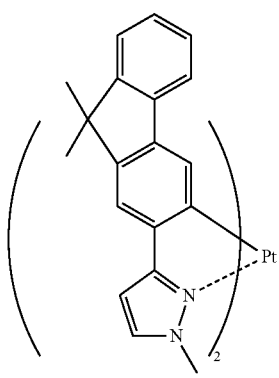
1-70
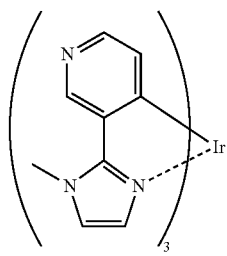
1-71
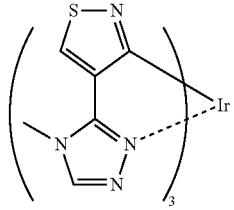
1-72
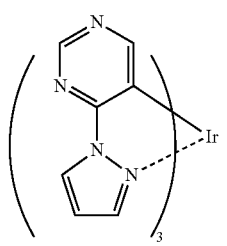
1-73
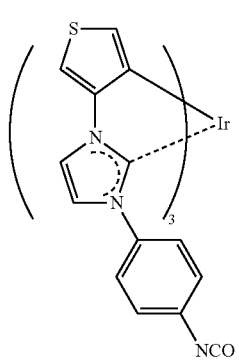
1-74
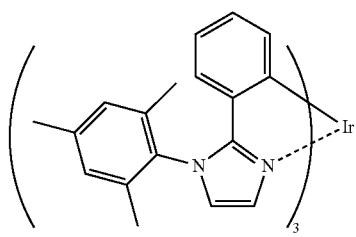
1-75
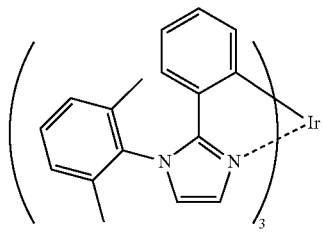
1-76

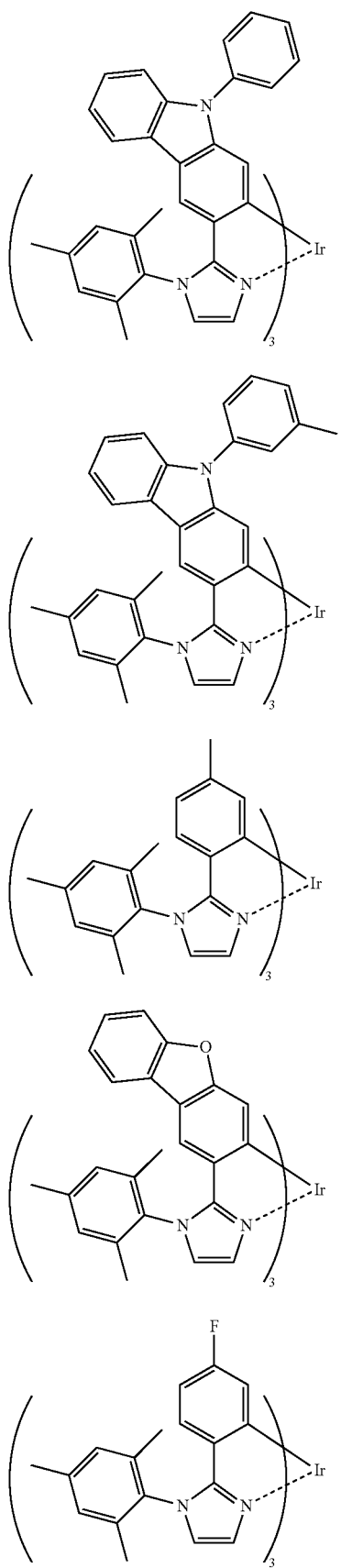

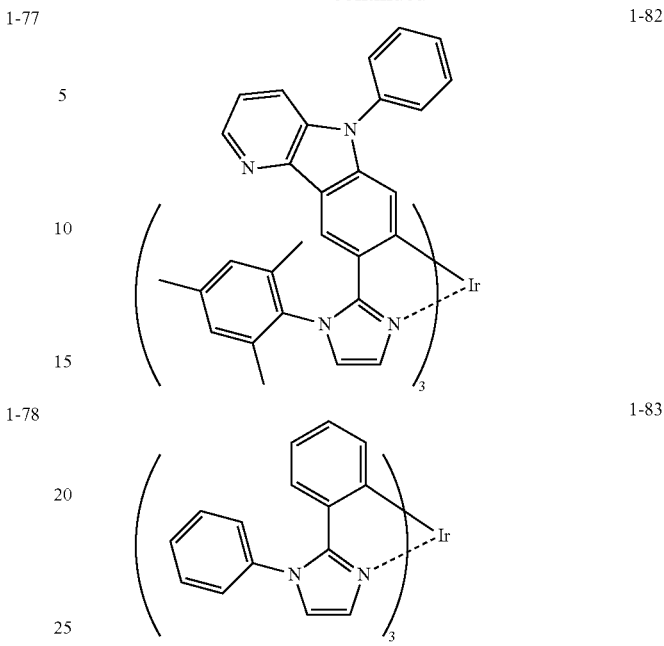

Metal complexes according to an organic EL element material of this invention can be synthesized by applying a method described in such as Organic Letter, vol. 3, No. 16, pp. 2579-2581 (2001), Inorganic Chemistry vol. 30, No. 8, pp. 1685-1687 (1991), J. Am. Chem. Soc., vol. 123, p. 4304 (2001), Inorganic Chemistry vol. 40, No. 7, pp. 1704-1711 (2001), Inorganic Chemistry vol. 41, No. 12, pp. 3055-3066 (2002), New Journal of Chemistry, vol. 26, p. 1171 (2002), European Journal of Organic Chemistry Vol. 4, pp. 695-709 (2004), and reference documents described in these documents.

(Host Compound)

The host compound, employed in the light-emitting layer of the present invention, is characterized in that the aforesaid host compound preferably has a phosphorescence 0-0 band of a shorter wavelength than that of a light-emitting dopant which is employed in combination, and the phosphorescence 0-0 band thereof is not more than 460 nm. The phosphorescence 0-0 band of the host compound is preferably not more than 450 nm, more preferably is not more than 440 nm, and further preferably is not more than 430 nm.

The determination method of the phosphorescence 0-0 band of the present invention will be explained. Firstly, a measuring method of a phosphorescence spectrum will be explained.

A host compound to be measured is dissolved in a mixed solvent of well-deoxygenated ethanol/methanol (4/1 by volume) and placed in a cell for phosphorescence measurement, followed by irradiation of exciting light at a liquid nitrogen temperature of 77 K to measure an emission spectrum 100 ms after completion of the irradiation of exciting light. It is conceivable that since phosphorescence features a longer emission life than fluorescence, most of the light remaining after the 100 ms have elapsed is phosphorescence. Incidentally, a compound exhibiting a phosphorescence life of shorter than 100 ms may be measured by shortening a delay time. However, in cases when shortening the delay time to the extent that the shortened delay time is not distinguished from the life of fluorescence, a problem occurs in that phosphorescence and fluorescence each are indistinguishable, and therefore it is necessary to select an appropriate delay time capable of distinguishing therebetween.

For a compound insoluble in the solvent system described above, any appropriate solvent, which can dissolve the compound, may be employed (it is not substantially problematic since a solvent effect on the phosphorescence wavelength in the above measurement method is negligible.).

Subsequently, a method of determining the 0-0 band is described. In the present invention, the 0-0 band is defined as the maximum emission wavelength appearing in the shortest wavelength portion in the phosphorescence spectrum chart obtained via the above measurement method.

Since the intensity of a phosphorescence spectrum is generally weak, when the spectrum is magnified, it becomes difficult, in some cases, to distinguish between a noise band and a signal peak. In such a case, it is possible to determine a targeted signal peak in such a manner that a light emission spectrum generated right after irradiation of excitation light (for convenience, referred to as "stationary light spectrum") is magnified, which is then superimposed on another magnified light emission spectrum generated at 100 ms after irradiation of excitation light (for convenience, referred to as "phosphorescence spectrum"), to detect a peak wavelength from the stationary light spectrum originated in the phosphorescence spectrum. It is also possible to detect a signal peak wavelength by separation of the noise band and the signal peak via a smoothing treatment. The smoothing method by Savitzky and Golay may be applied as the smoothing treatment.

The host compound, employed in the light-emitting layer of the present invention, is characterized in that the glass transition point thereof is not less than 60° C. The glass transition point thereof is preferably 90° C., more preferably is not more than 130° C., and further preferably is not more than 160° C.

The glass transition point (Tg) may be determined via a method conforming to JIS-K-7121 employing the DSC (Differential Scanning calorimetry).

It is preferable that the above-described host compound, employed in the light-emitting layer of the present invention, is a compound represented by the above-described Formulae (1) to (7).

(Compounds Represented by Formula (1))

In the above-described Formula (1); $R_{1a}$ represents a hydrogen atom, an aliphatic group, an aromatic group, or a heterocyclic group; each $R_1$ and $R_2$ independently represents a hydrogen atom or a substituent; and each n1 and n2 represents an integer of 0 to 4.

Examples of an aliphatic group include: alkyl groups (for example, a methyl group, an ethyl group, a propyl group, an isopropyl group, a tert-butyl group, a pentyl group, a hexyl group, an octyl group, a dodecyl group, a tridecyl group, a tetradecyl group, and a pentadecyl group); cycloalkyl groups (for example, a cyclopentyl group, and a cyclohexyl group); alkenyl groups (for example, a vinyl group, and an allyl group); and alkynyl groups (for example, an ethynyl group, and a propargyl group).

Examples of an aromatic group include: aromatic hydrocarbocyclic groups (also referred to as an aromatic carbocyclic group or an aryl group, which includes a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, and a biphenylyl group); aromatic heterocyclic groups (such as a pyridyl group, a pyrimidinyl group, a furyl group, a pyrrolyl group, an imidazolyl group, a benzimidazolyl group, a pyrazolyl group, a pyrazinyl group, a triazolyl group (such as an 1,2,4-triazole-1-yl group, and an 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolynyl group, a diazacarbazolyl group (which indicates a group in which one of carbon atoms constituting a carboline ring of the above-described carbolynyl group is substituted by an nitrogen atom), a quinoxalinyl group, a pyridazinyl group, a triazinyl group, a quinazolinyl group, and a phthalazinyl group.

Examples of a heterocyclic group include a pyrrolidil group, an imidazolidyl group, a morpholyl group, and an oxazolidyl group.

The substituent is the same as the substituent represented by $R_1$ of a phosphorescent compound represented by the above-described Formula (A).

(Compounds Represented by Formula (2))

In the above-described Formula (2); each $R_1$ and $R_2$ independently represents a hydrogen atom, or a substituent; $R_3$ represents a substituent; $L_1$ represents a bivalent linking group; n1 and n2 represents an integer of 0 to 4; and m1 represents an integer of 0 to 5.

The substituent represented by $R_2$ or $R_3$ is the same as the substituent represented by $R_1$ of a phosphorescent compound represented by the above-described Formula (A).

The bivalent linking group is formed with an element such as C, N, O, S, Si, or Ge, and is preferably a bivalent aromatic ring, a bivalent aromatic heterocycle, a carbon atom, a nitrogen atom, and a silicon atom.

The bivalent linking group may have the same substituent as the substituent explained in the above-described Formula (A). The substituent is preferably an alkyl group, an alkoxyl group, an aryl group, or a heteroaryl group.

Specific examples of the linking group represented by $L_1$ are listed below, but are not limited to them.

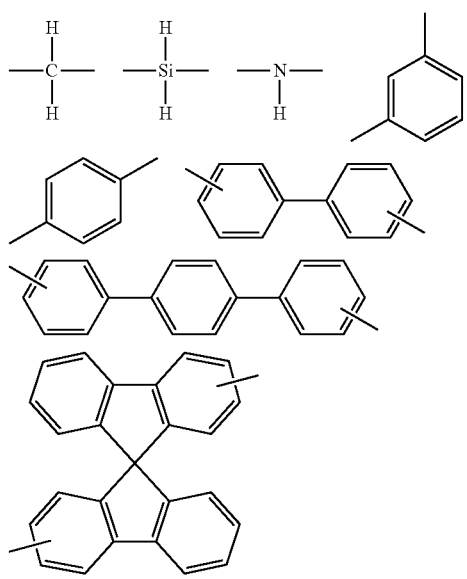

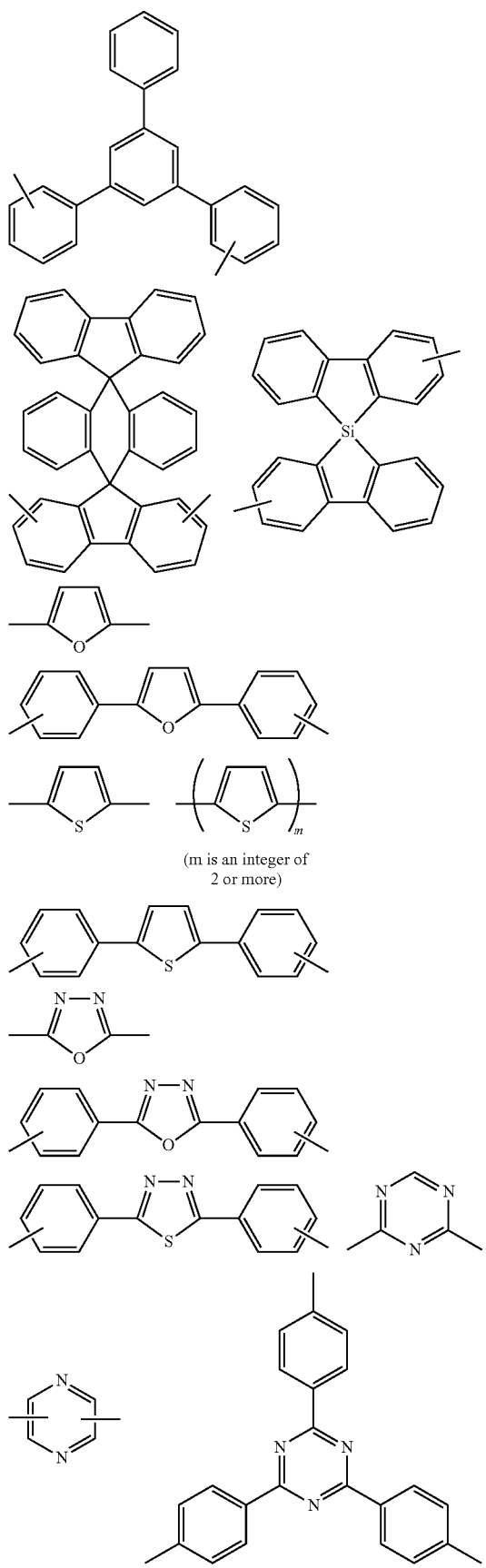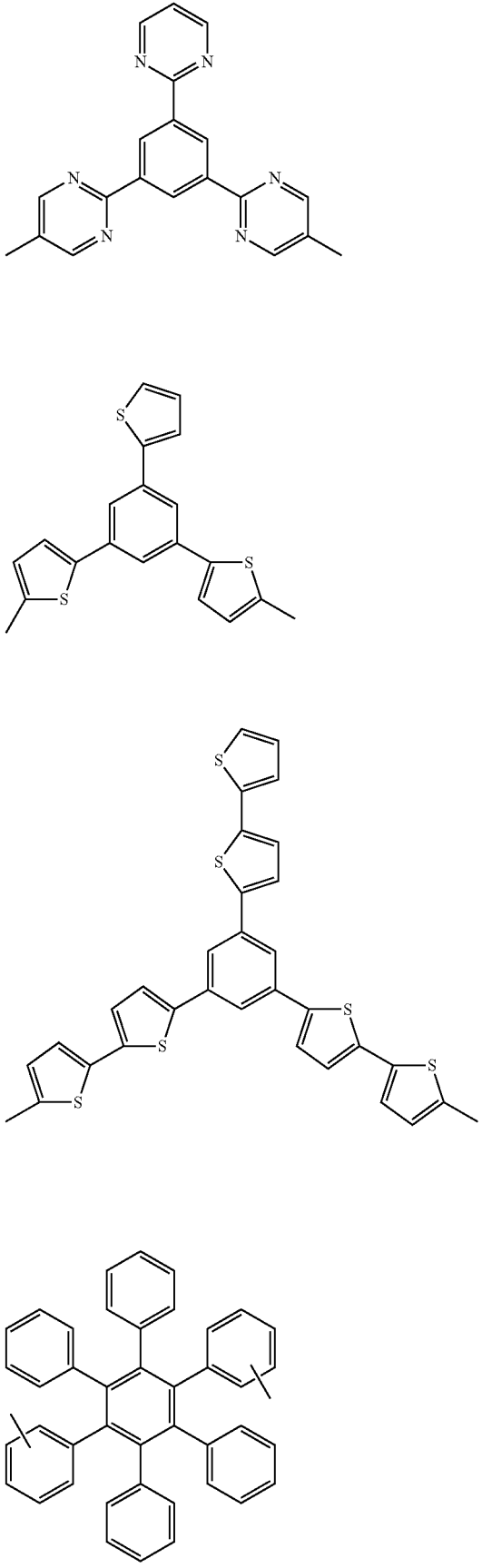

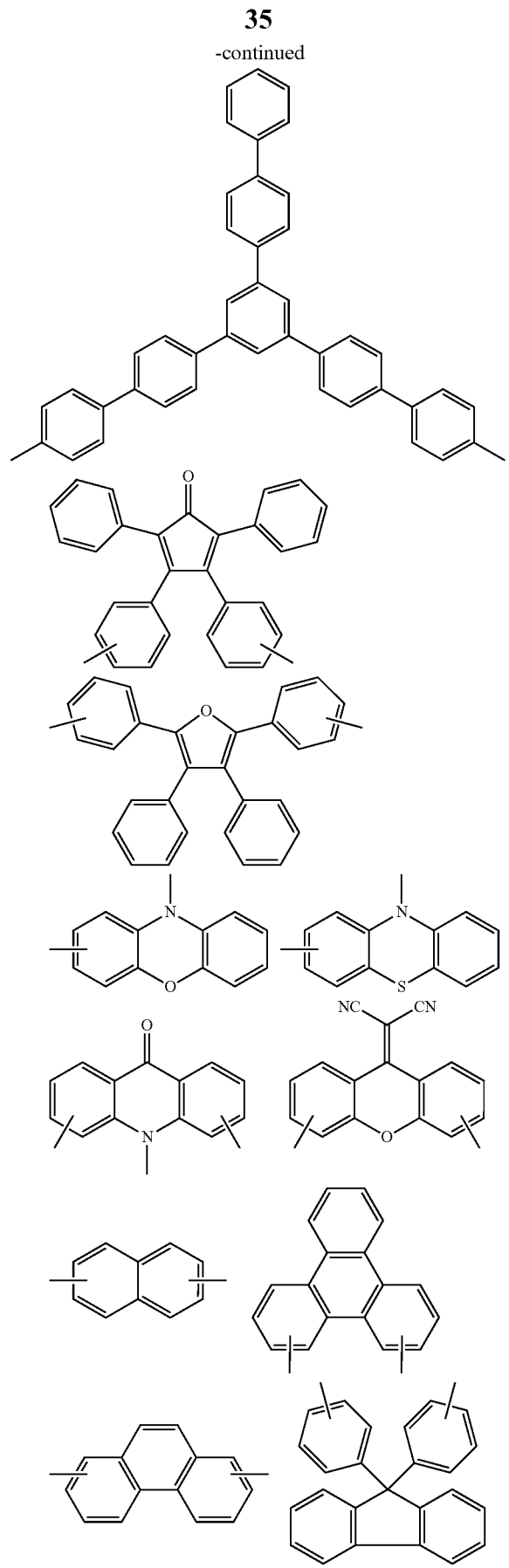

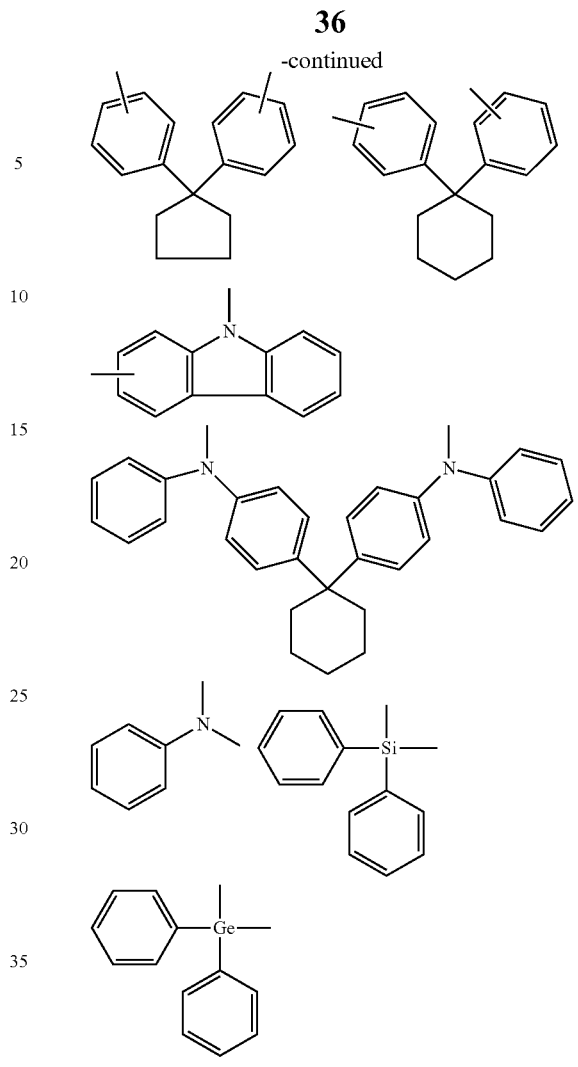

(Compounds Represented by Formula (3))

In the above-described Formula (3); each $R_1$, $R_2$ and $R_4$ independently represents a hydrogen atom, or a substituent; $L_3$ represents a bivalent linking group; $Ar_1$ represents an aromatic group, or a heterocyclic group; n1 to n3 represents an integer of 0 to 4; and m3 represents an integer of 0 or 1.

The above substituent is the same as the substituent represented by $R_1$ of a phosphorescent compound represented by the above-described Formula (A).

The bivalent linking group is the same as the bivalent linking group represented by $L_2$ of a compound represented by the above-described Formula (2).

The aromatic group and the heterocyclic group are the same as the aromatic group and the heterocyclic group represented by $R_{1a}$ of a compound represented by the above-described Formula (1).

(Compounds Represented by Formula (4))

In the above-described Formula (4); $R_{1a}$ represents a hydrogen atom, an aliphatic group, an aromatic group, or a heterocyclic group; each $R_1$ and $R_2$ represents a substituent; $L_3$ represents a bivalent linking group; $Ar_1$ represents an aromatic group, or a heterocyclic group; n1 and n2 represents an integer of 0 to 4; and m3 represents an integer of 0 or 1.

The aliphatic group, the aromatic group and the heterocyclic group are the same as the aliphatic group, the aromatic group and the heterocyclic group represented by $R_{1a}$ of a compound represented by the above-described Formula (1).

The substituent is the same as the substituent represented by $R_1$ of a phosphorescent compound represented by the above-described Formula (A).

The bivalent linking group is the same as the bivalent linking group represented by $L_2$ of a compound represented by the above-described Formula (2).

(Compounds Represented by Formula (5))

In the above-described Formula (5); $R_{1a}$ represents a hydrogen atom, an aliphatic group, an aromatic group, or a heterocyclic group; each $R_1$ and $R_2$ independently represents a hydrogen atom, or a substituent; $L_3$ represents a bivalent linking group; $Ar_1$ represents an aromatic group, or a heterocyclic group; n1 represents an integer of 0 to 4; n2 represents an integer of 0 to 3; and m3 represents an integer of 0 or 1.

The aliphatic group, the aromatic group and the heterocyclic group are the same as the aliphatic group, the aromatic group and the heterocyclic group represented by $R_{1a}$ of a compound represented by the above-described Formula (1).

The substituent is the same as the substituent represented by $R_1$ of a phosphorescent compound represented by the above-described Formula (A).

The bivalent linking group is the same as the bivalent linking group represented by $L_2$ of a compound represented by the above-described Formula (2).

(Compounds Represented by Formula (6))

In the above-described Formula (6); $R_{1a}$ represents a hydrogen atom, an aliphatic group, an aromatic group, or a heterocyclic group; each $R_1$, $R_2$ and $R_5$ independently represents a hydrogen atom or a substituent; $L_4$ represents a bivalent linking group; $Ar_1$ represents an aromatic group or a heterocyclic group; n1 and n4 represents an integer of 0 to 4; n2 represents an integer of 0 to 3; and m4 represents an integer of 0 or 1.

The aliphatic group, the aromatic group and the heterocyclic group are the same as the aliphatic group, the aromatic group and the heterocyclic group represented by $R_{1a}$ of a compound represented by the above-described Formula (1).

The substituent is the same as the substituent represented by $R_1$ of a phosphorescent compound represented by the above-described Formula (A).

The bivalent linking group is the same as the bivalent linking group represented by $L_2$ of a compound represented by the above-described Formula (2).

(Compounds Represented by Formula (7))

In the above-described Formula (7), each $R_1$, $R_2$, and Ra independently represent a hydrogen atom or a substituent, each n1, n2 and na represents an integer of 0 to 4, and X represents NRb, S, or O, Substituents represented by $R_1$, $R_2$ or Ra are the same as those represented by $R_1$ of the phosphorescent compounds represented by the above-described Formula (A).

The above-described Rb represents a hydrogen atom, an aliphatic group, an aromatic group, or a heterocyclic group, and is the same as an aliphatic group, an aromatic group, or a heterocyclic group represented by $R_{1a}$ in the above-described Formula (1).

$Ar_1$ in Formulae (3) to (6) is preferably a carbazolyl group.

Specific examples of a host compound represented by Formulae (1) to (6) are listed below, but are not limited to them.

H-1

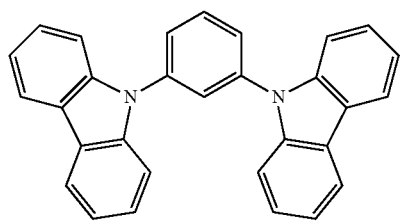

H-2

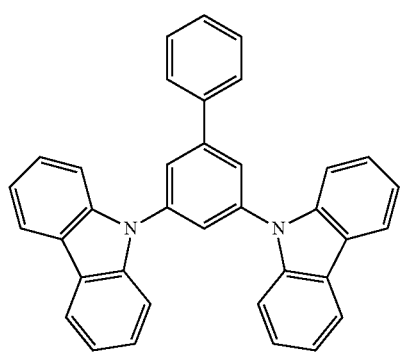

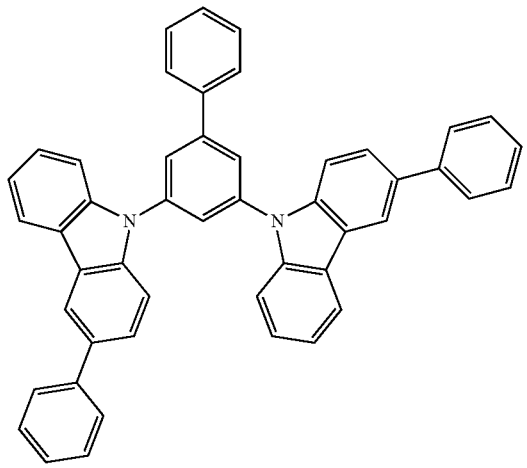
H-3
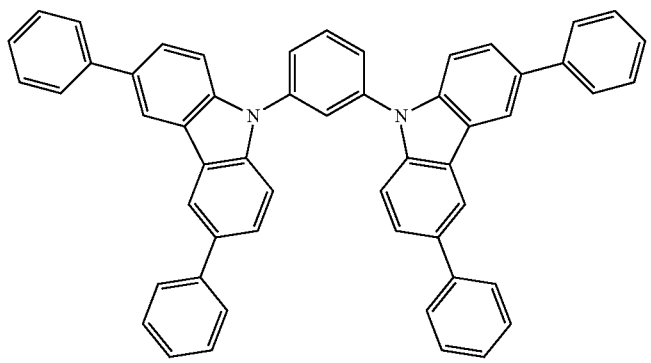
H-4
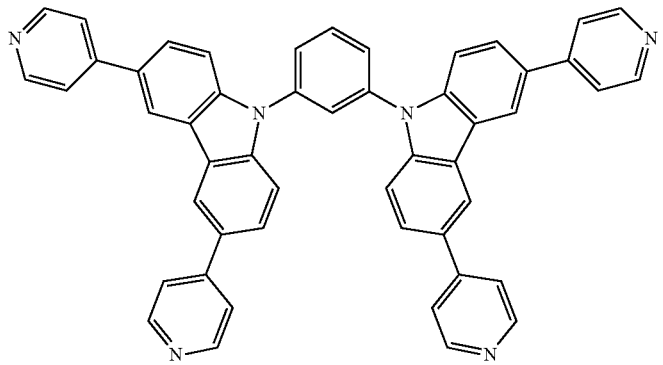
H-5
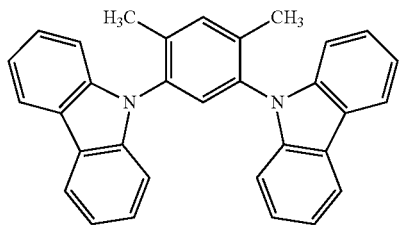
H-6

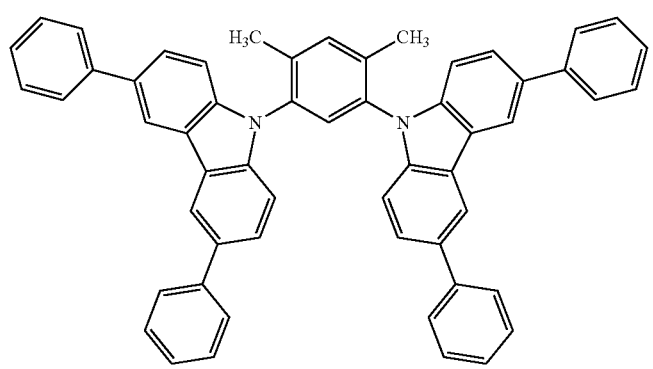
H-7
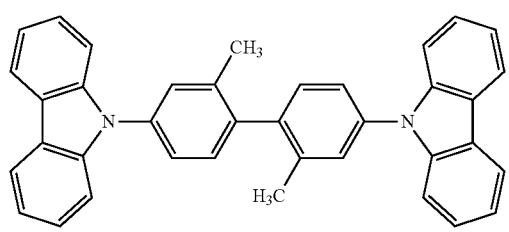
H-8
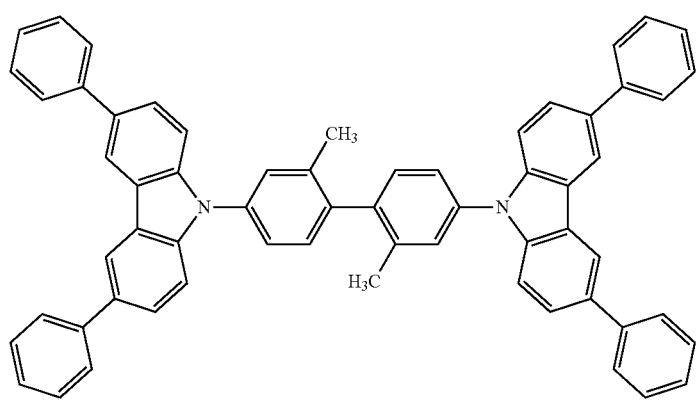
H-9
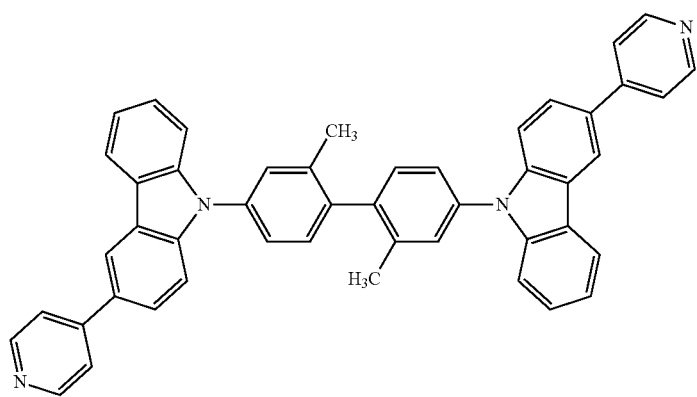
H-10

-continued
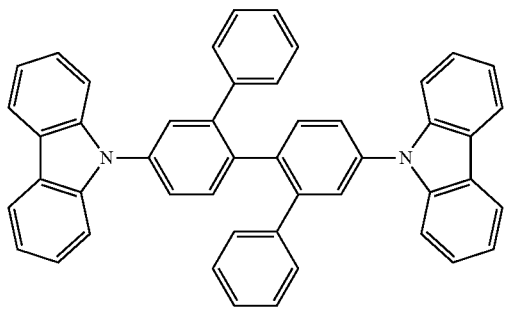
H-11
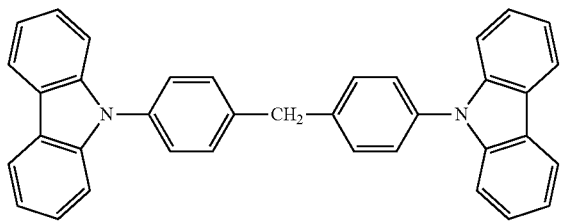
H-12
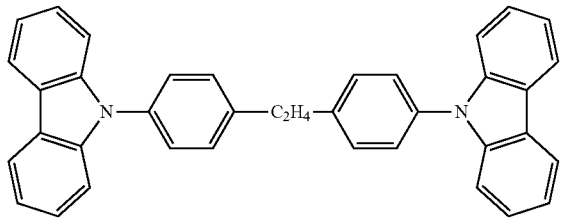
H-13
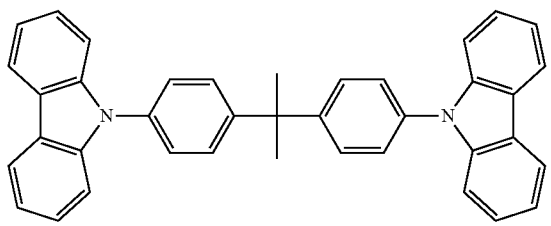
H-14
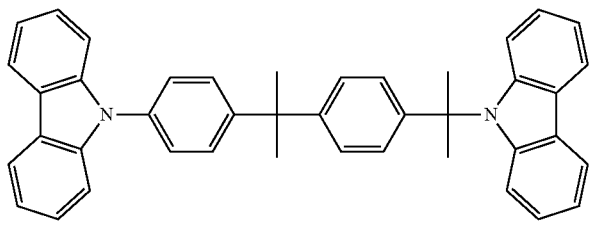
H-15
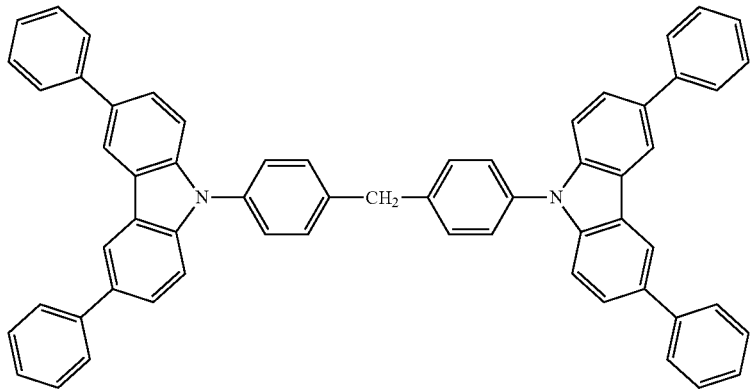
H-16

H-17
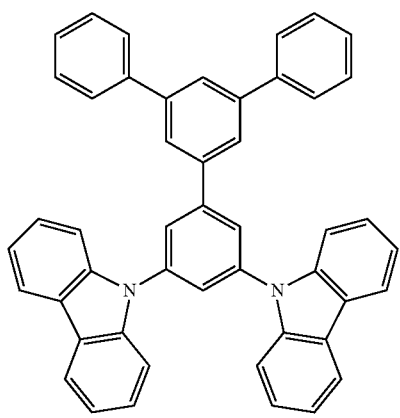
H-18
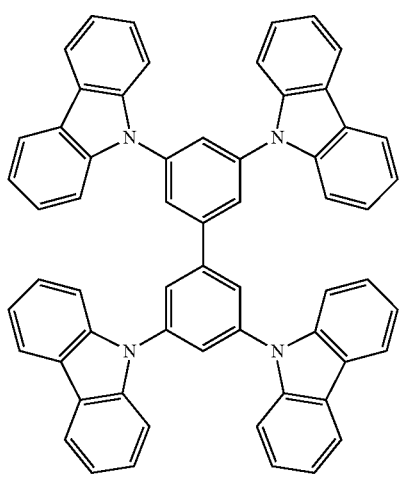
H-19
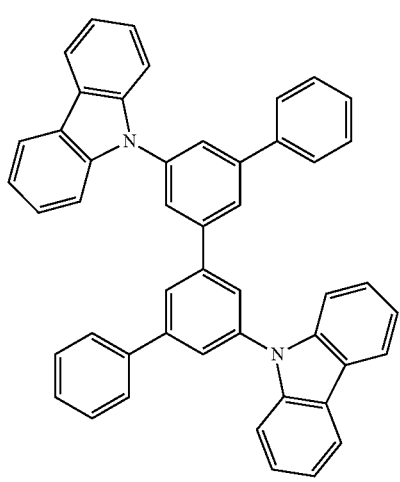

H-20
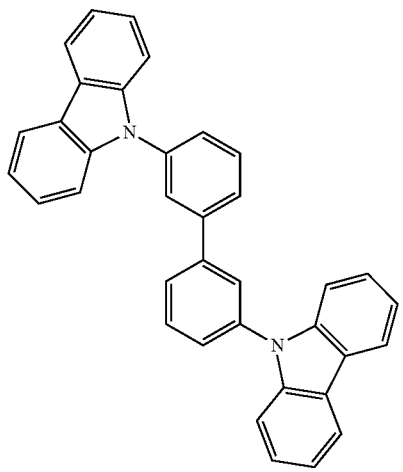
H-21
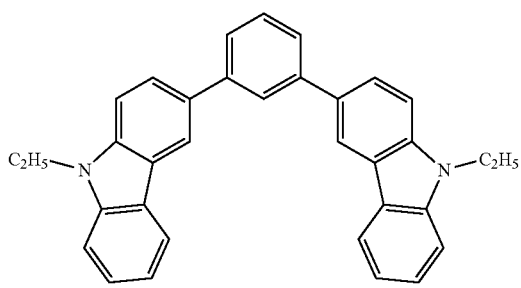
H-22
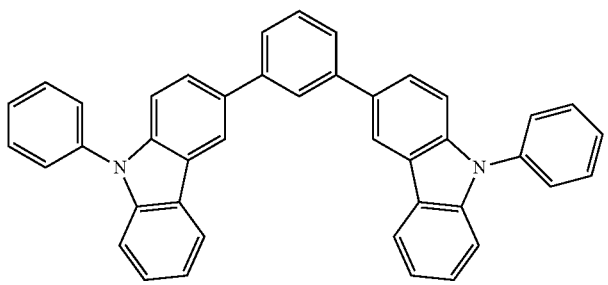
H-23
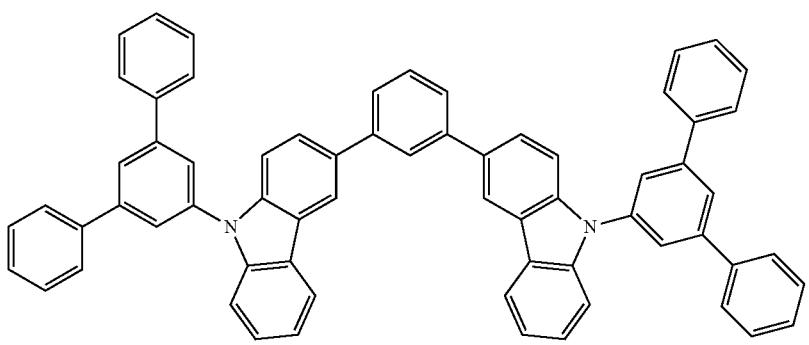

H-24
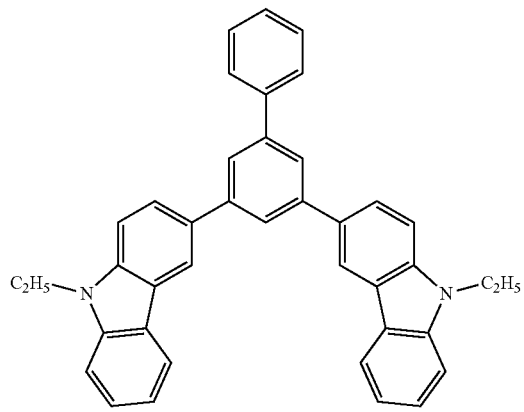
H-25
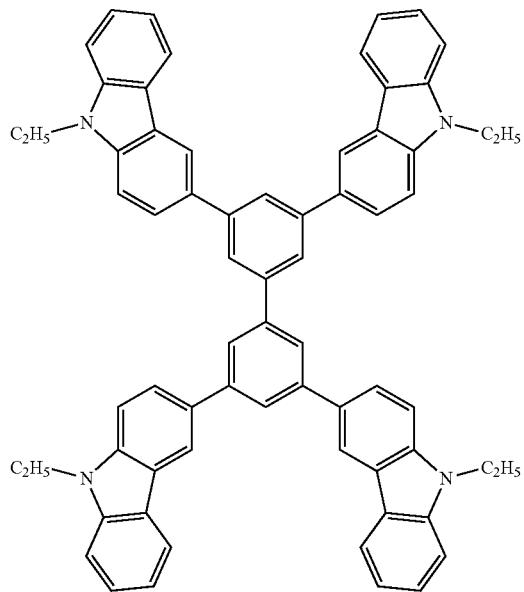
H-26
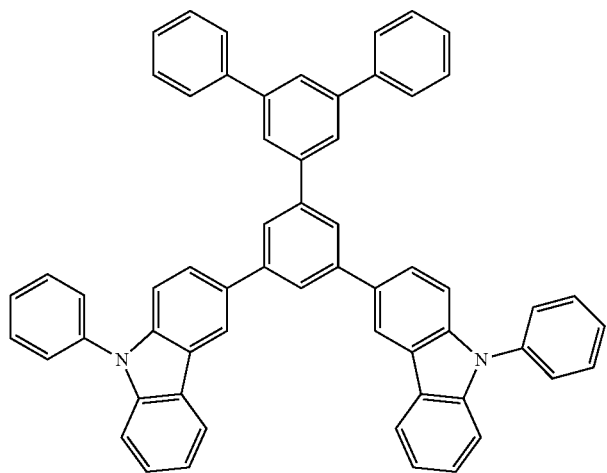

H-27
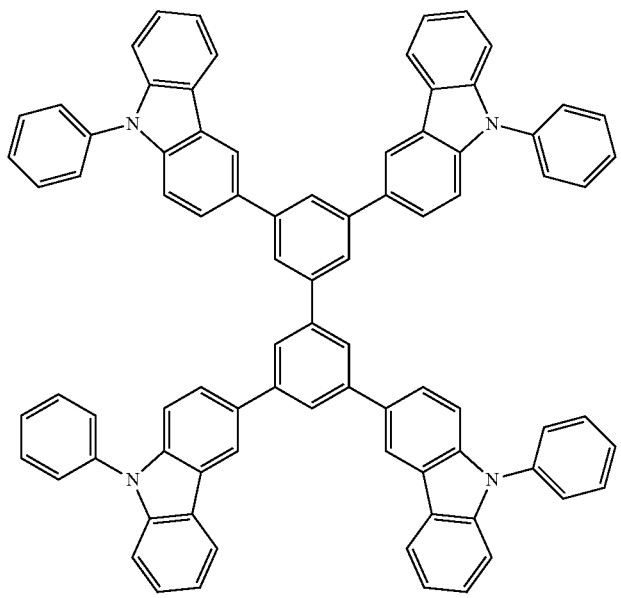
H-28
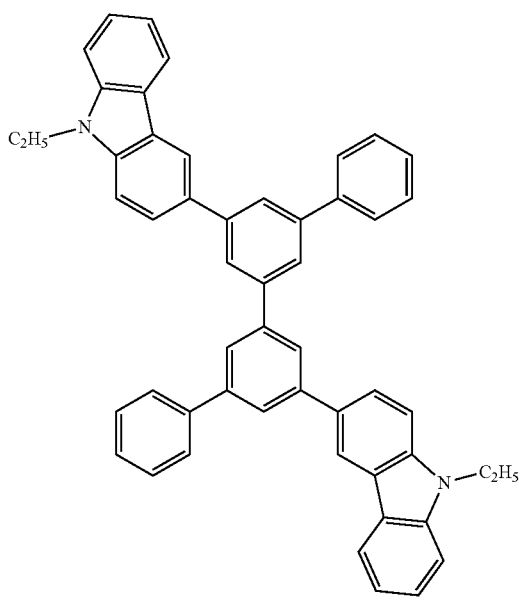

H-29
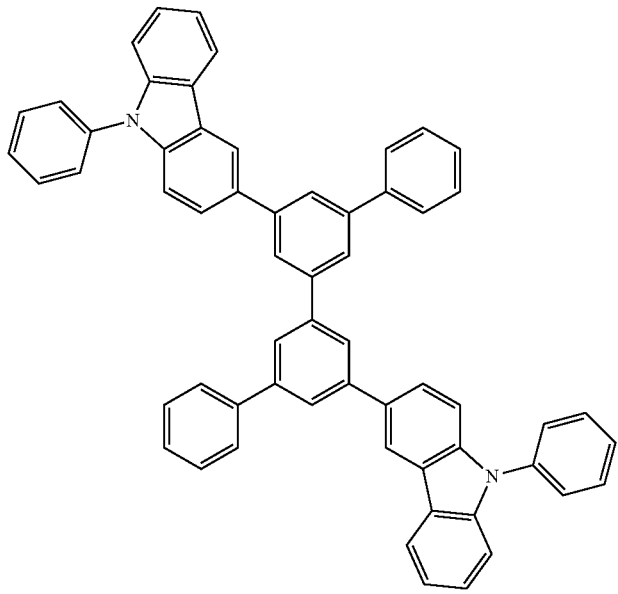
H-30
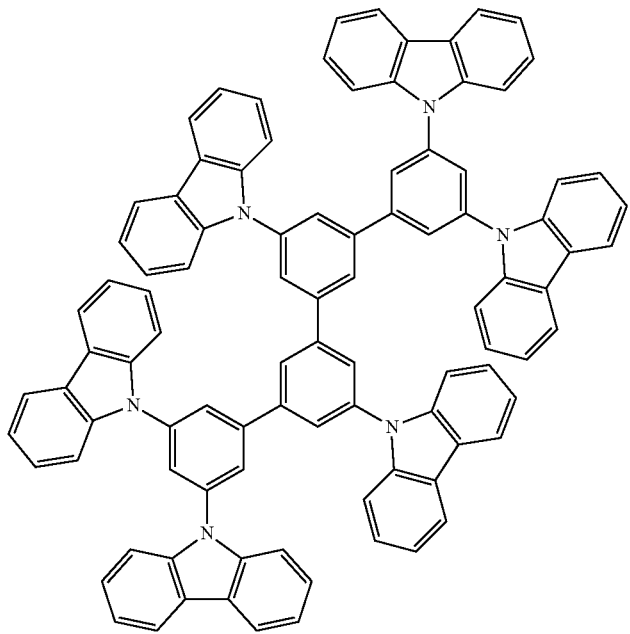

H-31
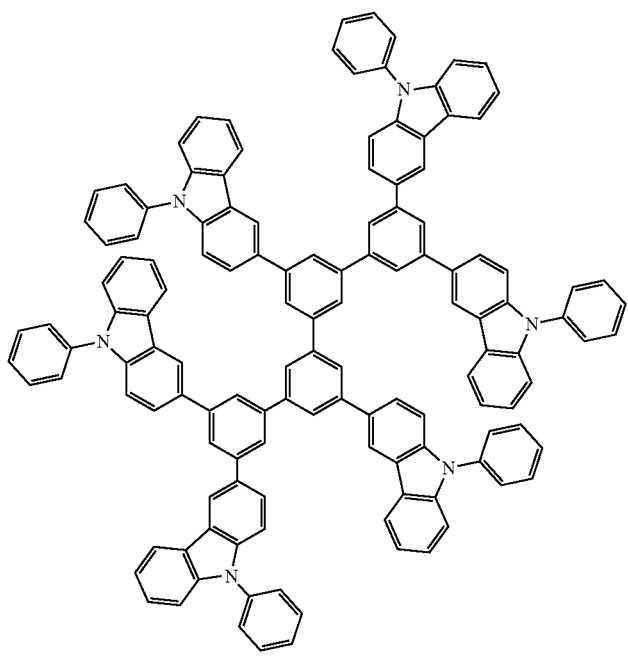
H-32
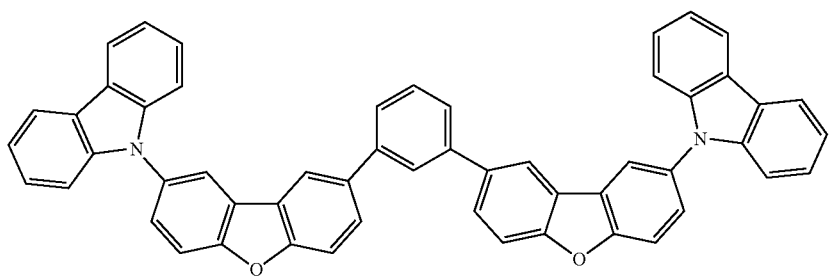
H-33
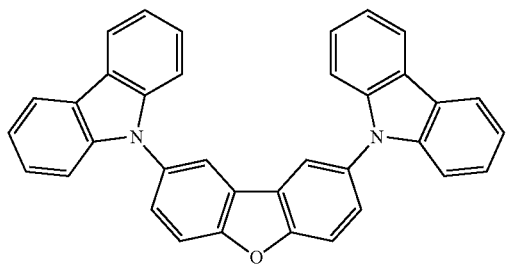
H-34
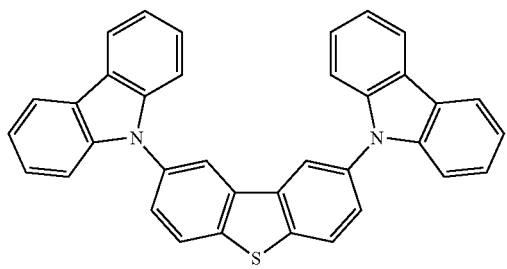

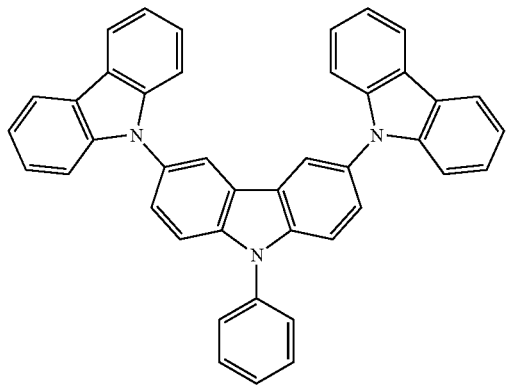

H-35

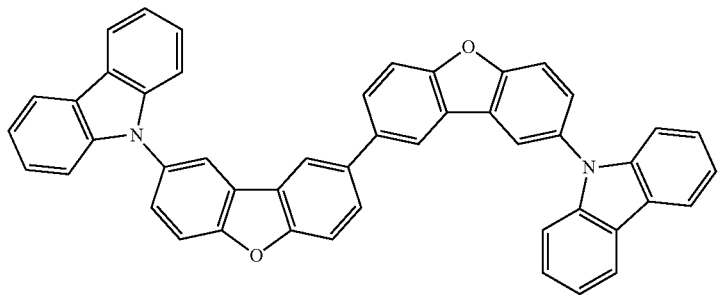

H-36

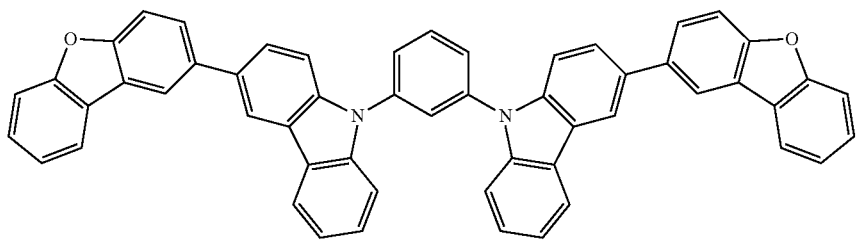

H-37

The compounds listed above can be synthesized in accordance with commonly known methods in this field.

(Light-Emitting Host and Light-Emitting Dopant)

In the organic EL element of the present invention, the light-emitting layer incorporates a light-emitting host and a light-emitting dopant. It is preferable that the mixing ratio of the light-emitting dopant to the light-emitting host which is a main constituent in the light-emitting layer is controlled in the range of 0.1 to less than 30% by weight.

However, the light-emitting dopant may use a plurality of compounds in mixture, and the compound to be mixed may be other metal complexes having a different structure, or a phosphorescent dopant or a fluorescent dopant having other structures.

Dopants (such as a phosphorescent dopant or a fluorescent dopant), which may be used in combination with a metal complex employed as a light-emitting dopant, will now be explained.

(Light-Emitting Dopant)

The light-emitting dopant is roughly classified into two types: a fluorescent dopant which emits fluorescence and a phosphorescent dopant which emits phosphorescence.

Representative examples of the former (a fluorescent dopant) include a coumarin dye, a pyran dye, a cyanine dye, a chloconium dye, a squarium dye, an oxobenzanthracene dye, a fluorescein dye, a rhodamine dye, a pyrylium dye, a perylene dye, a stilbene dye, a polythiophene dye, and a rare earth complex fluorescent material.

Representative examples of the latter (a phosphorescent dopant) are preferably a complex compound incorporating a metal of Groups 8, 9 and 10 of the Periodic Table of the Elements, and more preferably are an iridium, a platinum compound, a ruthenium compound, and a rhodium compound, of which an iridium compound, and a platinum compound are more preferred.

A phosphorescent dopant (also referred to as a phosphorescent compound or a phosphorescence emission compound) employed in the present invention exhibits light emission from an excited triplet. Further, the aforesaid phosphorescent dopant preferably has a phosphorescence quantum yield of not less than 0.001 at 25° C., more preferably of not less than 0.01, and particularly preferably of not less than 0.1.

The above-described phosphorescence quantum yield can be determined according to a method described in the fourth edition, Jikken Kagaku Koza 7, Bunko II, p. 398 (1992) published by Maruzen. The phosphorescence quantum yield in a solution can be determined employing various kinds of solvents. The aforesaid phosphorescent dopant is acceptable when the above-described phosphorescence quantum yield is achieved in any one or more of the solvents.

A compound represented by Formula (A) of the present invention is employed as a phosphorescent dopant.

As a phosphorescent dopant other than a compound represented by Formula (A), compounds described in the Patent Documents below are usable.

Such references are as follows: WO 00/70655, JP-A Nos. 2002-280178, 2001-181616, 2002-280179, 2001-181617, 2002-280180, 2001-247859, 2002-299060, 2001-313178, 2002-302671, 2001-345183 and 2002-324679, WO 02/15645, JP-A Nos. 2002-332291, 2002-50484, 2002-332292 and 2002-83684, Japanese Translation of PCT International Application Publication No. 2002-540572, JP-A Nos. 2002-117978, 2002-338588, 2002-170684 and 2002-352960, WO 01/93642 pamphlet, JP-A Nos. 2002-50483, 2002-100476, 2002-173674, 2002-359082, 2002-175884, 2002-363552, 2002-184582 and 2003-7469, Japanese Translation of PCT International Application Publication No. 2002-525808, JP-A 2003-7471, Japanese Translation of PCT International Application Publication No. 2002-525833, JP-A Nos. 2003-31366, 2002-226495, 2002-234894, 2002-235076, 2002-241751, 2001-319779, 2001-319780, 2002-62824, 2002-100474, 2002-203679, 2002-343572 and 2002-203678.

A part of the specific examples are shown below.

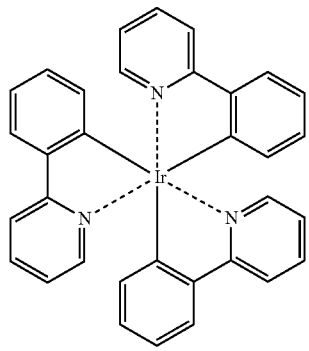

Ir-1

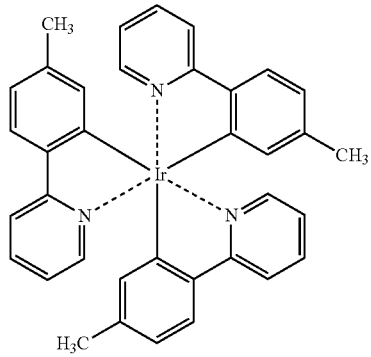

Ir-2

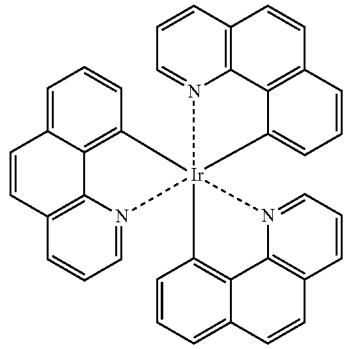

Ir-3

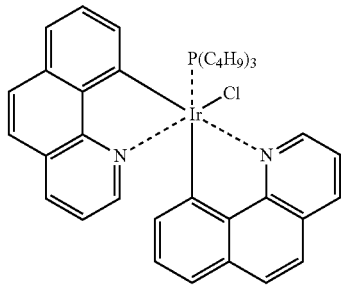

Ir-4

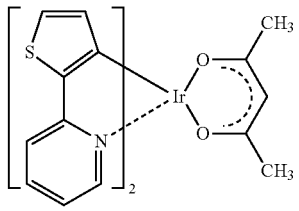

Ir-5

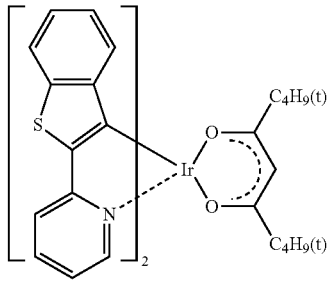

Ir-6

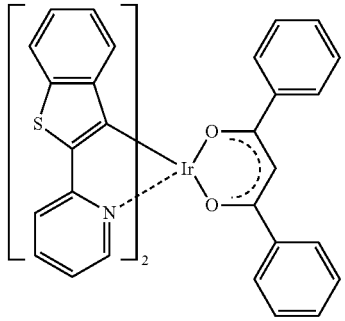

Ir-7

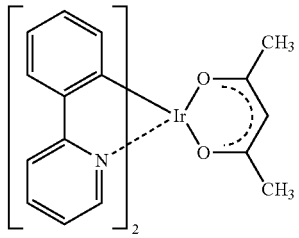

Ir-8

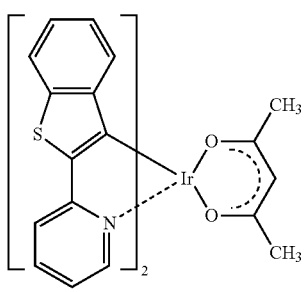
Ir-9
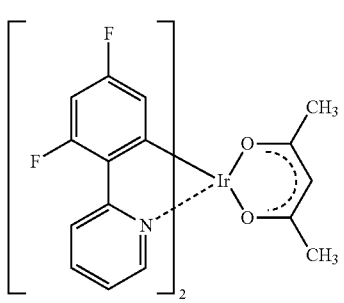
Ir-10
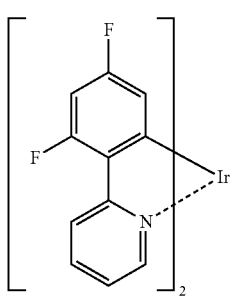
Ir-11
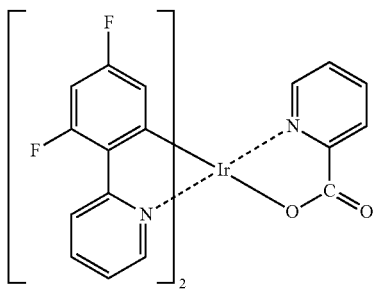
Ir-12
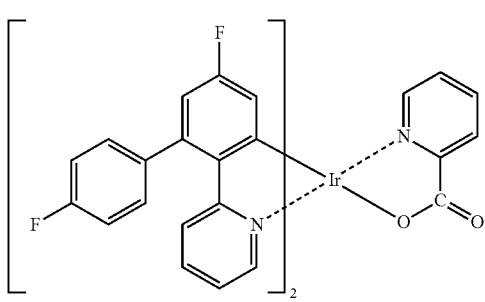
Ir-13
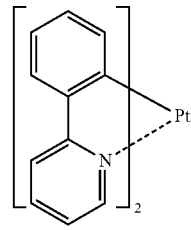
Pt-1
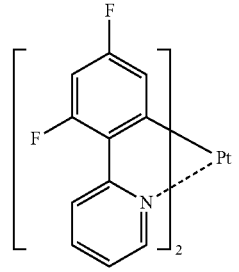
Pt-2
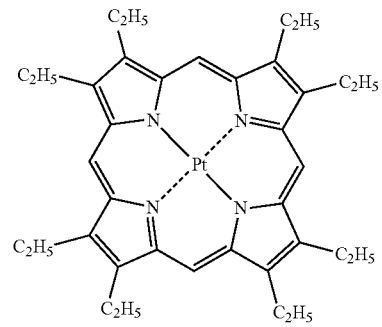
Pt-3
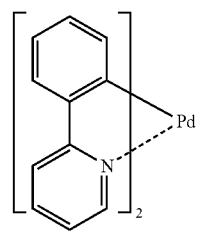
Pd-1
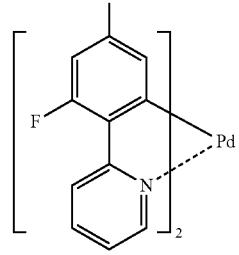
Pd-2
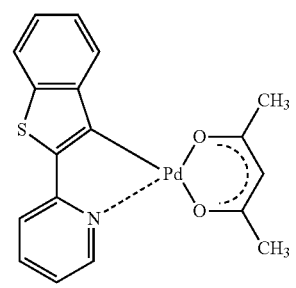
Pd-3

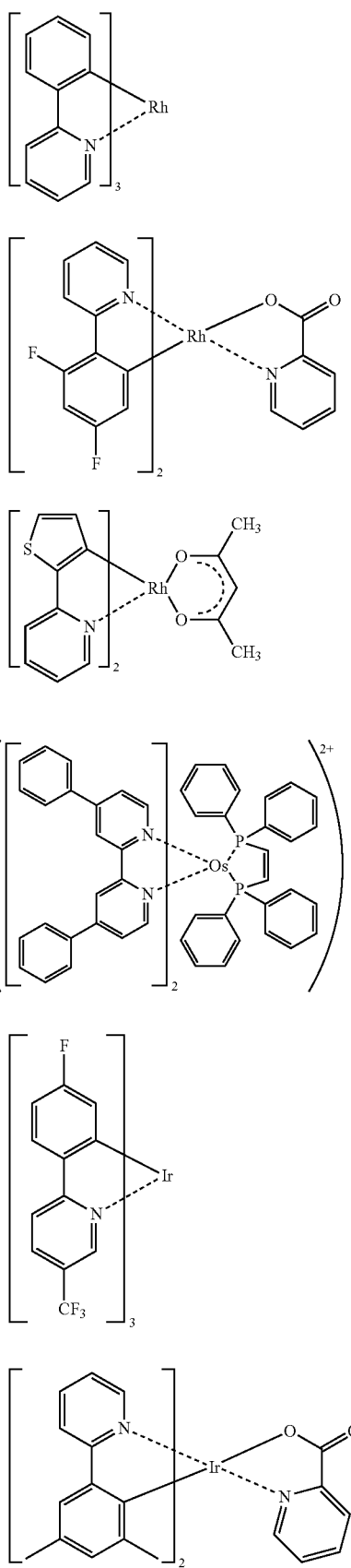
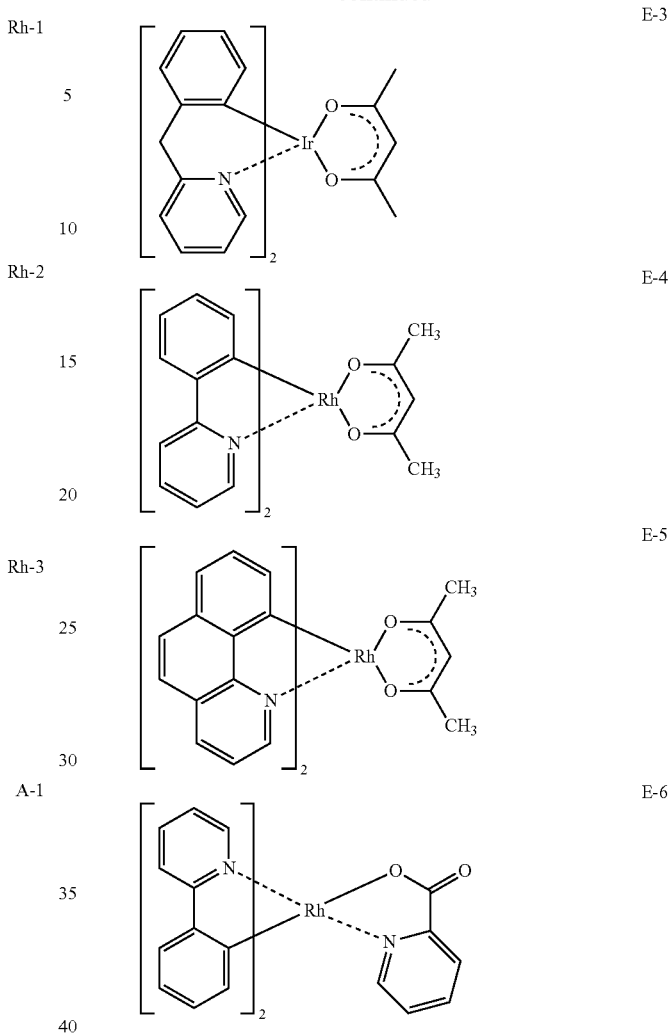

(Light-Emitting Host)

A host compound, employed in the light-emitting layer of the present invention, is characterized in that the phosphorescent 0-0 band is not more than 460 nm as stated before, and the glass transition point is not less than 60° c.

The host compound, employed in the present invention, is a compound among those incorporated in a light-emitting layer, which exhibits a phosphorescence quantum yield of phosphorescent emission of less than 0.01 at a room temperature (25° C.).

The light-emitting host employed in the present invention is preferably a compound exhibiting a phosphorescence 0-0 band of a wavelength shorter than that of a light-emitting dopant which is employed in combination. In a case where the light-emitting dopant, incorporating a blue light-emitting component exhibiting a phosphorescence 0-0 band of not more than 470 nm, is employed, the light-emitting host preferably exhibits a phosphorescence 0-0 band of not more than 460 nm.

The above-described host compound, employed in the present invention, is preferably a compound represented by the above Formulae (1) to (6).

Further, the light-emitting host, employed in the present invention, is not particularly limited by its chemical structure as long as the phosphorescent 0-0 band is not more than 460 nm as stated before, and the glass transition point is not less than 60° C., and may be a low molecular weight compound or a high molecular weight compound having a repeating unit, and may further be a low molecular weight compound having a polymerizable group such as a vinyl group and an epoxy group (an vapor-deposition polymerizable light-emitting host). Among those hosts, preferable are compounds having hole transporting capability and electron transporting capability, while preventing elongation of the emission wavelength, and further having a higher Tg (a glass transition temperature).

Representative light-emitting hosts of the present invention include; compounds having the basic skeletons such as a carbazole derivative, a triarylamine derivative, an aromatic borane derivative, a nitrogen-containing heterocyclic compound, a thiophene derivative, a furan derivative, and an oligoarylene compound; or derivatives having a ring structure in which at least one of carbon atoms of a hydrocarbon ring, which constitutes a carboline derivative or a carboline ring of the aforesaid carboline derivative, is substituted with a nitrogen atom.

Specific examples of the light-emitting host include, but are not limited to, compounds described in the following Patent Documents; JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837.

Next, representative structures of organic EL elements will be described.

<Constituent Layers of Organic EL Element>

Typical constitutions of an organic EL element of the present invention will be described. Specific examples of a preferable layer constitution of an organic EL element of this invention are shown below; however, the present invention is not limited thereto.

(i) anode/positive hole transport layer/emission layer/positive hole inhibition layer/electron transport layer/cathode,
(ii) anode/positive hole transport layer/electron inhibition layer/emission layer/positive hole inhibition layer/electron transport layer/cathode,
(iii) anode/positive hole transport layer/electron inhibition layer/emission layer/positive hole inhibition layer/electron transport layer/cathode,
(iv) anode/anode buffer layer/positive hole transport layer/electron inhibition layer/interlayer/emission layer/positive hole inhibition layer/electron transport layer/cathode,
(v) anode/positive hole transport layer/electron inhibition layer/emission layer/positive hole inhibition layer/electron transport layer/cathode buffer layer/cathode, <Inhibition Layer (Electron Inhibition Layer, Positive Hole Inhibition Layer)>

An inhibition layer (such as an electron inhibition layer, a positive hole inhibition layer) according to this invention will now be explained.

The layer thickness of an inhibition layer according to this invention is preferably 3-100 nm and more preferably 5-30 nm.

<Positive Hole Inhibition Layer>

A positive hole inhibition layer, in a broad meaning, is provided with a function of electron transport layer, being comprised of a material having a function of transporting an electron but a very small ability of transporting a positive hole, and can improve the recombination probability of an electron and a positive hole by inhibiting a positive hole while transporting an electron.

As a positive hole inhibition layer, for example, a positive inhibition layer described in such as JP-A Nos. 11-204258 and 11-204359 and p. 237 of "Organic EL Elements and Idustrialization Front Thereof (Nov. 30 (1998), published by N. T. S Corp.)" is applicable to a positive hole inhibition (hole block) layer according to this invention. Further, a constitution of an electron transport layer described later can be appropriately utilized as a positive hole inhibition layer according to this invention.

Specific examples are cited below, but the present invention is not limited to them.

1

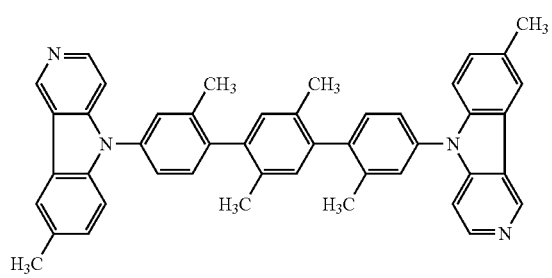

2

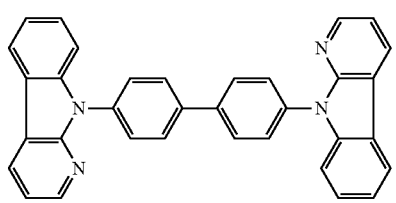

3

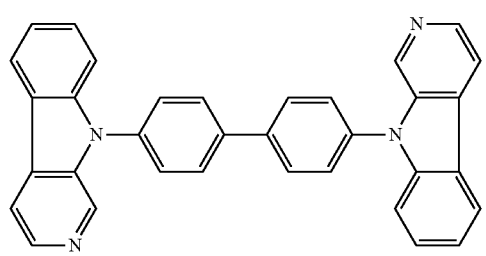

4

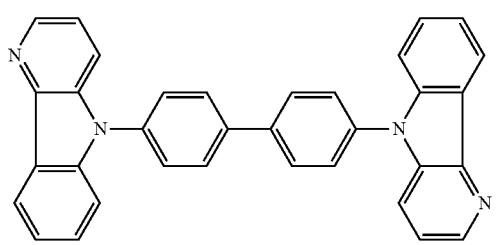

-continued
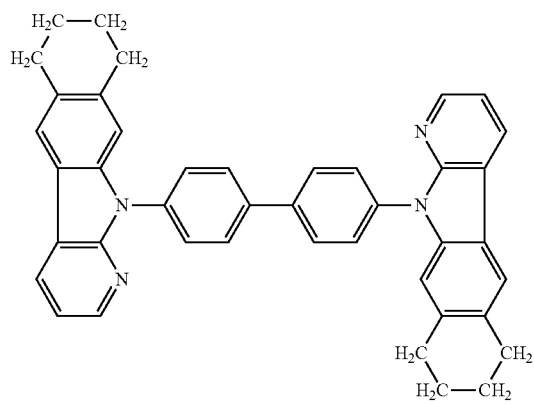
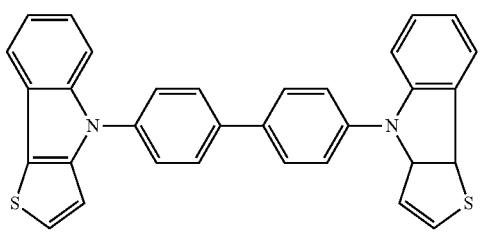
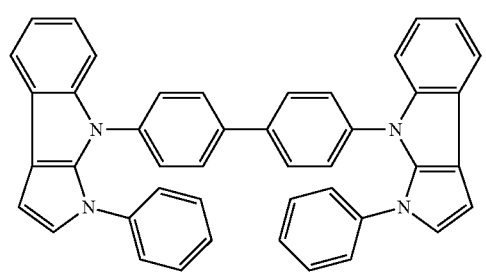
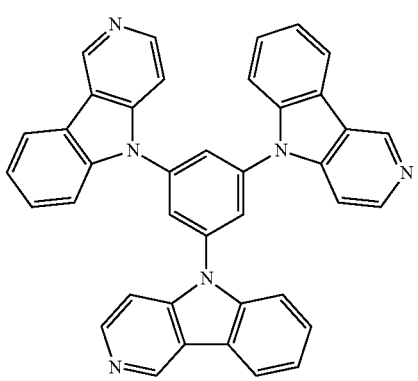
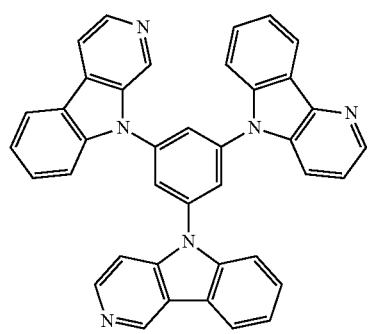
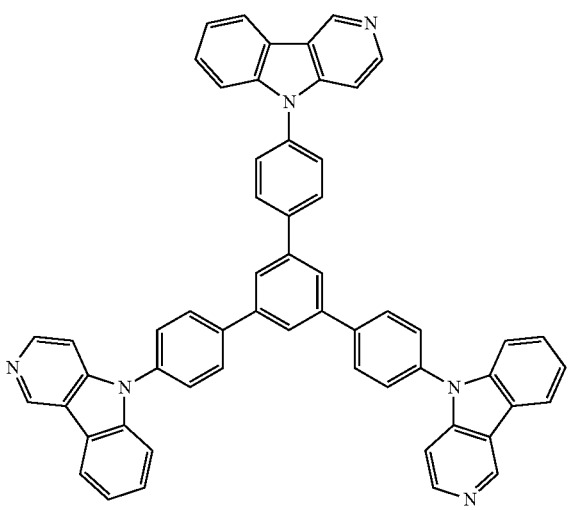

-continued
11
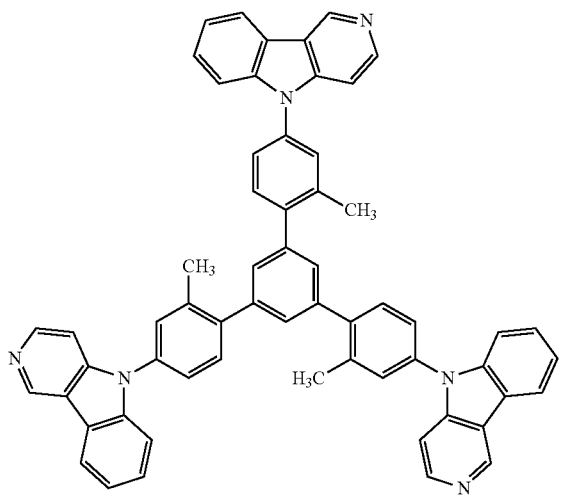
12
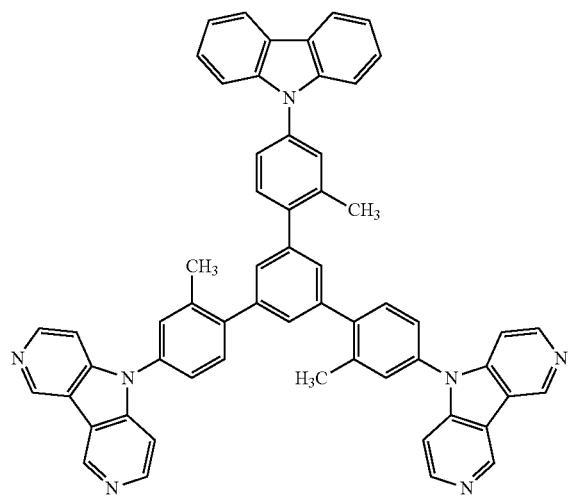
13
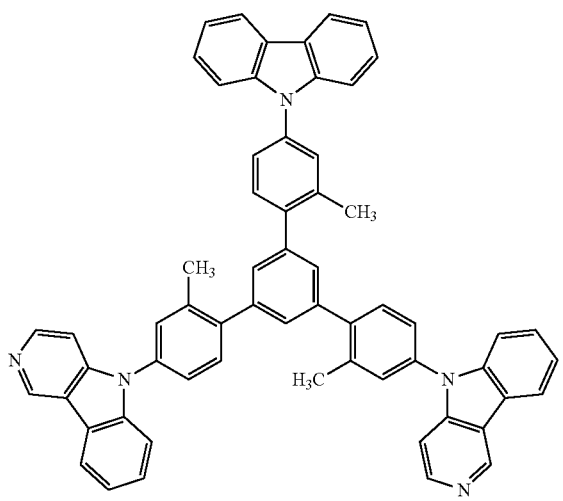
14
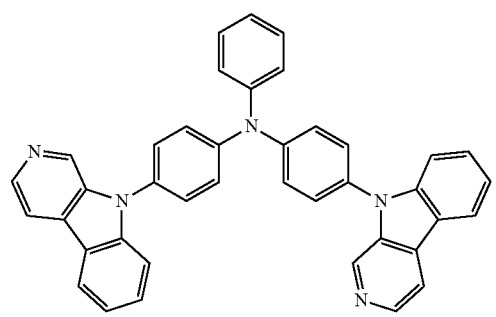
15
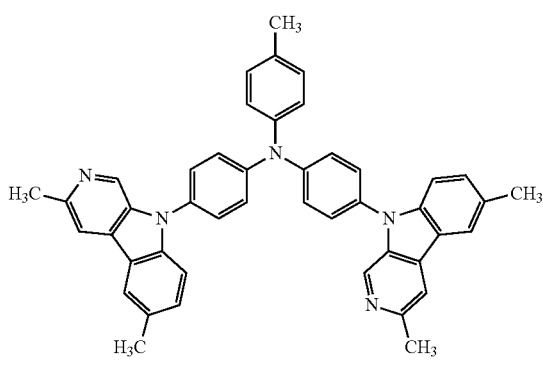
16
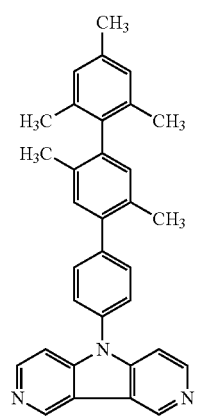

-continued
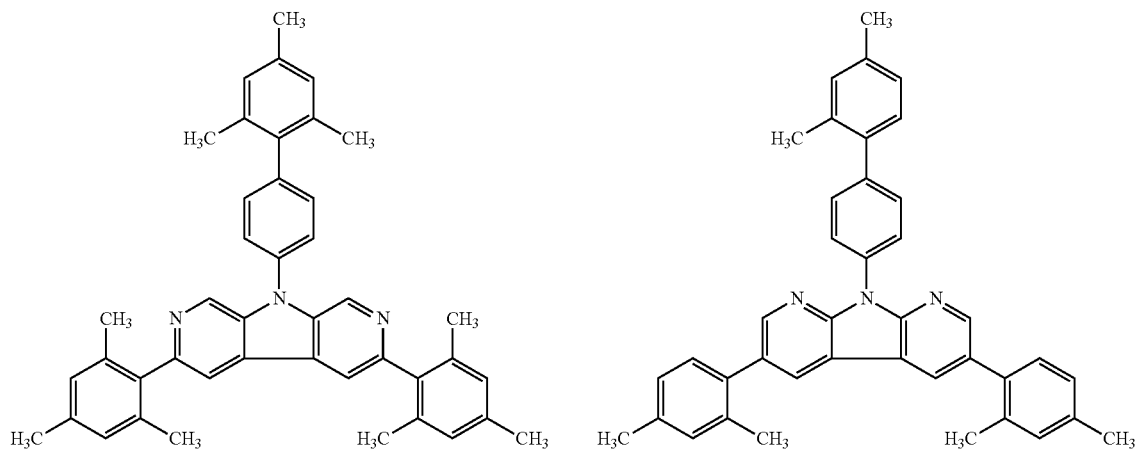
17
18
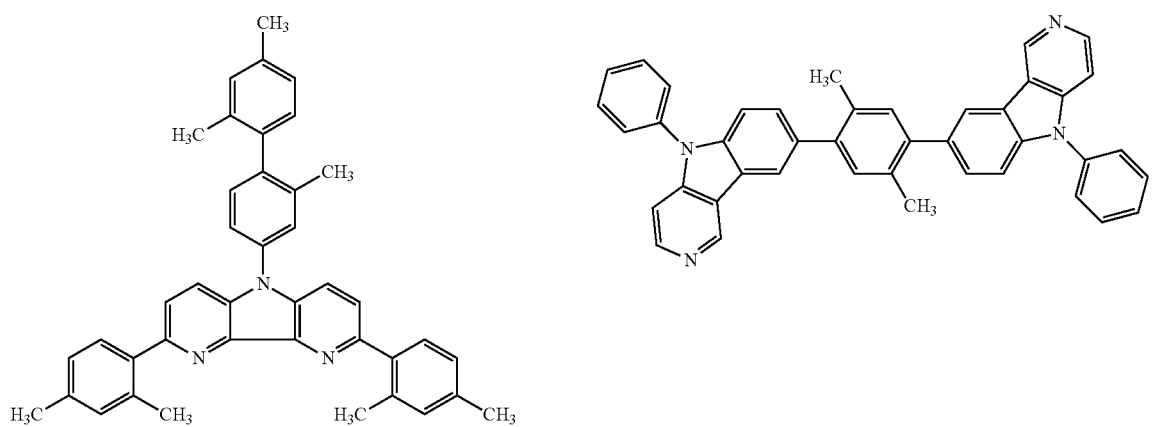
19
20
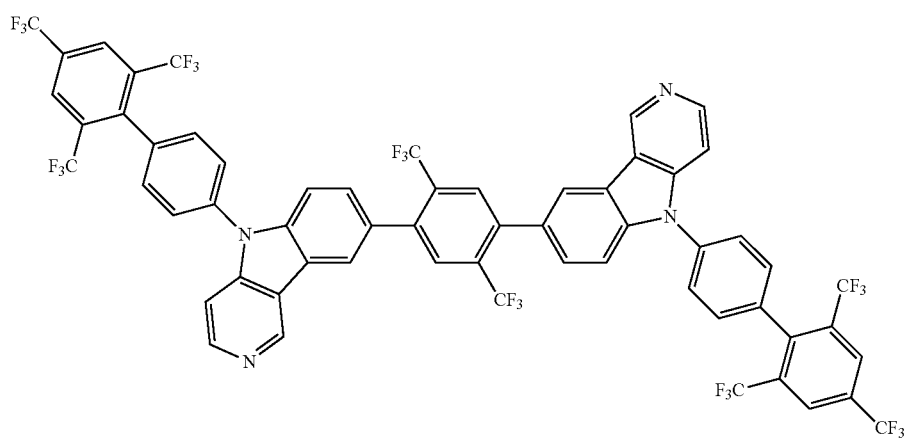
21
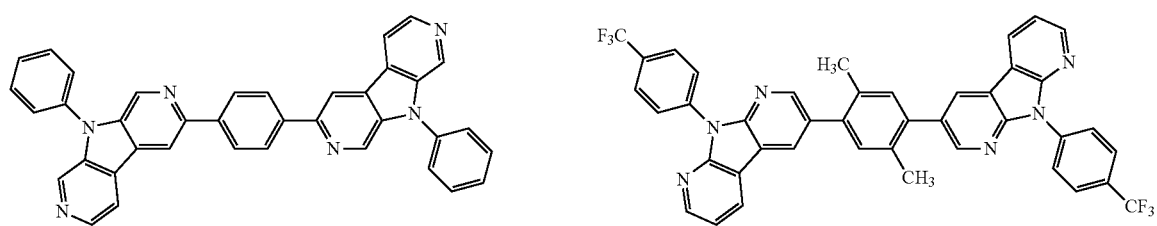
22
23

-continued
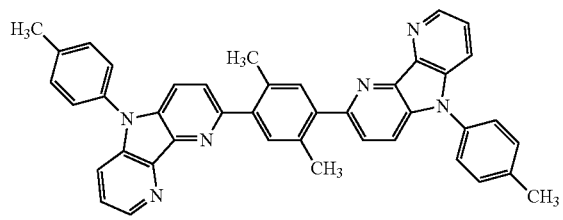
24
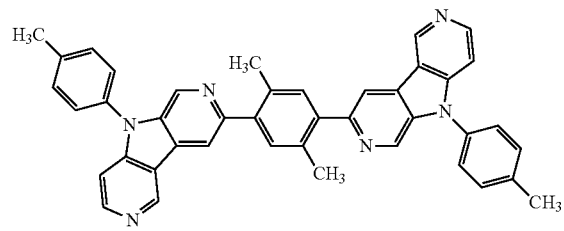
25
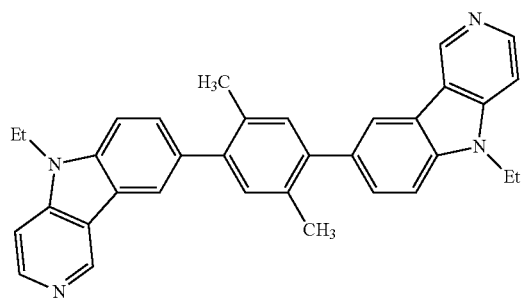
26
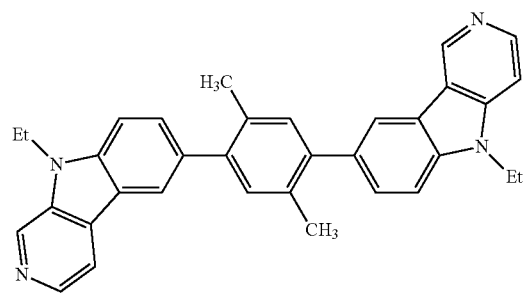
27
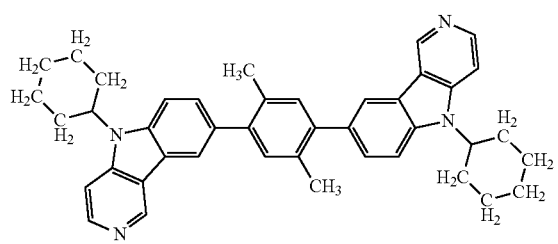
28
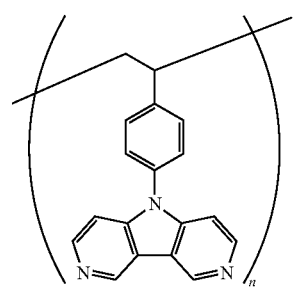
29
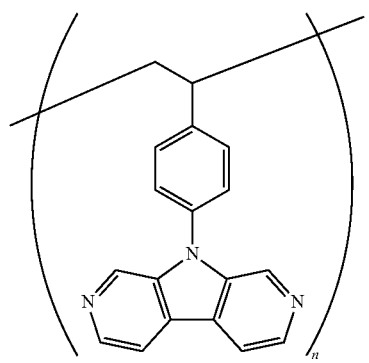
30
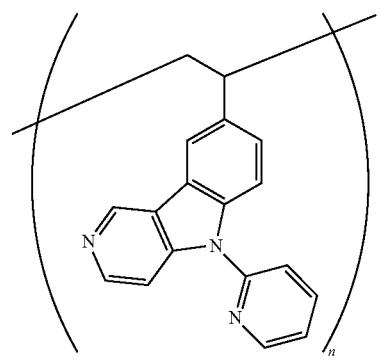
31
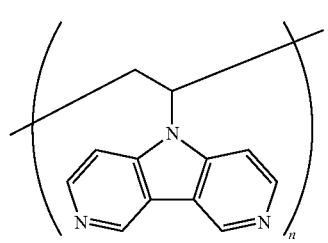
32
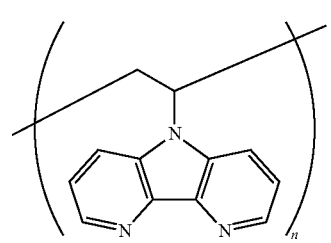
33

-continued
34
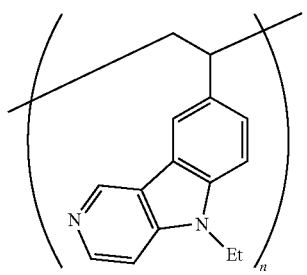
35
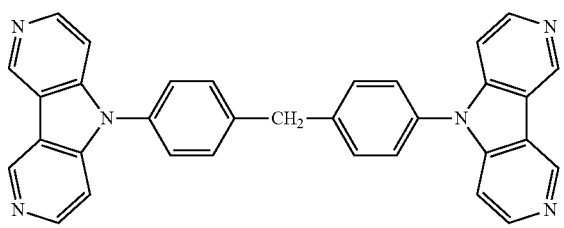
36
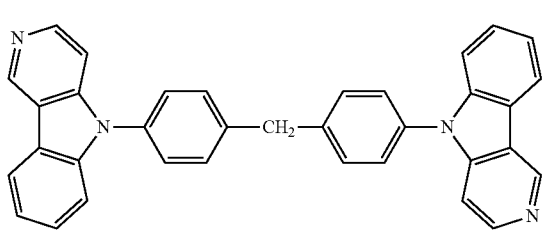
37
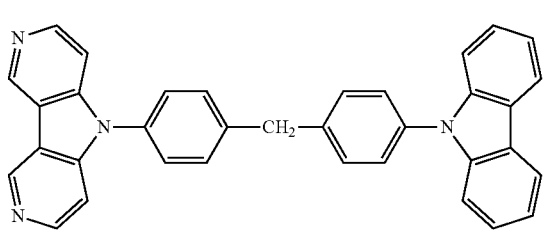
38
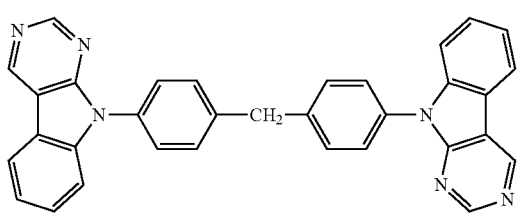
39
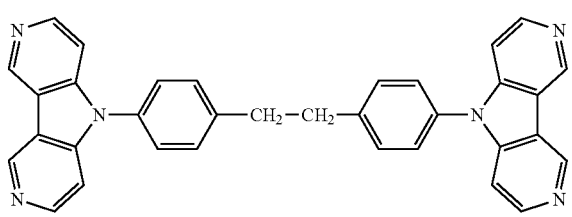
40
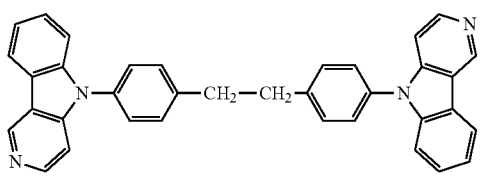
41
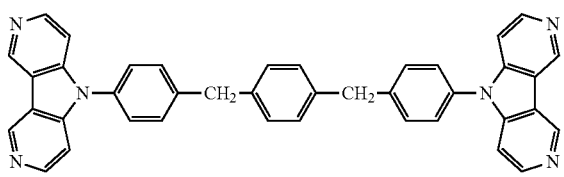
42
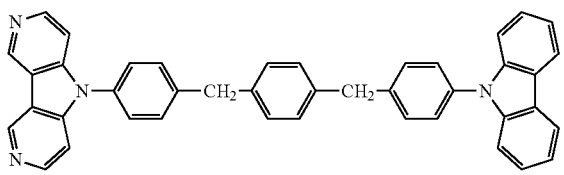
43
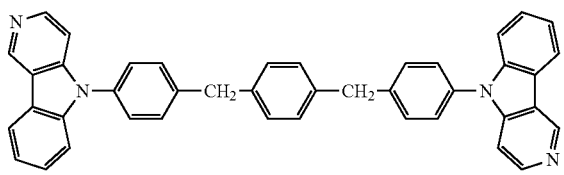
44
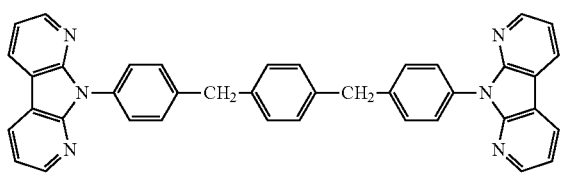
45
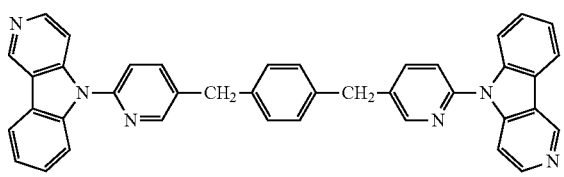
46
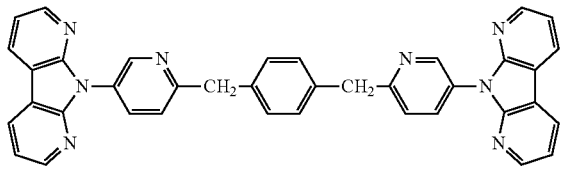
47
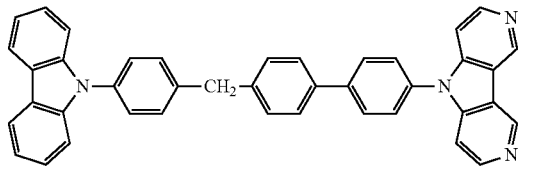

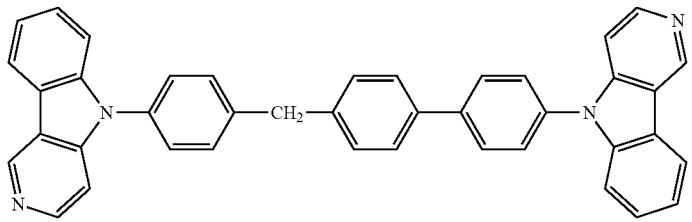
48
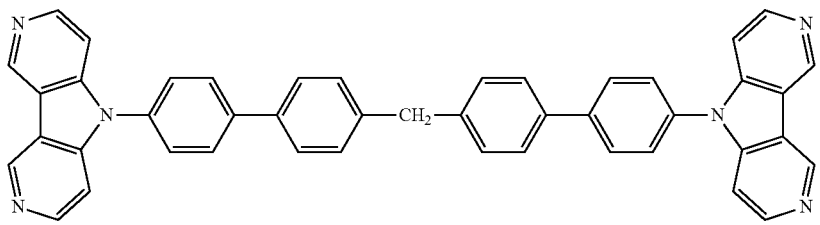
49
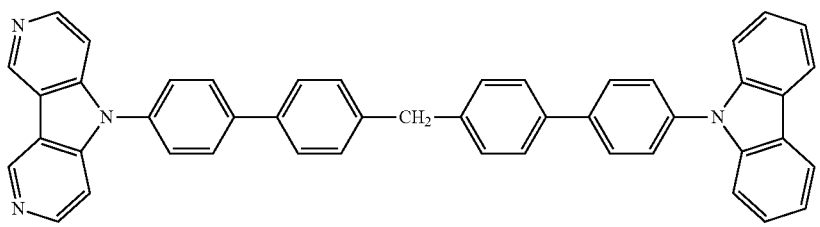
50
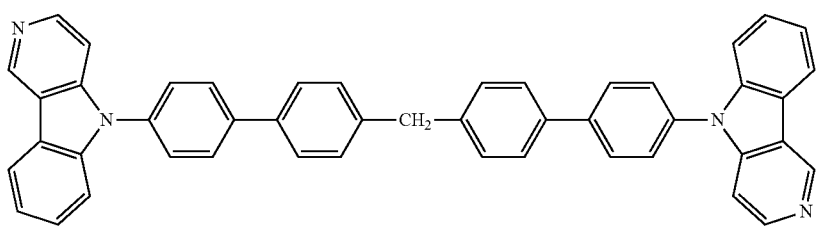
51
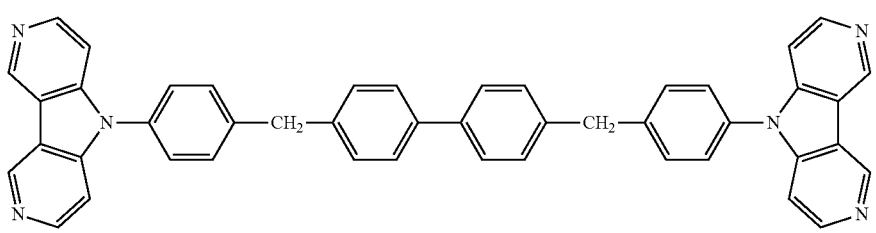
52
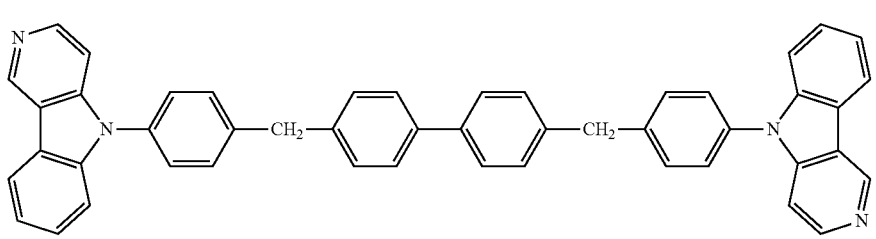
53
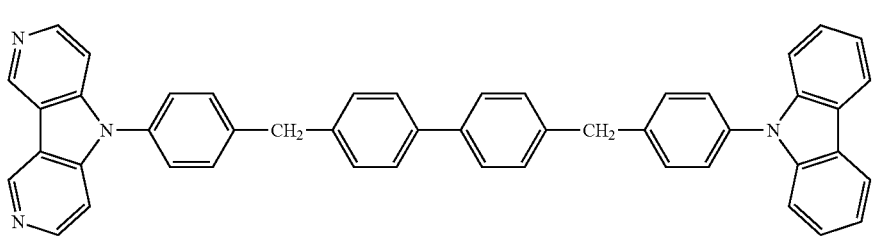
54

-continued
55
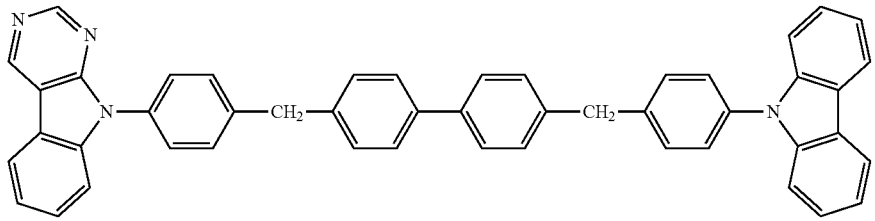
56
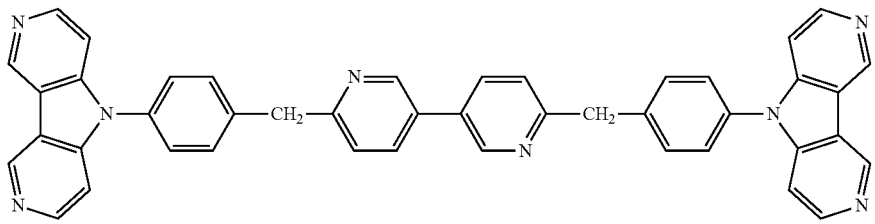
57
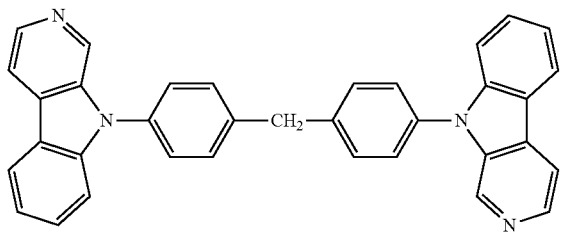
58
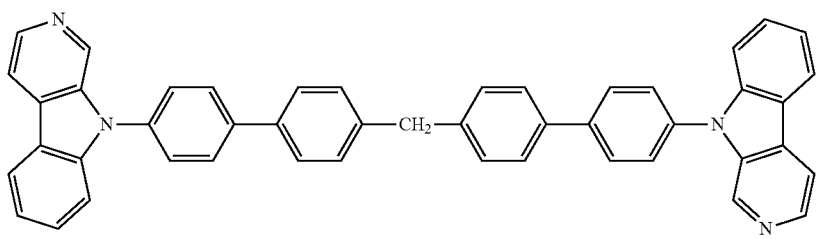
59
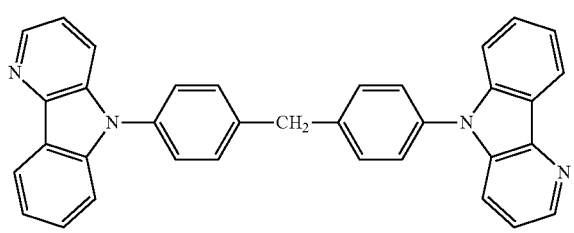
60
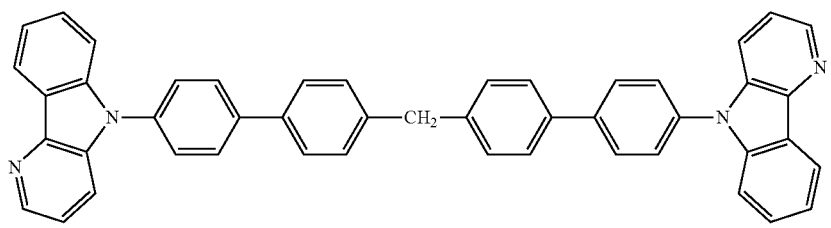
61
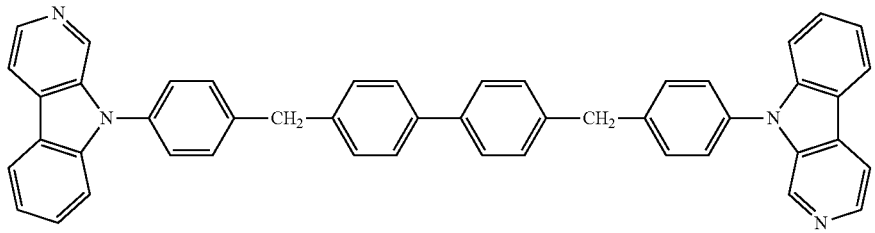

-continued
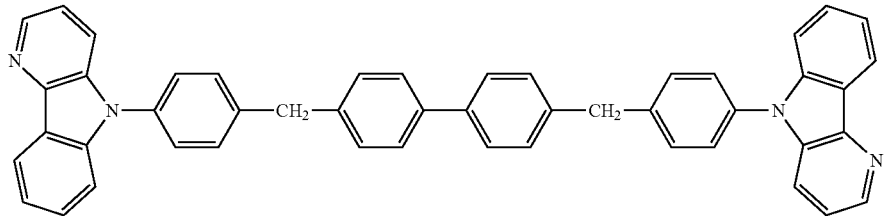
62
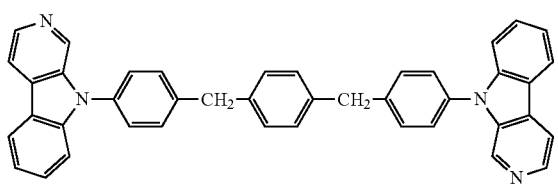
63
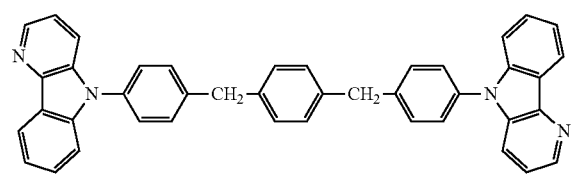
64
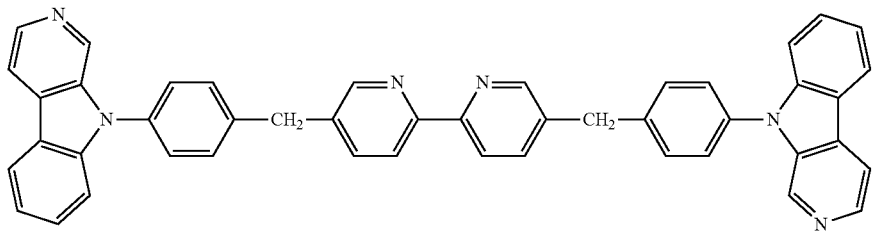
65
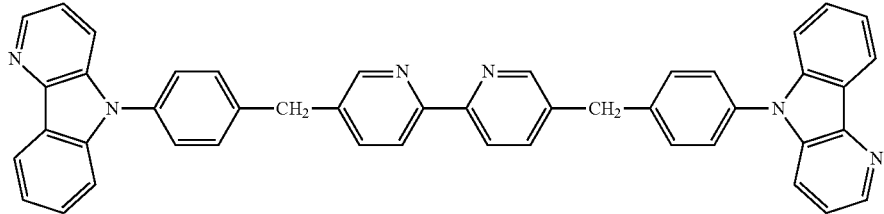
66
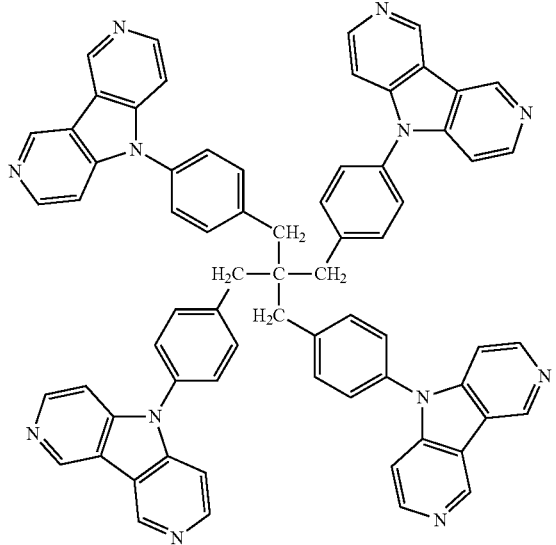
67
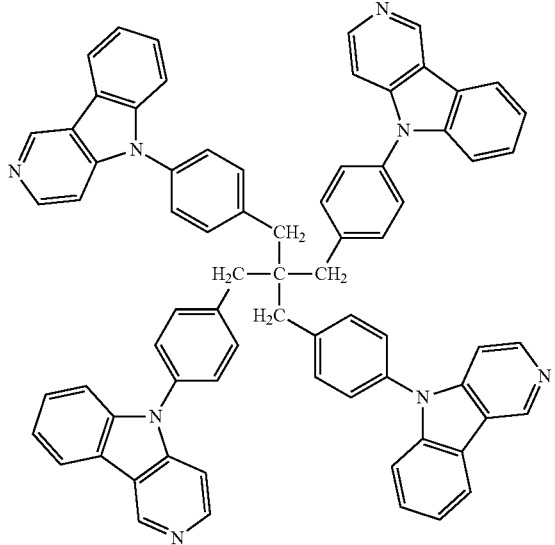
68

-continued
69
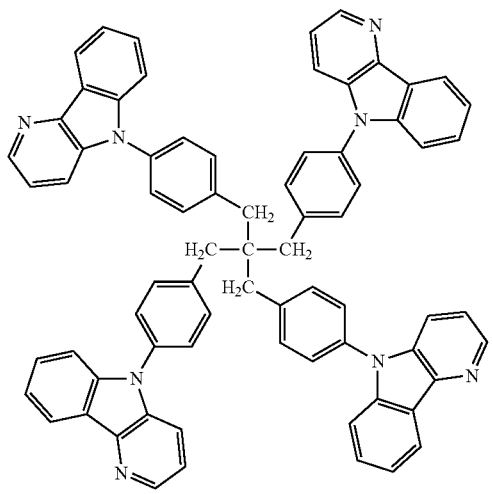
70
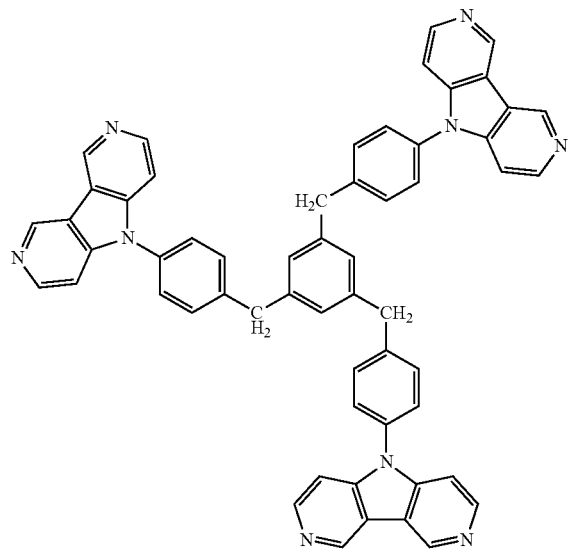
71
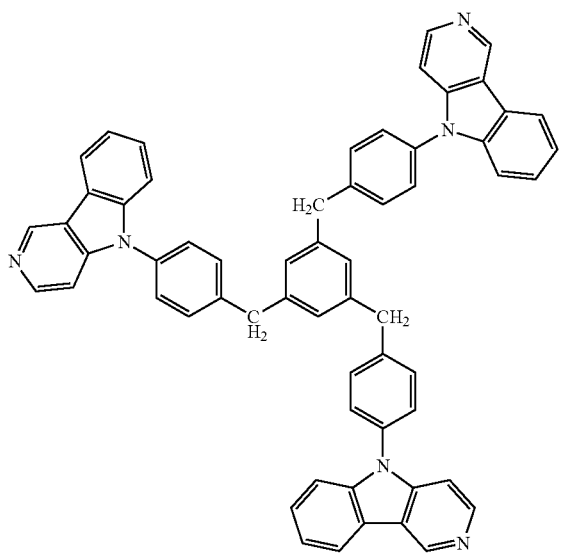
72
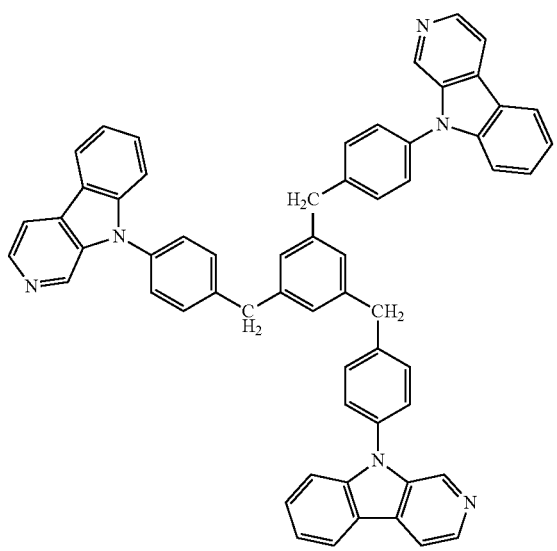
73
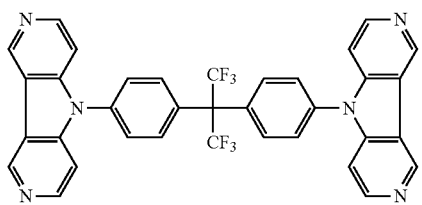
74
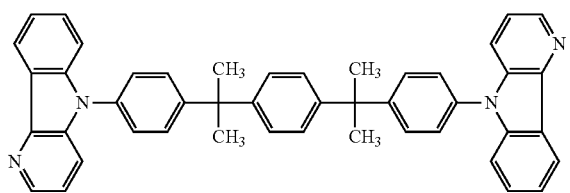
75
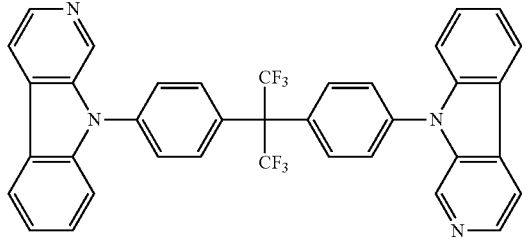
76
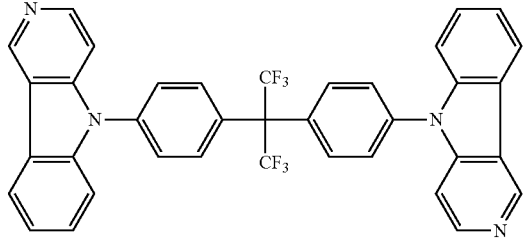

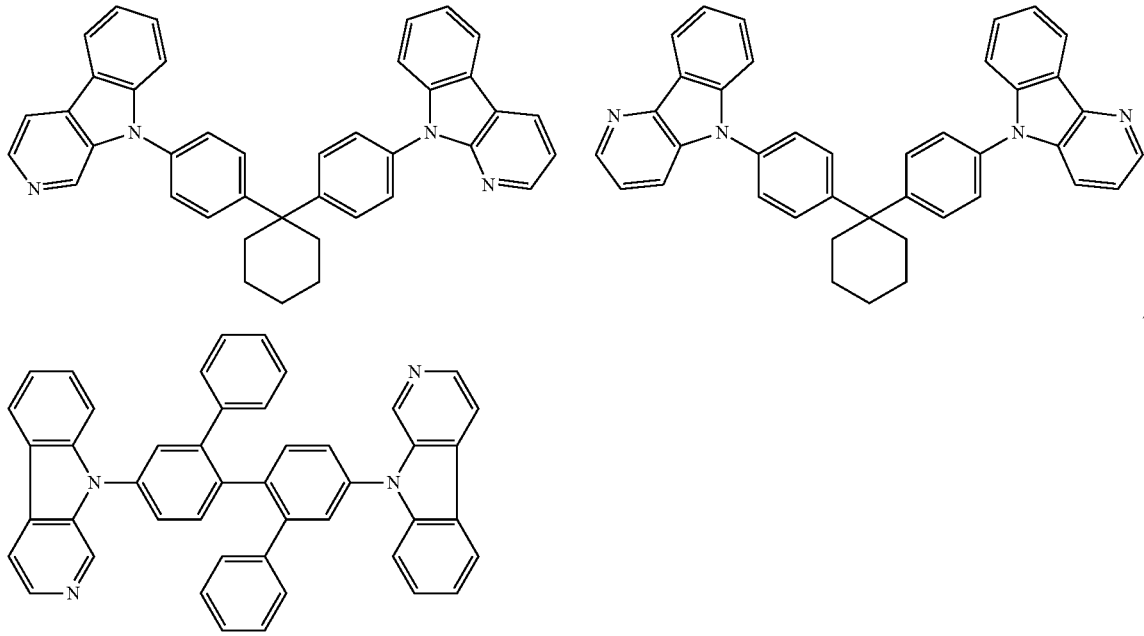

<Electron Inhibition Layer>

On the other hand, an electron inhibition layer is, in a broad meaning, provided with a function of a positive hole transport layer, being comprised of a material having a function of transporting a positive hole but a very small ability of transporting an electron, and can improve the recombination probability of an electron and a positive hole by inhibiting an electron while transporting a positive hole. Further, a constitution of a positive hole transport layer described later can be appropriately utilized as an electron inhibition layer.

<Positive Hole Transport Layer>

A positive hole transport layer contains a material having a function of transporting a positive hole, and in a broad meaning, a positive hole injection layer and an electron inhibition layer are also included in a positive hole transport layer. A single layer of or plural layers of a positive hole transport layer may be provided.

A positive hole transport material is not specifically limited and can be arbitrary selected from those such as generally utilized as a charge injection transporting material of a positive hole in a conventional photoconductive material and those which are well known in the art and utilized in a positive hole injection layer and a positive hole transport layer of an EL element.

A positive hole transport material is those having any one of a property to inject or transport a positive hole or a barrier property to an electron, and may be either an organic substance or an inorganic substance. For example, listed are a triazole derivative, an oxadiazole derivative, an imidazole derivative, a polyallylalkane derivative, a pyrazolone derivative, a phenylenediamine derivative, a allylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer and specifically preferably such as thiophene oligomer.

As a positive hole transport material, those described above can be utilized, however, it is preferable to utilized a porphyrin compound, an aromatic tertiary amine compound and a styrylamine compound, and specifically preferably an aromatic tertiary amine compound.

Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl 4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quarterphenyl; N,N, N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N,N-diphenylaminostilbene; and N-phenylcarbazole, in addition to those having two condensed aromatic rings in a molecule described in U.S. Pat. No. 5,061,569, such as 4,4'-bis[N-(1-naphthyl)-N-phenylamino]biphenyl (NDP), and 4,4',4''-tris[N-(3-methylphenyl)-N-phenylamino]triphenylamine (MDTDATA), in which three of triphenylamine units are bonded in a star burst form, described in JP-A 4-308688.

Polymer materials, in which these materials are introduced in a polymer chain or constitute the main chain of polymer, can be also utilized.

Further, an inorganic compound such as a p type-Si and a p type-SiC can be utilized as a positive hole injection material and a positive hole transport material This positive hole transport layer can be prepared by forming a thin layer made of the above-described positive hole transport material according to a method well known in the art such as a vacuum evaporation method, a spin coating method, a cast method, an inkjet method and a LB method.

The layer thickness of a positive hole transport layer is not specifically limited, however, is generally 5-5,000 nm. This positive transport layer may have a single layer structure comprised of one or not less than two types of the above described materials.

<Electron Transport Layer>

An electron transfer layer is composed of a material having a function to transfer an electron, and an electron injection layer and a positive hole inhibition layer are included in an electron transfer layer in a broad meaning. A single layer or plural layers of an electron transfer layer may be provided.

Further, an electron transfer layer is provided with a function to transmit an electron injected from a cathode to an emission layer, and compounds conventionally well known in the art can be utilized by arbitrarily selection as a material thereof.

Examples of a material utilized in this electron transfer layer (hereinafter, referred to as an electron transfer material) include such as a nitro-substituted fluorene derivative, a diphenylquinone derivative, a thiopyradineoxide derivative, a heterocyclic tetracarbonic acid anhydride such as naphthaleneperylene, carbodiimide, a fluorenylidenemethane derivative, anthraquinonedimethane and anthrone derivatives, and an oxadiazole derivative. Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transfer material.

Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol) aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transfer material.

Further, metal-free or metal phthalocyanine, or those the terminal of which is substituted by an alkyl group and a sulfonic acid group, can be preferably utilized as an electron transfer material. Further, distyrylpyrazine derivative, which has been exemplified as a material of an emission layer, can be also utilized as an electron transfer material, and, similarly to the case of a positive hole injection layer and a positive hole transfer layer, an inorganic semiconductor such as an n-type-Si and an n-type-SiC can be also utilized as an electron transfer material.

This electron transport layer can be prepared by forming a thin layer made of the above-described electron transport material according to a method well known in the art such as a vacuum evaporation method, a spin coating method, a cast method, an inkjet method and a LB method. The layer thickness of an electron transport layer is not specifically limited; however, is generally 5-5,000 nm. This electron transport layer may have a single layer structure comprised of one or not less than two types of the above described materials.

In the following, injection layer of a display device provided with an organic EL element of this invention will be explained.

<Injection Layer>: Electron Injection Layer, Positive Hole Injection Layer

An injection layer is appropriately provided and includes an electron injection layer and a positive hole injection layer, which may be arranged between an anode and an emission layer or a positive transfer layer, and between a cathode and an emission layer or an electron transfer layer, as described above.

An injection layer is a layer which is arranged between an electrode and an organic layer to decrease an operating voltage and to improve an emission luminance, which is detailed in volume 2, chapter 2 (pp. 123-166) of "Organic EL Elements and Industrialization Front thereof (Nov. 30, 1998, published by N. T. S Corp.)", and includes a positive hole injection layer (an anode buffer layer) and an electron injection layer (a cathode buffer layer).

An anode buffer layer (a positive hole injection layer) is also detailed in such as JP-A 9-45479, 9-260062 and 8-288069, and specific examples include such as a phthalocyanine buffer layer comprising such as copper phthalocyanine, an oxide buffer layer comprising such as vanadium oxide, an amorphous carbon buffer layer, and a polymer buffer layer employing conductive polymer such as polythiophene.

A cathode buffer layer (an electron injection layer) is also detailed in such as JP-A 6-325871, 9-17574 and 10-74586, and specific examples include a metal buffer layer comprising such as strontium and aluminum, an alkali metal compound buffer layer comprising such as lithium fluoride, an alkali earth metal compound buffer layer comprising such as magnesium fluoride, and an oxide buffer layer comprising such as aluminum oxide.

The above-described buffer layer (injection layer) is preferably a very thin layer, and the layer thickness is preferably in a range of 0.1-100 nm although it depends on a raw material.

This injection layer can be prepared by forming a thin layer made of the above-described material according to a method well known in the art such as a vacuum evaporation method, a spin coating method, a cast method, an inkjet method and a LB method. The layer thickness of an injection layer is not specifically limited; however, is generally 5-5,000 nm. This injection layer may have a single layer structure comprised of one or not less than two types of the above described materials.

<Anode>

As an anode according to an organic EL element of this invention, those comprising metal, alloy, a conductive compound, which is provided with a large work function (not less than 4 eV), and a mixture thereof as an electrode substance are preferably utilized. Specific examples of such an electrode substance include a conductive transparent material such as metal like Au, CuI, indium tin oxide (ITO), $SnO_2$ and ZnO. Further, a material such as IDIXO ($In_2O_3$—ZnO), which can prepare an amorphous and transparent electrode, may be also utilized. As for an anode, these electrode substances may be made into a thin layer by a method such as evaporation or spattering and a pattern of a desired form may be formed by means of photolithography, or in the case of requirement of pattern precision is not so severe (not less than 100 μm), a pattern may be formed through a mask of a desired form at the time of evaporation or spattering of the above-described substance. When emission is taken out of this anode, the transmittance is preferably set to not less than 10% and the sheet resistance as an anode is preferably not more than a few hundreds Ω/□.

Further, although the layer thickness depends on a material, it is generally selected in a range of 10-1,000 nm and preferably of 10-200 nm.

<Cathode>

On the other hand, as a cathode according to this invention, metal, alloy, a conductive compound and a mixture thereof, which have a small work function (not more than 4 eV), are utilized as an electrode substance. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal. Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum.

As for a cathode, these electrode substances may be made into a thin layer by a method such as evaporation or spattering. Further, the sheet resistance as a cathode is preferably not more than a few hundreds $\Omega/\square$ and the layer thickness is generally selected in a range of 10-1,000 nm and preferably of 50-200 nm. Herein, to transmit emission, either one of an anode or a cathode of an organic EL element is preferably transparent or translucent to improve the mission luminance.

<Substrate (Also Referred to as Base Plate, Base Material or Support)>

A substrate according to an organic EL element of this invention is not specifically limited with respect to types of such as glass and plastics provided being transparent, however, a substrate preferably utilized includes such as glass, quartz and transparent resin film. A specifically preferable substrate is resin film capable of providing an organic EL element with a flexible property.

Resin film includes such as film comprised of polyethylene terephthalate (PET), polyethylene naphthalate (PEN), polyether sulphone (PES), polyether imide, polyether etherketone, polyphenylene sulfide, polyallylate, polyimide, polycarbonate (PC) and cellulose acetate propionate (CAP).

On the surface of resin film, an inorganic or organic cover layer or a hybrid cover layer comprising the both may be formed, and the film is preferably provided with a high barrier ability having a vapor transmittance of not more than 0.01 $g/m^2 \cdot day \cdot at$ atm.

The taking out efficiency of emission of an organic EL element of this invention at room temperature is preferably not less than 1% and more preferably not less than 2%. Herein, taking out quantum efficiency (%)=photon number emitted out of organic EL element/electron number flown into organic EL element×100.

Further, a hue improving filter such as a color filter may be utilized in combination. In the case of an illumination application, roughening processed film (such as anti-glare film) can be also utilized in combination to decrease emission unevenness.

In the case of an application as a multi-color display device, the display is comprised of at least two types of organic EL elements having different emission maximum wavelengths, and a preferable example to prepare an organic EL element will now be explained.

<Preparation Method of Organic EL Element>

As an example of a preparation method of an organic EL element a preparation method of an organic EL element, comprising anode/positive hole injection layer/positive hole transport layer/emission layer/positive hole inhibition layer/electron transport layer/cathode buffer layer/cathode, will be explained.

First, on an appropriate substrate, a thin layer comprising a desired electrode substance such as an anode electrode substance is formed by means of evaporation or spattering so as to make a layer thickness of not more than 1 μm and preferably of 10-200 nm, whereby an anode is prepared. Next, on this layer, thin layers containing organic substances of such as a positive hole injection layer, a positive hole transport layer, an emission layer, a positive hole inhibition layer and an electron transport layer are formed.

A thin layer forming method of these layers containing the organic substances includes such as a spin coat method, a cast method, an inkjet method, an evaporation method and a printing method as described before, however, a vacuum evaporation method or a spin coat method is specifically preferable with respect to easy preparation of a homogeneous layer and bare generation of pinholes. Further, a different layer forming method depending on each layer may be applied. In the case of employing an evaporation method in layer formation, the evaporation condition depends on such as the type of a utilized compound, however, is generally appropriately selected in a range of 50-450° C. as a boat heating temperature, $10^{-6}$-$10^{-2}$ Pa as a vacuum degree, 0.01-50 nm/sec as a deposition rate, −50-300° C. as a substrate temperature and 0.1-5 μm as a layer thickness.

After formation of these layers, a thin layer comprising a cathode electrode substance is formed thereon by means of such as evaporation or spattering so as to make a layer thickness of less than 1 μm or preferably in a range of 50-200 nm to provide a cathode, whereby a desired organic EL element can be prepared. This preparation of an organic EL element is preferably carried out with one time evacuation to prepare all through from a positive hole injection layer to a cathode, however, different layer forming method may be also applied by taking out the element on the way. At that time, it is preferable to take consideration such as to perform the operation under a dry inert gas environment.

<Display Device>

A display device will now be explained. The display device of this invention includes the above-described organic EL element.

A display device of this invention may be either monochromatic or multi-colored. Here explained will be a multicolor display device. In the case of a multicolor display device, a shadow mask is provided only at the time of emission layer formation, and layers can be formed all over the surface by such as an evaporation method, a cast method, a spin coat method, an inkjet method and a printing method.

When patterning is performed only with an emission layer, the method is not specifically limited; however, preferable are an evaporation method, an inkjet method and a printing method. And patterning employing a shadow mask is preferred in the case of an evaporation method. Further, reversing the preparation order, it is also possible to prepare layers in the order of a cathode, an electron transport layer, a positive hole inhibition layer, an emission layer, a positive hole transport layer and an anode.

When a direct current voltage is applied on the multicolor display device thus prepared, emission can be observed by application of a voltage of approximately 2-40 V setting an anode to + polarity and a cathode to − polarity. Further, no current flows and no emission generate at all even when a voltage is applied with a reversed polarity. Further, in the case of alternate current voltage being applied, emission generates only in a state of an anode being + and a cathode being −. Herein, the wave shape of alternate current may be arbitrary.

A multicolor display device can be utilized as a display device, a display and various types of emission light sources. In a display device and a display, full-colored display is possible by employing three types of organic EL elements providing blue, red and green emissions. A display device and a display include a TV, a personal computer, a mobile instrument, an AV instrument, a character broadcast display and an information display in a car. Particularly, the display device and the display may be also utilized as a display to playback still images and moving images, and may adopt either a simple matrix (a passive matrix) mode or an active matrix mode when being utilized as a display device for moving image playback.

An illumination light source includes a home use illumination, a car room illumination, a backlight of a watch or a liquid crystal, a panel advertisement, a signal, a light source of an optical memory medium, a light source for an electrophotographic copier, a light source for an optical telecommunication processor and a light source for a photosensor, however, is not limited thereto.

<Illumination Device>

An illumination device of this invention will now be explained. The illumination device of this invention includes the above-described organic EL element.

An organic EL element of this invention can be utilized as an organic EL element provided with a resonator structure, and a utilization purpose of such an organic EL element provided with a resonator structure includes such as a light source for an optical memory medium, a light source for an electrophotographic copier, a light source for a optical telecommunication processor and a light source for a photosensor, however, is not limited thereto. Further, the organic EL element may be utilized for the above-described applications by being made to perform laser emission.

Further, an organic EL element of this invention may be utilized as one type of a lamp like an illumination and an exposure light, and may be also utilized as a display device of a projector of an image projecting type and a display device (a display) of a type to directly view still images and moving images. An operating mode in the case of being utilized as a display device for playback of moving images may be either a simple matrix (a passive matrix) mode or an active matrix mode. In addition, a full-color display device can be prepared by utilizing at least two types of organic EL elements of this invention which emit different emitting colors.

In the following, one example of a display device provided with an organic EL element of this invention will be explained.

FIG. 1 is a schematic drawing to show an example of a display device constituted of an organic EL element. It is a schematic drawing of a display, which displays image information by emission of an organic EL element, such as a mobile phone. Display 1 is constituted of such as display section A having plural number of pixels and control section B which performs image scanning of display section A based on image information.

Control section B, which is electrically connected to display section A, sends a scanning signal and an image data signal to plural number of pixels based on image information from the outside and pixels of each scanning line successively emit depending on the image data signal by a scanning signal to perform image scanning, whereby image information is displayed on display section A.

Figure 2:
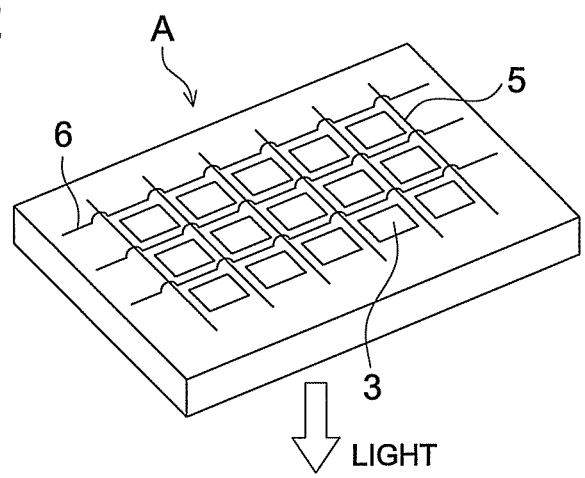
FIG. 2 is a schematic drawing of display section A.

FIG. 2 is a schematic drawing of display section A.

Display section A is provided with such as a wiring part, which contains plural scanning lines 5 and data lines 6, and plural pixels 3 on a substrate. Primary part materials of display section A will be explained in the following.

In the drawing, shown is the case that light emitted by pixel 3 is taken out along the white allow (downward).

Scanning lines 5 and plural data lines 6 in a wiring part each are comprised of a conductive material, and scanning lines 5 and data lines 6 are perpendicular in a grid form and are connected to pixels 3 at the right-angled crossing points (details are not shown in the drawing).

Pixel 3 receives an image data from data line 6 when a scanning signal is applied from scanning line 5 and emits according to the received image data. Full-color display device is possible by appropriately arranging pixels having an emission color in a red region, pixels in a green region and pixels in a blue region, side by side on the same substrate.

Next, an emission process of a pixel will be explained.

Figure 3:
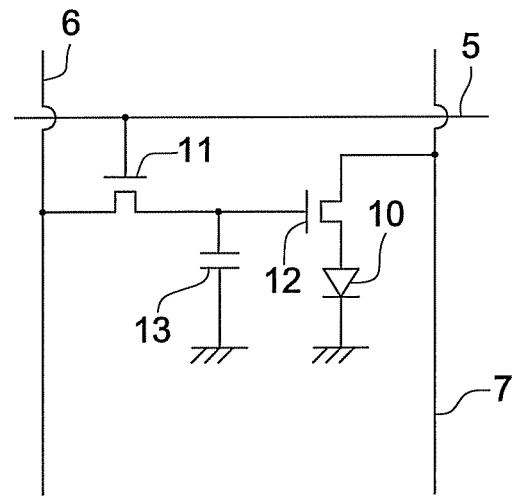
FIG. 3 is an equivalent circuit diagram of an image pixel.

FIG. 3 is a schematic drawing of a pixel.

A pixel is equipped with such as organic EL element 10, switching transistor 11, operating transistor 12 and capacitor 13. Red, green and blue emitting organic EL elements are utilized as organic EL element 10 for plural pixels, and full-color display device is possible by arranging these side by side on the same substrate.

In FIG. 3, an image data signal is applied on the drain of switching transistor 11 via data line 6 from control section B. Then, when a scanning signal is applied on the gate of switching transistor 11 via scanning line 5 from control section B, operation of switching transistor is on to transmit the image data signal applied on the drain to the gates of capacitor 13 and operating transistor 12.

Operating transistor 12 is on, simultaneously with capacitor 13 being charged depending on the potential of an image data signal, by transmission of an image data signal. In operating transistor 12, the drain is connected to electric source line 7 and the source is connected to the electrode of organic EL element 10, and an electric current is supplied from electric source line 7 to organic EL element 10 depending on the potential of an image data applied on the gate.

When a scanning signal is transferred to next scanning line 5 by successive scanning of control section B, operation of switching transistor 11 is off. However, since capacitor 13 keeps the charged potential of an image data signal even when operation of switching transistor 11 is off, operation of operating transistor 12 is kept on to continue emission of organic EL element 10 until the next scanning signal is applied. When the next scanning signal is applied by successive scanning, operating transistor 12 operates depending on the potential of an image data signal synchronized to the scanning signal and organic EL element 10 emits.

That is, emission of each organic EL element 10 of plural pixels 3 is performed by providing switching transistor 11 and operating transistor 12 against each organic EL element 10 of plural pixels 3. Such an emission method is called as an active matrix mode.

Herein, emission of organic EL element 10 may be either emission of plural gradations based on a multiple-valued image data signal having plural number of gradation potentials or on and off of a predetermined emission quantity based on a binary image data signal. Further, potential hold of capacitor 13 may be either continuously maintained until the next scanning signal application or discharged immediately before the next scanning signal application.

In this invention, emission operation is not necessarily limited to the above-described active matrix mode but may be a passive matrix mode in which organic EL element is emitted based on a data signal only when a scanning signal is scanned.

Figure 4:
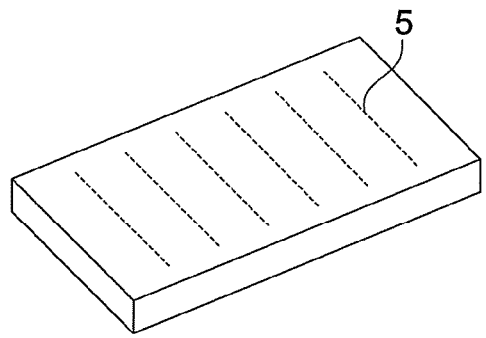
FIG. 4 is a schematic drawing of a full color display device according to a passive matrix mode.
Figure 4:
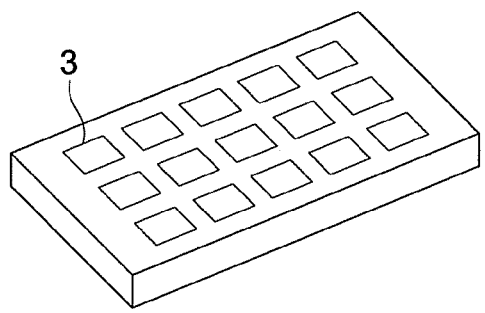
Figure 4:
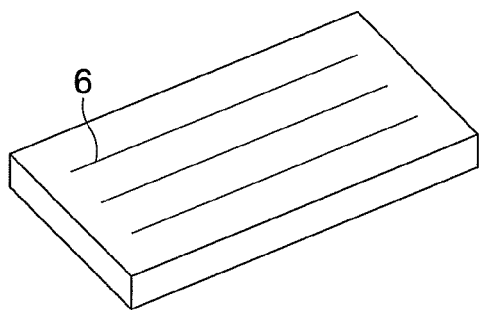
Figure 5:
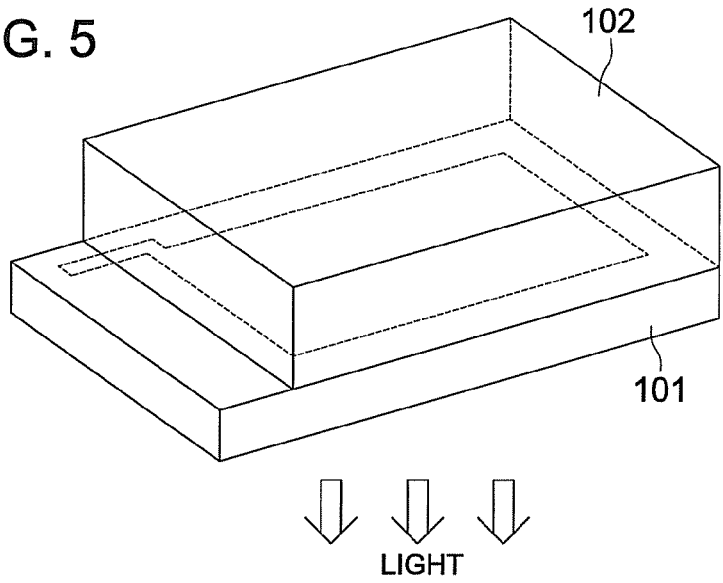
FIG. 5 is a schematic drawing of a lighting device.
Figure 6:
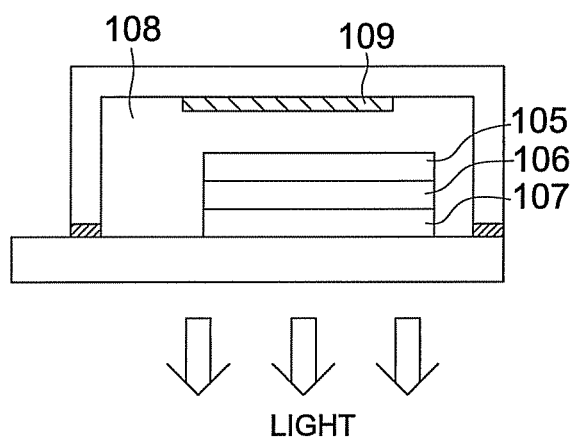
FIG. 6 is a schematic cross-sectional view of a lighting device.

FIG. 4 is a schematic drawing of a display device based on a passive matrix mode. In FIG. 4, plural number of scanning lines 5 and plural number of image data lines 6 are arranged grid-wise, opposing to each other and sandwiching pixels 3.

When a scanning signal of scanning line 5 is applied by successive scanning, pixel 3 connected to scanning line 5 applied with said signal emits depending on an image data signal.

Since pixel 3 is provided with no active element in a passive matrix mode, decrease of manufacturing cost is possible.

An organic EL element material can be also applied to an organic EL element to generate emission of practically white color as an illumination device. Plural emission colors are simultaneously emitted by plural number of emission materials to obtain white light by mixing colors. A combination of plural emission colors may be either the one, in which three emission maximum wavelengths of three primary colors of blue, green and red are contained, or the other, in which two emission maximum wavelengths, utilizing a relationship of complimentary colors such as blue and yellow, or blue and orange, are contained.

Further, a combination of emission materials to obtain plural number of emission colors may be either a combination comprising plural number of materials which emit phosphoresce or fluorescence, or a combination of a material which emits phosphoresce or fluorescence and a dye material which emits by light from an emission material as exiting light, however, in a white organic electroluminescent element according to this invention, it is enough only to mix plural emission dopants in combination. A mask is provided only at the time of forming such as an emission layer, a positive hole transport layer or an electron transport layer, to only simply arrange the plural emission dopants such as by separately painting through the mask, while other layers are commonly utilized to require no patterning such as a mask. Therefore, such as an electrode can be formed all over the plane by such as an evaporation method, a cast method, a spin coat method, an inkjet method and a printing method, resulting in improvement of productivity. According to this method, different from a white organic EL device in which plural colors of emission elements are arranged parallel in an alley form, an element itself is white emitting.

An emission material utilized in an emission layer is not specifically limited, and in the case of a backlight of a liquid crystal display element, any combination by arbitrary selection among platinum complexes according to this invention or emission materials well known in the art can be utilized so as to be fitted to the wavelength range corresponding to CF (color filter) characteristics, whereby white emission can be obtained.

In this manner, a white emitting organic EL element is usefully utilized as one type of a lamp such as a home use illumination, a car room illumination or an exposure light source as various emission light sources or illumination devices, in addition to the aforesaid display device and a display, and is further usefully applied for a display as such as a backlight of a liquid crystal display.

In addition to these, listed is a wide range of applications such as a backlight of a watch, an advertising board, a signal, a light source of an optical memory medium, a light source of an electrophotographic copier, a light source of an optical telecommunication processor and a light source of an optical sensor, and further general home use electric instruments which require a display device.

EXAMPLES

The present invention is described below with reference to examples, but the embodiment of the invention is not limited to them.

Example 1

Preparation of Organic EL Elements 1-1 to 1-41

A pattern was formed on a substrate composed of a glass plate of 100 mm×100 mm×1.1 mm and a 100 nm ITO (indium tin oxide) layer (NA45: manufactured by NH Technoglass Co., Ltd.) as an anode. Then the resulting transparent substrate, having the above ITO transparent electrode, was subjected to ultrasonic cleaning in iso-propylalcohol, dried with a dry nitrogen gas, and then subjected to UV-ozone cleaning for 5 minutes. Thus obtained transparent substrate was fixed to a substrate holder of a commercially available vacuum deposition apparatus. Further, 200 mg of α-NPD was placed in a first resistive heating molybdenum boat, 200 mg of CBP, as a host compound, was placed in a second resistive heating molybdenum boat, 200 mg of BCP was placed in a third resistive heating molybdenum boat, 100 mg of illustrated compound I-1 was placed in a fourth resistive heating molybdenum boat, and 200 mg of $Alq_3$ was placed in a fifth resistive heating molybdenum boat, and the resulting boats were fixed in the vacuum deposition apparatus.

After the pressure in the vacuum tank was reduced to $4×10^{-4}$ Pa, the above heating boat carrying α-NPD was heated by applying an electric current to evaporate α-NPD onto the transparent substrate at a deposition rate of 0.1 nm/sec to form a positive hole transport layer of 40 nm in thickness. Further, the above heating boats, each carrying CBP and illustrated compound 1-1, were heated by applying an electric current to co-evaporate CBP and illustrated compound 1-1 onto the above-described positive hole transport layer at a deposition rate of 0.2 nm/sec and 0.012 nm/sec respectively to form a light-emitting layer of 40 nm in thickness. The temperature of the substrate during deposition was room temperature. Further, the above heating boat carrying BCP was heated by applying an electric current to evaporate BCP onto the above-described light-emitting layer at a deposition rate of 0.1 nm/sec to form an electron transport layer of 10 nm in thickness. The resulting electron transport layer also functioned as a hole blocking layer. Furthermore, the above heating boat carrying $Alq_3$ was heated by applying an electric current to evaporate $Alq_3$ onto the above-described electron transport layer at a deposition rate of 0.1 nm/sec to form an electron injection layer of 40 nm in thickness. Temperature of the substrate during deposition was room temperature.

Subsequently, a cathode was prepared by evaporating lithium fluoride and aluminum onto the above sample with 0.5 nm and 110 nm in thickness respectively, to prepare organic EL element 1-1.

Organic EL elements 1-2 to 1-41 were prepared in the same manner as in preparation of organic EL element 1-1 except that CBP, which was employed as a host compound in a light-emitting layer, was changed to those compounds given in Tables 2 and 3, and illustrated compound 1-1, which was employed as a dopant compound in a light-emitting layer, was changed to those compounds given in Tables 2 and 3. The structures of compounds employed in the foregoing description are shown below.

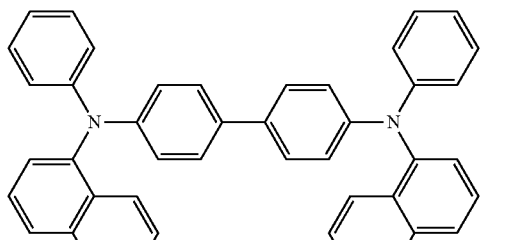

α-NPD

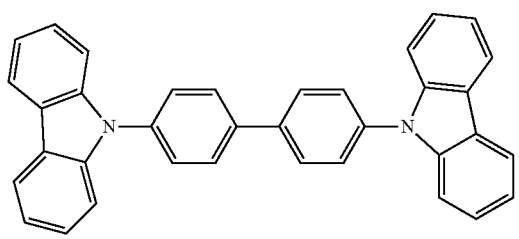

CBP

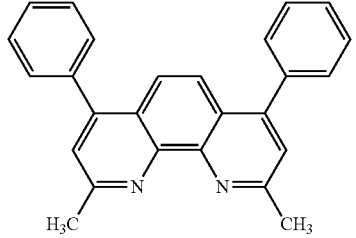

BCP

Alq3

Evaluations of Organic EL Elements 1-1 to 1-41

The prepared organic EL elements 1-1 to 1-41 were evaluated in the following way, with the results shown in Tables 2 and 3.

(External Quantum Efficiency)

External quantum efficiency (%) of each of the prepared organic EL elements was determined with a constant current of 2.5 mA/cm² being supplied to each of the samples at 23° C. in a dry nitrogen gas atmosphere. A spectroradiometer CS-1000 (manufactured by Konica Minolta) was used for the measurement.

External quantum efficiency given in Tables 2 and 3 was expressed by a relative value based on the external quantum efficiency of organic EL element 1-1 being 100.

(Emission Life)

A period in which brightness of an organic EL element, when driven at constant current of 2.5 mA/cm², decreased to half of the brightness immediately after the initiation of emission (initial brightness) was determined, and the period was defined as the half-life period (τ 0.5) and used as an index of the life of an organic EL element. A spectroradiometer CS-1000 (manufactured by Konica Minolta) was used for the measurement.

In Tables 2 and 3, emission life was expressed by a relative value based on the emission life of organic EL element 1-1 being 100.

TABLE 2

| Organic EL Element No. | Dopant Compound | | | Host Compound | | | External Quantum Efficiency | Life | Note |
|---|---|---|---|---|---|---|---|---|---|
| | Compound | HOMO (eV) | LUMO (eV) | Compound | T1 (nm) | Tg (° C.) | | | |
| 1-1 | 1-1 | −4.37 | −0.57 | CBP | 465 | 109 | 100 | 100 | Comp. |
| 1-2 | 1-2 | −4.53 | −0.76 | CBP | 465 | 109 | 98 | 115 | Comp. |
| 1-3 | 1-5 | −4.18 | −0.42 | CBP | 465 | 109 | 105 | 90 | Comp. |
| 1-4 | 1-1 | −4.37 | −0.57 | H-1 | 411 | 64 | 163 | 120 | Inv. |
| 1-5 | 1-2 | −4.53 | −0.76 | H-1 | 411 | 64 | 155 | 131 | Inv. |
| 1-6 | 1-5 | −4.18 | −0.42 | H-1 | 411 | 64 | 164 | 115 | Inv. |
| 1-7 | 1-1 | −4.37 | −0.57 | H-20 | 437 | 92 | 144 | 150 | Inv. |
| 1-8 | 1-2 | −4.53 | −0.76 | H-20 | 437 | 92 | 150 | 155 | Inv. |
| 1-9 | 1-1 | −4.37 | −0.57 | H-19 | 445 | 130 | 148 | 173 | Inv. |
| 1-10 | 1-2 | −4.53 | −0.76 | H-19 | 445 | 130 | 155 | 180 | Inv. |
| 1-11 | 1-1 | −4.37 | −0.57 | H-18 | 446 | 180 | 156 | 177 | Inv. |
| 1-12 | 1-2 | −4.53 | −0.76 | H-18 | 446 | 180 | 171 | 179 | Inv. |
| 1-13 | 1-1 | −4.37 | −0.57 | H-21 | 449 | 80 | 159 | 130 | Inv. |
| 1-14 | 1-2 | −4.53 | −0.76 | H-21 | 449 | 80 | 155 | 132 | Inv. |
| 1-15 | 1-1 | −4.37 | −0.57 | H-29 | 449 | 142 | 160 | 155 | Inv. |
| 1-16 | 1-2 | −4.53 | −0.76 | H-29 | 449 | 142 | 149 | 163 | Inv. |
| 1-17 | FIrpic | −5.99 | −2.36 | H-1 | 411 | 64 | 153 | 50 | Comp. |
| 1-18 | FIrpic | −5.99 | −2.36 | CBP | 465 | 109 | 96 | 70 | Comp. |
| 1-19 | 1-20 | −5.02 | −1.2 | CBP | 465 | 109 | 93 | 90 | Comp. |
| 1-20 | 1-20 | −5.02 | −1.2 | H-1 | 411 | 64 | 141 | 120 | Inv. |
| 1-21 | 1-20 | −5.02 | −1.2 | H-20 | 437 | 92 | 139 | 139 | Inv. |
| 1-22 | 1-20 | −5.02 | −1.2 | H-19 | 445 | 130 | 137 | 145 | Inv. |
| 1-23 | 1-20 | −5.02 | −1.2 | H-18 | 446 | 180 | 135 | 150 | Inv. |

TABLE 2-continued

| Organic EL Element No. | Dopant Compound | | Host Compound | | | External Quantum Efficiency | Life | Note |
|---|---|---|---|---|---|---|---|---|
| | Compound | HOMO (eV) | Compound | T1 (nm) | Tg (°C.) | | | |
| 1-24 | 1-20 | −5.02 | −1.2 | H-21 | 449 | 80 | 145 | 127 | Inv. |
| 1-25 | 1-20 | −5.02 | −1.2 | H-29 | 449 | 142 | 141 | 136 | Inv. |
| 1-26 | 1-31 | −4.7 | −0.67 | CBP | 465 | 109 | 89 | 101 | Comp. |
| 1-27 | 1-31 | −4.7 | −0.67 | H-1 | 411 | 64 | 130 | 129 | Inv. |
| 1-28 | 1-31 | −4.7 | −0.67 | H-20 | 437 | 92 | 125 | 134 | Inv. |
| 1-29 | 1-31 | −4.7 | −0.67 | H-19 | 445 | 130 | 123 | 152 | Inv. |
| 1-30 | 1-31 | −4.7 | −0.67 | H-18 | 446 | 180 | 120 | 155 | Inv. |
| 1-31 | 1-31 | −4.7 | −0.67 | H-21 | 449 | 80 | 139 | 130 | Inv. |
| 1-32 | 1-31 | −4.7 | −0.67 | H-29 | 449 | 142 | 135 | 132 | Inv. |

T1: Phosphorescent 0-0 Band
Comp.: Comparative Example, Inv.: Present Invention

TABLE 3

| Organic EL Element No. | Dopant Compound | | | Host Compound | | | External Quantum Efficiency | Life | Note |
|---|---|---|---|---|---|---|---|---|---|
| | Compound | HOMO (eV) | LUMO (eV) | Compound | T1 (nm) | Tg (°C.) | | | |
| 1-33 | 1-75 | −4.34 | −0.55 | H-32 | 437 | 166 | 158 | 190 | Inv. |
| 1-34 | 1-77 | −4.36 | −0.66 | H-32 | 437 | 166 | 155 | 185 | Inv. |
| 1-35 | 1-79 | −4.26 | −0.47 | H-32 | 437 | 166 | 148 | 169 | Inv. |
| 1-36 | 1-75 | −4.34 | −0.55 | H-36 | 416 | 169 | 166 | 195 | Inv. |
| 1-37 | 1-75 | −4.34 | −0.55 | H-37 | 443 | 143 | 160 | 188 | Inv. |
| 1-38 | 1-77 | −4.36 | −0.66 | H-36 | 416 | 169 | 157 | 191 | Inv. |
| 1-39 | 1-77 | −4.36 | −0.66 | H-37 | 443 | 143 | 152 | 182 | Inv. |
| 1-40 | 1-79 | −4.26 | −0.47 | H-36 | 416 | 169 | 147 | 172 | Inv. |
| 1-41 | 1-79 | −4.26 | −0.47 | H-37 | 443 | 143 | 144 | 166 | Inv. |

T1: Phosphorescent 0-0 Band
Inv.: Present Invention

Tables 2 and 3 show that the organic EL elements of the present invention achieved high external quantum efficiency and long life.

Example 2

Preparation of Organic EL Elements 2-1 to 2-45

A pattern was formed on a substrate composed of a glass plate of 100 mm×100 mm×1.1 mm and a 100 nm ITO (indium tin oxide) layer (NA45: manufactured by NH Technoglass Co., Ltd.) as an anode. Then the resulting transparent substrate, having the above ITO transparent electrode, was subjected to ultrasonic cleaning in iso-propylalcohol, dried with a dry nitrogen gas, and then subjected to UV-ozone cleaning for 5 minutes. Thus obtained transparent substrate was fixed to a substrate holder of a commercially available vacuum deposition apparatus. Further, 200 mg of α-NPD was placed in a first resistive heating molybdenum boat, 100 mg of illustrated compound H-21, as an electron blocking compound, was placed in a second resistive heating molybdenum boat, 200 mg of CBP, as a host compound was placed in a third resistive heating molybdenum boat, 200 mg of BCP was placed in a fourth resistive heating molybdenum boat, 100 mg of illustrated compound I-1 was placed in a fifth resistive heating molybdenum boat, and 200 mg of Alq$_3$ was placed in a sixth resistive heating molybdenum boat, and the resulting boats were fixed in the vacuum deposition apparatus.

After the pressure in the vacuum tank was reduced to 4×10$^{-4}$ Pa, the above heating boat carrying α-NPD was heated by applying an electric current to evaporate α-NPD onto the transparent substrate at a deposition rate of 0.1 nm/sec to form a positive hole transport layer of 40 nm in thickness. Further, the above heating boat carrying illustrative compound H-21 was heated by applying an electric current to evaporate illustrative compound H-21 onto the positive hole transport layer at a deposition rate of 0.1 nm/sec to form an electron blocking layer of 10 nm in thickness. Further, the above heating boats, each carrying CBP and illustrated compound 1-1, were heated by applying an electric current to co-evaporate CBP and illustrated compound 1-1 onto the above-described positive hole transport layer at a deposition rate of 0.2 nm/sec and 0.012 nm/sec respectively to form a light-emitting layer of 40 nm in thickness. The temperature of the substrate during deposition was room temperature. Further, the above heating boat carrying BCP was heated by applying an electric current to evaporate BCP onto the above-described light-emitting layer at a deposition rate of 0.1 nm/sec to form an electron transport layer of 10 nm in thickness. The resulting electron transport layer also functioned as a hole blocking layer. Furthermore, the above heating boat carrying Alq$_3$ was heated by applying an electric current to evaporate Alq$_3$ onto the above-described electron transport layer at a deposition rate of 0.1 nm/sec to form an electron injection layer of 40 nm in thickness. Temperature of the substrate during deposition was room temperature.

Subsequently, a cathode was prepared by evaporating lithium fluoride and aluminum onto the above sample with 0.5 nm and 110 nm in thickness respectively, to prepare organic EL element 2-1.

Organic EL elements 2-2 to 2-45 were prepared in the same manner as in preparation of organic EL element 2-1 except that CBP, which was employed as a host compound in a light-emitting layer, was changed to those compounds given in Tables 4 and 5, illustrated compound I-1, which was employed as a dopant compound in a light-emitting layer, was changed to those compounds given in Tables 4 and 5, and illustrated compound H-21, which was employed in an electron blocking layer, was changed to those compounds given in Tables 4 and 5.

Evaluations of Organic EL Elements 2-1 to 2-45

Similarly to Example 1, the prepared organic EL elements 2-1 to 2-45 were evaluated, with the results shown in Tables 4 and 5.

External quantum efficiency and emission life given in Tables 4 and 5 were expressed by a relative value based on the external quantum efficiency and emission life of organic EL element 1-1 being 100.

TABLE 4

| Organic EL Element No. | Electron Blocking Layer | Guest Compound Compound | Guest Compound HOMO (eV) | Guest Compound LUMO (eV) | Host Compound Compound | Host Compound T1 (nm) | Host Compound Tg (° C.) | External Quantum Efficiency | Life | Note |
|---|---|---|---|---|---|---|---|---|---|---|
| 2-1 | H-21 | 1-1 | −4.37 | −0.57 | CBP | 465 | 109 | 111 | 99 | Comp. |
| 2-2 | — | 1-1 | −4.37 | −0.57 | CBP | 465 | 109 | 100 | 100 | Comp. |
| 2-3 | H-21 | 1-2 | −4.53 | −0.76 | CBP | 465 | 109 | 105 | 105 | Comp. |
| 2-4 | H-21 | 1-5 | −4.18 | −0.42 | CBP | 465 | 109 | 103 | 89 | Comp. |
| 2-5 | — | 1-2 | −4.53 | −0.76 | CBP | 465 | 109 | 98 | 115 | Comp. |
| 2-6 | H-21 | 1-1 | −4.37 | −0.57 | H-1 | 411 | 64 | 170 | 120 | Inv. |
| 2-7 | H-21 | 1-1 | −4.37 | −0.57 | H-20 | 437 | 92 | 165 | 146 | Inv. |
| 2-8 | H-21 | 1-1 | −4.37 | −0.57 | H-19 | 445 | 130 | 163 | 168 | Inv. |
| 2-9 | H-21 | 1-1 | −4.37 | −0.57 | H-18 | 446 | 180 | 169 | 174 | Inv. |
| 2-10 | H-21 | 1-1 | −4.37 | −0.57 | H-21 | 449 | 80 | 171 | 122 | Inv. |
| 2-11 | H-21 | 1-1 | −4.37 | −0.57 | H-29 | 449 | 142 | 172 | 146 | Inv. |
| 2-12 | H-21 | 1-2 | −4.53 | −0.76 | H-1 | 411 | 64 | 170 | 130 | Inv. |
| 2-13 | H-21 | 1-2 | −4.53 | −0.76 | H-20 | 437 | 92 | 168 | 155 | Inv. |
| 2-14 | H-21 | 1-2 | −4.53 | −0.76 | H-19 | 445 | 130 | 169 | 175 | Inv. |
| 2-15 | H-21 | 1-2 | −4.53 | −0.76 | H-18 | 446 | 180 | 179 | 171 | Inv. |
| 2-16 | H-21 | 1-2 | −4.53 | −0.76 | H-21 | 449 | 80 | 169 | 128 | Inv. |
| 2-17 | H-21 | 1-2 | −4.53 | −0.76 | H-29 | 449 | 142 | 167 | 160 | Inv. |
| 2-18 | H-21 | 1-5 | −4.18 | −0.42 | H-19 | 445 | 130 | 167 | 110 | Inv. |
| 2-19 | H-21 | 1-5 | −4.18 | −0.42 | H-20 | 437 | 92 | 170 | 113 | Inv. |
| 2-20 | H-22 | 1-1 | −4.37 | −0.57 | H-20 | 437 | 92 | 169 | 146 | Inv. |
| 2-21 | H-22 | 1-1 | −4.37 | −0.57 | H-19 | 445 | 130 | 171 | 167 | Inv. |
| 2-22 | H-22 | 1-1 | −4.37 | −0.57 | H-18 | 446 | 180 | 167 | 175 | Inv. |
| 2-23 | H-22 | 1-2 | −4.53 | −0.76 | H-20 | 437 | 92 | 165 | 155 | Inv. |
| 2-24 | H-22 | 1-2 | −4.53 | −0.76 | H-19 | 445 | 130 | 160 | 175 | Inv. |
| 2-25 | H-22 | 1-2 | −4.53 | −0.76 | H-18 | 446 | 180 | 173 | 171 | Inv. |
| 2-26 | H-28 | 1-2 | −4.53 | −0.76 | CBP | 465 | 109 | 105 | 111 | Comp. |
| 2-27 | — | FIrpic | −5.99 | −2.36 | H-21 | 449 | 80 | 153 | 50 | Comp. |
| 2-28 | H-21 | FIrpic | −5.99 | −2.36 | H-1 | 411 | 64 | 150 | 52 | Comp. |

T1: Phosphorescent 0-0 Band
Comp.: Comparative Example, Inv.: Present Invention

TABLE 5

| Organic EL Element No. | Electron Blocking Layer | Guest Compound Compound | Guest Compound HOMO (eV) | Guest Compound LUMO (eV) | Host Compound Compound | Host Compound T1 (nm) | Host Compound Tg (° C.) | External Quantum Efficiency | Life | Note |
|---|---|---|---|---|---|---|---|---|---|---|
| 2-29 | H-21 | 1-75 | −4.34 | −0.55 | H-32 | 437 | 166 | 170 | 188 | Inv. |
| 2-30 | H-21 | 1-77 | −4.36 | −0.66 | H-32 | 437 | 166 | 170 | 180 | Inv. |
| 2-31 | H-21 | 1-79 | −4.26 | −0.47 | H-32 | 437 | 166 | 165 | 169 | Inv. |
| 2-32 | H-21 | 1-75 | −4.34 | −0.55 | H-36 | 416 | 169 | 168 | 194 | Inv. |
| 2-33 | H-21 | 1-75 | −4.34 | −0.55 | H-37 | 443 | 143 | 164 | 184 | Inv. |
| 2-34 | H-21 | 1-77 | −4.36 | −0.66 | H-36 | 416 | 169 | 164 | 185 | Inv. |
| 2-35 | H-21 | 1-77 | −4.36 | −0.66 | H-37 | 443 | 143 | 162 | 181 | Inv. |
| 2-36 | H-21 | 1-79 | −4.26 | −0.47 | H-36 | 416 | 169 | 169 | 190 | Inv. |
| 2-37 | H-21 | 1-79 | −4.26 | −0.47 | H-37 | 443 | 143 | 166 | 182 | Inv. |
| 2-38 | H-21 | 1-79 | −4.26 | −0.47 | H-37 | 443 | 143 | 168 | 159 | Inv. |
| 2-39 | H-22 | 1-75 | −4.34 | −0.55 | H-32 | 437 | 166 | 165 | 186 | Inv. |
| 2-40 | H-22 | 1-75 | −4.34 | −0.55 | H-36 | 416 | 169 | 164 | 192 | Inv. |
| 2-41 | H-22 | 1-75 | −4.34 | −0.55 | H-37 | 443 | 143 | 166 | 177 | Inv. |
| 2-42 | H-22 | 1-77 | −4.36 | −0.66 | H-36 | 416 | 169 | 155 | 186 | Inv. |
| 2-43 | H-22 | 1-77 | −4.36 | −0.66 | H-37 | 443 | 143 | 151 | 180 | Inv. |
| 2-44 | H-22 | 1-79 | −4.26 | −0.47 | H-36 | 416 | 169 | 161 | 187 | Inv. |
| 2-45 | H-22 | 1-79 | −4.26 | −0.47 | H-37 | 443 | 143 | 162 | 174 | Inv. |

T1: Phosphorescent 0-0 Band
Inv.: Present Invention

Tables 4 and 5 show that the organic EL elements of the present invention achieved high external quantum efficiency and long life.

Example 3

Production of Full-Color Display
(Preparation of Blue Light Emitting Element)
Organic EL element 1-14 prepared in Example 1 was employed as a blue light emitting element for the full-color display.
(Preparation of Green Light Emitting Element)
A green light emitting element was prepared in the same manner as in organic EL element 1-14 in Example 1 except that the host compound and the dopant were changed to CBP and Ir-1 respectively, and the resulting element was employed as a green light emitting element for the full-color display.
(Preparation of Red Light Emitting Element)
A red light emitting element was prepared in the same manner as in organic EL element 1-14 in Example 1 except that the host compound and the dopant were changed to CBP and Ir-9 respectively, and the resulting element was employed as a red light emitting element for the full-color display.

The above prepared red, green, and blue light emitting organic EL elements were juxtaposed on the same substrate to prepare a full color display apparatus driven by an active matrix method having the form illustrated in FIG. 1. In FIG. 2, a schematic drawing of only display section A of the above-described display apparatus is shown. Namely, provided on one substrate are, a wiring section containing a plurality of scanning lines 5 and a plurality of data lines 6, and a plurality of pixels 3 (pixels emitting red light, pixels emitting green light, and pixels emitting blue light) which were juxtaposed. Each of scanning lines 5 and data lines 6 on the wiring section is composed of an electroconductive material. Scanning lines 5 and data lines 6 cross each other at right angles in a grid like fashion, and both kinds of lines are connected to pixels 3 at the crossing points (the details are not illustrated). Each of the plurality of pixels 3 described above is driven by an active matrix method in which an organic EL element corresponding to each light-emitting color, a switching transistor and a driving transistor both of which are active elements are provided. When scanning signals are applied through scanning line 5, each pixel receives an image data signal through data line 6, whereby each pixel emits light based on the received image data. Thus the aforesaid light emitting pixels of red, green, and blue are suitably juxtaposed on the substrate, to produce a full color display.

It was confirmed that driving the above-described full color display can provides a distinct full color moving picture exhibiting high brightness, and high durability.

Example 4

Production of White Light Emitting Element and White Light Lighting Device
An electrode of the transparent electrode substrate of Example 1 was formed by patterning, on which a layer of α-NPD of 40 nm in thickness was formed as a positive hole injection/transport layer similarly to Example 1. Then, each of illustrative compound H-19, illustrative compound I-2, and Ir-9 was placed on the above-described heating boats, and was independently evaporated onto the above layer, by applying an electric current, to a total layer thickness of 30 nm, by controlling deposition rates of illustrative light-emitting host compound H-19, illustrative light-emitting dopant I-2, and Ir-9 to be 100:5:0.6, to provide a light-emitting layer.

Subsequently, a positive hole blocking layer was provided by forming a layer of BCP exhibiting 10 nm in thickness. Further, an $Alq_3$ layer exhibiting 40 nm in thickness was formed, to provide an electron transport layer.

Next, similarly to Example 1, a stainless-steel mask, having square holes with almost the same shape as the transparent electrode, was provided on the electron injection layer, and then a lithium fluoride was evaporated to form a layer as a cathode buffer layer with 0.5 nm in thickness, and aluminum was evaporated to form a layer as a cathode with 150 nm in thickness.

Using the above element, a flat lamp, having a sealed structure of the similar structure and similar method to that of Example 1, was produced. The above flat lamp emitted a nearly white light by applying an electric current to prove that the aforesaid lamp is usable as a lighting device.

What is claimed is:

1. An organic electroluminescent element comprising a substrate having thereon an electrode and at least one organic layer,
   wherein at least one of the organic layers is a light-emitting layer containing a phosphorescent compound and a host compound represented by Formula (7),

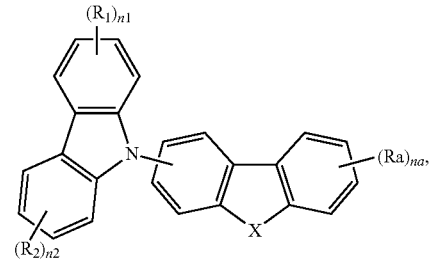

Formula (7)

wherein $R_1$ and $R_2$ each represent a hydrogen atom or a substituent, and Ra represents a hydrogen atom or a substituent selected from the group consisting of: an alkyl group, a cycloalkyl group, a phenyl group, an imidazolyl group, a pyridyl group, a pyrazolyl group, an oxazolyl group, an isoxazolyl group, an isothiazolyl group, a thienyl group, a dibenzofuryl group, a dibenzothienyl group, a carbolinyl group, a morpholyl group, a methoxy group, an ethoxy group, a propyloxy group, a pentyloxy group, a hexyloxy group, a cyclopentyloxy group, a cyclohexyloxy group, a phenoxy group, a methylthio group, an ethylthio group, a propylthio group, a pentylthio group, a hexylthio group, a cyclopentylthio group, a cyclohexylthio group, a phenylthio group, a hydroxy group, a mercapto group, and a silyl group; n1, n2, and na each are an integer of 0-4; and X represents O, and the phosphorescent compound has a HOMO of from −5.15 to −3.50 eV and a LUMO of from −1.25 to +1.00 eV, and the host compound has a 0-0 band of 460 nm or less in a phosphorescence spectrum and the host compound has a glass transition temperature of 90° C. or more; and
the phosphorescent compound is represented by Formula (A),

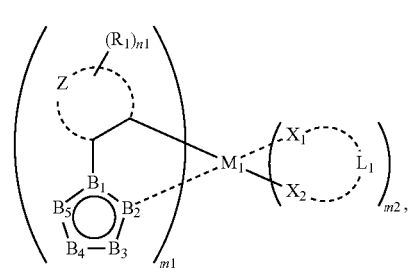

Formula (A)

wherein, in Formula (A), $R_1$ represents a substituent; Z represents a group of non-metal elements necessary to form a five-to-seven-membered ring; n1 is an integer of 0 to 5; $B_1$-$B_5$ each represent a carbon atom, a nitrogen atom, an oxygen atom, or a sulfur atom, and at least one of them represents a nitrogen atom; $M_1$ is a metal of 8-10 group in the periodic table; $X_1$ and $X_2$ each represent a carbon atom, a nitrogen atom or an oxygen atom; $L_1$ is a group of elements forming ligands having coordination number 2 with $X_1$ and $X_2$; $L_1$ is an integer of 1 to 3; m2 is an integer of 0 to 2; and m1+m2 is 2 or 3.

2. The organic electroluminescent element of claim 1, wherein
the phosphorescent compound has the HOMO of from −4.80 to −3.50 eV and the LUMO of from −0.80 to +1.00 eV.

3. The organic electroluminescent element of claim 1, wherein m2 is 0 in the phosphorescent compound represented by Formula (A).

4. The organic electroluminescent element of claim 1, wherein a nitrogen containing heterocyclic ring formed by $B_1$ to $B_5$ is an imidazole ring in the phosphorescent compound represented by Formula (A).

5. The organic electroluminescent element of claim 1, wherein Formula (A) is further represented by Formula (B), Formula (B)

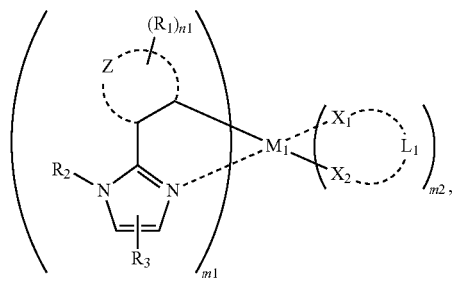

wherein $R_1$, $R_2$ and $R_3$ each represent a substituent; Z represents a group of non-metal elements necessary to form a five- to seven-membered ring; n1 is an integer of 0 to 5; $M_1$ is a metal of 8-10 group in the periodic series; $X_1$ and $X_2$ each are a carbon atom, a nitrogen atom or an oxygen atom; $L_1$ is a group of elements forming ligands having coordination number 2 with $X_1$ and $X_2$; m1 is an integer of 1 to 3; m2 is an integer of 0 to 2; and m1+m2 is 2 or 3.

6. The organic electroluminescent element of claim 5, wherein the substituent $R_2$ in Formula (B) is further represented by Formula (C), Formula (C)

wherein $R_4$ represents a substituent having a steric parameter (Es value) of −0.5 or less; $R_5$ represents a substituent; n5 is an integer of 0 to 4; and (*) in Formula represents a bonding position.

7. The organic electroluminescent element of claim 1, wherein a glass transition temperature of the host compound is 130° C. or more.

8. The organic electroluminescent element of claim 1, wherein a glass transition point of the host compound is 160° C. or more.

9. The organic electroluminescent element of claim 1, further comprising an electron inhibition layer.

10. The organic electroluminescent element of claim 1, emitting white light.

11. A display device comprising the organic electroluminescent element of claim 1.

12. An illuminating device comprising the organic electroluminescent element of claim 1.

* * * * *